(12) United States Patent
Sorrells et al.

(10) Patent No.: US 8,410,849 B2
(45) Date of Patent: Apr. 2, 2013

(54) SYSTEMS AND METHODS OF RF POWER TRANSMISSION, MODULATION, AND AMPLIFICATION, INCLUDING BLENDED CONTROL EMBODIMENTS

(75) Inventors: David F. Sorrells, Middleburg, FL (US); Gregory S. Rawlins, Heathrow, FL (US)

(73) Assignee: ParkerVision, Inc., Jacksonville, FL (US)

( * ) Notice: Subject to any disclaimer, the term of this patent is extended or adjusted under 35 U.S.C. 154(b) by 0 days.

(21) Appl. No.: 13/069,155

(22) Filed: Mar. 22, 2011

(65) Prior Publication Data

US 2011/0193630 A1    Aug. 11, 2011

Related U.S. Application Data

(63) Continuation of application No. 12/236,079, filed on Sep. 23, 2008, now Pat. No. 7,911,272, which is a continuation-in-part of application No. 12/142,521, filed on Jun. 19, 2008, now Pat. No. 8,013, 675.

(60) Provisional application No. 60/929,239, filed on Jun. 19, 2007, provisional application No. 60/929,584, filed on Jul. 3, 2007.

(51) Int. Cl.
*H03F 3/68*    (2006.01)
(52) U.S. Cl. .......................... 330/147; 330/136; 330/107
(58) Field of Classification Search .................. 330/147, 330/136, 107
See application file for complete search history.

(56) References Cited

U.S. PATENT DOCUMENTS

| | | | |
|---|---|---|---|
| 1,882,119 | A | 10/1932 | Chireix |
| 1,946,308 | A | 2/1934 | Chireix |
| 2,116,667 | A | 5/1938 | Chireix |
| 2,210,028 | A | 8/1940 | Doherty |
| 2,220,201 | A | 11/1940 | Bliss |
| 2,269,518 | A | 1/1942 | Chireix et al. |
| 2,282,706 | A | 5/1942 | Chireix et al. |
| 2,282,714 | A | 5/1942 | Fagot |
| 2,294,800 | A | 9/1942 | Price |
| 2,508,524 | A | 5/1950 | Lang |
| 2,529,073 | A | 11/1950 | Chireix |

(Continued)

FOREIGN PATENT DOCUMENTS

| | | |
|---|---|---|
| EP | 0 011 464 A2 | 5/1980 |
| EP | 0 471 346 A1 | 8/1990 |

(Continued)

OTHER PUBLICATIONS

"Ampliphase AM transmission system," *ABU Technical Review*, No. 33, p. 10-18 (Jul. 1974).

(Continued)

*Primary Examiner* — Patricia Nguyen
(74) *Attorney, Agent, or Firm* — Sterne, Kessler, Goldstein & Fox PLLC

(57) ABSTRACT

Embodiments of the present invention enable a blended control approach to generate a desired output waveform in an outphasing-based system. Embodiments of blended control according to the present invention combine outphasing with bias and/or amplitude control to yield an accurate, practical, and producible system with substantially comparable performance to that of a theoretical ideal outphasing system, but without the isolation and accuracy requirements of outphasing alone.

18 Claims, 26 Drawing Sheets

U.S. PATENT DOCUMENTS

| | | | |
|---|---|---|---|
| 2,555,039 A | 5/1951 | Bissonette |
| 2,591,749 A | 4/1952 | Villemagne |
| 2,670,404 A | 2/1954 | Chireix |
| 2,677,806 A | 5/1954 | Chireix |
| 2,714,634 A | 8/1955 | Hall |
| 2,734,100 A | 2/1956 | Kendall |
| 2,857,591 A | 10/1958 | Nagel |
| 2,890,280 A | 6/1959 | Feyzeau |
| 2,908,753 A | 10/1959 | Ernyei et al. |
| 2,938,945 A | 5/1960 | France |
| 2,963,933 A | 12/1960 | Bereskin |
| 2,964,622 A | 12/1960 | Fire |
| 2,968,697 A | 1/1961 | Rager, Jr. |
| 3,056,017 A | 9/1962 | Peras |
| 3,078,456 A | 2/1963 | Alpers |
| 3,121,198 A | 2/1964 | Potter |
| 3,154,782 A | 10/1964 | Kagawa et al. |
| 3,170,127 A | 2/1965 | Cramer |
| 3,176,060 A | 3/1965 | Bissonette et al. |
| 3,212,008 A | 10/1965 | Kahn |
| 3,219,862 A | 11/1965 | Kieffert |
| 3,263,019 A | 7/1966 | Hurvitz |
| 3,341,697 A | 9/1967 | Kaufman et al. |
| 3,413,570 A | 11/1968 | Bruene et al. |
| 3,418,595 A | 12/1968 | Loewenster, Jr. |
| 3,436,686 A | 4/1969 | Vackar |
| 3,437,945 A | 4/1969 | Duncan |
| 3,458,816 A | 7/1969 | O'Brien |
| 3,493,718 A | 2/1970 | Kestner et al. |
| 3,513,352 A | 5/1970 | Souillard |
| 3,525,941 A | 8/1970 | Smith |
| 3,544,697 A | 12/1970 | Munch, Jr. |
| 3,651,429 A | 3/1972 | Ruthroff |
| 3,697,692 A | 10/1972 | Hafler |
| 3,716,730 A | 2/1973 | Cerny, Jr. |
| 3,777,275 A | 12/1973 | Cox |
| 3,789,314 A | 1/1974 | Beurrier |
| 3,815,040 A | 6/1974 | Seidel |
| 3,852,530 A | 12/1974 | Shen |
| 3,852,669 A | 12/1974 | Bowman et al. |
| 3,896,395 A | 7/1975 | Cox |
| 3,906,390 A | 9/1975 | Rollett |
| 3,909,742 A | 9/1975 | Cox et al. |
| 3,927,379 A | 12/1975 | Cox et al. |
| 3,936,819 A | 2/1976 | Angelle et al. |
| 3,991,343 A | 11/1976 | Delpy |
| 4,090,147 A | 5/1978 | Seidel |
| 4,095,196 A | 6/1978 | Seidel |
| 4,104,946 A | 8/1978 | Peterson |
| 4,178,557 A | 12/1979 | Henry |
| 4,229,715 A | 10/1980 | Henry |
| 4,301,490 A | 11/1981 | Nagel et al. |
| 4,346,354 A | 8/1982 | Hanna |
| 4,378,530 A | 3/1983 | Garde |
| 4,433,312 A | 2/1984 | Kahn |
| 4,439,744 A | 3/1984 | Kumar et al. |
| 4,441,080 A | 4/1984 | Saari |
| 4,446,440 A | 5/1984 | Bell |
| 4,485,357 A | 11/1984 | Voorman |
| 4,509,017 A | 4/1985 | Andren et al. |
| 4,580,111 A | 4/1986 | Swanson |
| 4,584,541 A | 4/1986 | Nossen |
| 4,605,902 A | 8/1986 | Harrington |
| 4,628,286 A | 12/1986 | Nossen |
| 4,682,119 A | 7/1987 | Michel |
| 4,682,149 A | 7/1987 | Larson |
| 4,686,448 A | 8/1987 | Jones et al. |
| 4,687,999 A * | 8/1987 | Desperben et al. ............. 331/23 |
| 4,701,716 A | 10/1987 | Poole |
| 4,717,894 A | 1/1988 | Edwards et al. |
| 4,743,858 A | 5/1988 | Everard |
| 4,780,803 A | 10/1988 | Dede Garcia-Santamaria |
| 4,816,783 A | 3/1989 | Leitch |
| 4,817,116 A | 3/1989 | Akaiwa et al. |
| 4,873,492 A | 10/1989 | Myer |
| 4,951,303 A | 8/1990 | Larson |
| 4,974,236 A | 11/1990 | Gurcan et al. |
| 4,995,055 A | 2/1991 | Weinberger et al. |
| 5,005,419 A | 4/1991 | O'Donnell et al. |
| 5,012,200 A | 4/1991 | Meinzer |
| 5,017,888 A | 5/1991 | Meinzer |
| 5,077,539 A | 12/1991 | Howatt |
| 5,081,673 A | 1/1992 | Engelke et al. |
| 5,093,636 A | 3/1992 | Higgins, Jr. et al. |
| 5,115,203 A | 5/1992 | Krett et al. |
| 5,124,665 A | 6/1992 | McGann |
| 5,164,678 A | 11/1992 | Puri et al. |
| 5,214,670 A | 5/1993 | Ballatore |
| 5,229,735 A | 7/1993 | Quan |
| 5,239,275 A | 8/1993 | Leitch |
| 5,239,686 A | 8/1993 | Downey |
| 5,264,807 A | 11/1993 | Okubo et al. |
| 5,287,069 A | 2/1994 | Okubo et al. |
| 5,302,914 A | 4/1994 | Arntz et al. |
| 5,304,943 A | 4/1994 | Koontz |
| 5,307,069 A | 4/1994 | Evans |
| 5,345,189 A | 9/1994 | Hornak et al. |
| 5,351,288 A | 9/1994 | Engelke et al. |
| 5,365,187 A | 11/1994 | Hornak et al. |
| 5,365,190 A | 11/1994 | Yu et al. |
| 5,404,114 A | 4/1995 | Sager |
| 5,410,280 A | 4/1995 | Linguet et al. |
| 5,420,541 A | 5/1995 | Upton et al. |
| 5,426,641 A | 6/1995 | Afrashteh et al. |
| 5,432,473 A | 7/1995 | Mattila et al. |
| 5,438,591 A * | 8/1995 | Oie et al. ...................... 375/261 |
| 5,485,120 A | 1/1996 | Anvari |
| 5,490,172 A | 2/1996 | Komara |
| 5,495,500 A | 2/1996 | Jovanovich et al. |
| 5,508,657 A | 4/1996 | Behan |
| 5,515,068 A | 5/1996 | Uragami et al. |
| 5,530,722 A | 6/1996 | Dent |
| 5,541,554 A | 7/1996 | Stengel et al. |
| 5,554,865 A | 9/1996 | Larson |
| 5,559,471 A | 9/1996 | Black |
| 5,568,088 A | 10/1996 | Dent et al. |
| 5,574,967 A | 11/1996 | Dent et al. |
| 5,574,992 A | 11/1996 | Cygan et al. |
| 5,612,651 A | 3/1997 | Chethik |
| 5,621,351 A | 4/1997 | Puri et al. |
| 5,631,604 A | 5/1997 | Dent et al. |
| RE35,536 E | 6/1997 | Irissou et al. |
| 5,638,024 A | 6/1997 | Dent et al. |
| 5,694,433 A | 12/1997 | Dent |
| 5,697,074 A | 12/1997 | Makikallio et al. |
| 5,710,520 A | 1/1998 | Frey |
| 5,719,527 A | 2/1998 | Bateman et al. |
| 5,724,005 A | 3/1998 | Chen et al. |
| 5,739,723 A | 4/1998 | Sigmon et al. |
| 5,757,229 A | 5/1998 | Mitzlaff |
| 5,764,704 A | 6/1998 | Shenoi |
| 5,767,750 A | 6/1998 | Yamaji |
| 5,770,971 A | 6/1998 | McNicol |
| 5,784,689 A | 7/1998 | Kobayashi |
| 5,786,727 A | 7/1998 | Sigmon |
| 5,792,956 A | 8/1998 | Li |
| 5,805,640 A | 9/1998 | O'Dea et al. |
| 5,815,531 A | 9/1998 | Dent |
| 5,835,128 A | 11/1998 | Macdonald et al. |
| 5,854,571 A | 12/1998 | Pinckley et al. |
| 5,862,460 A | 1/1999 | Rich |
| 5,872,481 A | 2/1999 | Sevic et al. |
| 5,877,643 A | 3/1999 | Drogi |
| 5,880,633 A | 3/1999 | Leizerovich et al. |
| 5,886,573 A | 3/1999 | Kolanek |
| 5,886,575 A | 3/1999 | Long |
| 5,890,051 A | 3/1999 | Schlang et al. |
| 5,892,394 A | 4/1999 | Wu |
| 5,892,395 A | 4/1999 | Stengel et al. |
| 5,901,346 A | 5/1999 | Stengel et al. |
| 5,903,854 A | 5/1999 | Abe et al. |
| 5,933,766 A | 8/1999 | Dent |
| 5,949,283 A | 9/1999 | Proctor et al. |
| 5,952,947 A | 9/1999 | Nussbaum et al. |
| 5,956,097 A | 9/1999 | Nguyen et al. |
| 5,963,091 A | 10/1999 | Chen et al. |
| 5,973,559 A | 10/1999 | Alberty |

| | | | |
|---|---|---|---|
| 5,973,568 A | 10/1999 | Shapiro et al. | |
| 5,974,041 A | 10/1999 | Kornfeld et al. | |
| 5,990,734 A | 11/1999 | Wright et al. | |
| 5,990,738 A | 11/1999 | Wright et al. | |
| 5,999,046 A | 12/1999 | Kotzamanis | |
| 6,011,830 A | 1/2000 | Sasin et al. | |
| 6,026,286 A | 2/2000 | Long | |
| 6,028,485 A | 2/2000 | Sigmon et al. | |
| 6,043,707 A | 3/2000 | Budnik | |
| 6,054,894 A | 4/2000 | Wright et al. | |
| 6,054,896 A | 4/2000 | Wright et al. | |
| 6,057,798 A | 5/2000 | Burrier et al. | |
| 6,069,525 A | 5/2000 | Sevic et al. | |
| 6,085,074 A | 7/2000 | Cygan | |
| 6,097,252 A | 8/2000 | Sigmon et al. | |
| 6,111,461 A | 8/2000 | Matsuno | |
| 6,111,462 A | 8/2000 | Mucenieks et al. | |
| 6,125,266 A | 9/2000 | Matero et al. | |
| 6,130,910 A | 10/2000 | Anderson et al. | |
| 6,130,916 A | 10/2000 | Thomson | |
| 6,133,788 A | 10/2000 | Dent | |
| 6,133,789 A | 10/2000 | Braithwaite | |
| 6,137,355 A | 10/2000 | Sevic et al. | |
| 6,147,553 A | 11/2000 | Kolanek | |
| 6,154,093 A | 11/2000 | Chen et al. | |
| 6,157,253 A | 12/2000 | Sigmon et al. | |
| 6,169,455 B1 | 1/2001 | Yamaguchi | |
| 6,175,747 B1 | 1/2001 | Tanishima et al. | |
| 6,181,199 B1 | 1/2001 | Camp, Jr. et al. | |
| 6,188,277 B1 | 2/2001 | Borodulin et al. | |
| 6,198,416 B1 | 3/2001 | Velazquez | |
| 6,201,452 B1 | 3/2001 | Dent et al. | |
| 6,204,735 B1 | 3/2001 | Cairns | |
| 6,215,354 B1 | 4/2001 | Kolanek et al. | |
| 6,232,838 B1 | 5/2001 | Sugimoto | |
| 6,236,688 B1 | 5/2001 | Ohta et al. | |
| 6,242,975 B1 | 6/2001 | Eidson et al. | |
| 6,246,286 B1 | 6/2001 | Persson | |
| 6,246,599 B1 | 6/2001 | Jang et al. | |
| 6,252,461 B1 | 6/2001 | Raab | |
| 6,256,482 B1 | 7/2001 | Raab | |
| 6,259,320 B1 | 7/2001 | Valk et al. | |
| 6,285,251 B1 * | 9/2001 | Dent et al. | 330/127 |
| 6,292,054 B1 | 9/2001 | Ma et al. | |
| 6,300,828 B1 | 10/2001 | McInnis | |
| 6,304,545 B1 | 10/2001 | Armbruster et al. | |
| 6,307,894 B2 | 10/2001 | Eidson et al. | |
| 6,311,046 B1 | 10/2001 | Dent | |
| 6,313,703 B1 | 11/2001 | Wright et al. | |
| 6,337,599 B2 | 1/2002 | Lee | |
| 6,342,812 B1 | 1/2002 | Abdollahian et al. | |
| 6,349,216 B1 | 2/2002 | Alberth, Jr. et al. | |
| 6,359,506 B1 | 3/2002 | Camp, Jr. et al. | |
| 6,359,508 B1 | 3/2002 | Mucenieks | |
| 6,359,513 B1 | 3/2002 | Kuo et al. | |
| 6,366,177 B1 | 4/2002 | McCune et al. | |
| 6,369,651 B2 | 4/2002 | Dent | |
| 6,373,901 B1 | 4/2002 | O'Dea et al. | |
| 6,373,902 B1 | 4/2002 | Park et al. | |
| 6,374,092 B1 | 4/2002 | Leizerovich et al. | |
| 6,380,802 B1 | 4/2002 | Pehlke et al. | |
| 6,384,680 B1 | 5/2002 | Takei et al. | |
| 6,384,681 B1 | 5/2002 | Bonds | |
| 6,385,439 B1 | 5/2002 | Hellberg | |
| 6,388,513 B1 | 5/2002 | Wright et al. | |
| 6,392,483 B2 | 5/2002 | Suzuki et al. | |
| 6,396,341 B1 | 5/2002 | Pehlke | |
| 6,396,347 B1 | 5/2002 | Lie et al. | |
| 6,404,823 B1 | 6/2002 | Grange et al. | |
| 6,407,635 B2 | 6/2002 | Mucenieks et al. | |
| 6,411,655 B1 | 6/2002 | Holden et al. | |
| 6,421,389 B1 | 7/2002 | Jett et al. | |
| 6,424,216 B2 | 7/2002 | Mu et al. | |
| 6,434,122 B2 | 8/2002 | Barabash et al. | |
| 6,437,644 B1 | 8/2002 | Kenington | |
| 6,449,465 B1 | 9/2002 | Gailus et al. | |
| 6,452,446 B1 | 9/2002 | Eisenberg et al. | |
| 6,459,334 B2 | 10/2002 | Wright et al. | |
| 6,459,337 B1 | 10/2002 | Goren et al. | |
| 6,462,617 B1 | 10/2002 | Kim | |
| 6,469,581 B1 | 10/2002 | Kobayashi | |
| 6,470,431 B2 | 10/2002 | Nicosia et al. | |
| 6,472,934 B1 | 10/2002 | Pehlke | |
| 6,472,937 B1 | 10/2002 | Gerard et al. | |
| 6,476,670 B1 | 11/2002 | Wright et al. | |
| 6,496,062 B1 | 12/2002 | Nitz et al. | |
| 6,501,331 B2 | 12/2002 | Adar | |
| 6,504,428 B2 | 1/2003 | Cova et al. | |
| 6,504,447 B1 | 1/2003 | Laney et al. | |
| 6,507,731 B1 | 1/2003 | Hasegawa | |
| 6,510,309 B1 | 1/2003 | Thompson et al. | |
| 6,510,310 B1 | 1/2003 | Muralidharan | |
| 6,522,194 B1 | 2/2003 | Pehlke | |
| 6,522,198 B2 | 2/2003 | Ahn | |
| 6,522,201 B1 | 2/2003 | Hsiao et al. | |
| 6,525,605 B2 | 2/2003 | Hu et al. | |
| 6,529,773 B1 | 3/2003 | Dewan | |
| 6,531,935 B1 | 3/2003 | Russat et al. | |
| 6,535,060 B2 | 3/2003 | Goren et al. | |
| 6,538,509 B2 | 3/2003 | Ren | |
| 6,538,793 B2 | 3/2003 | Rosenberg et al. | |
| 6,545,535 B2 | 4/2003 | Andre | |
| 6,552,634 B1 | 4/2003 | Raab | |
| 6,566,944 B1 | 5/2003 | Pehlke et al. | |
| 6,577,199 B2 | 6/2003 | Dent | |
| 6,577,691 B2 | 6/2003 | Richards et al. | |
| 6,583,679 B1 | 6/2003 | Cox et al. | |
| 6,583,739 B1 | 6/2003 | Kenington | |
| 6,586,995 B1 | 7/2003 | Tachibana | |
| 6,587,010 B2 | 7/2003 | Wagh et al. | |
| 6,587,511 B2 * | 7/2003 | Barak et al. | 375/295 |
| 6,587,514 B1 | 7/2003 | Wright et al. | |
| 6,587,913 B2 | 7/2003 | Campanale et al. | |
| 6,593,806 B1 | 7/2003 | Melanson | |
| 6,600,368 B2 | 7/2003 | Kim | |
| 6,603,352 B2 | 8/2003 | Wight | |
| 6,606,483 B1 | 8/2003 | Baker et al. | |
| 6,614,854 B1 | 9/2003 | Chow et al. | |
| 6,622,198 B2 | 9/2003 | Jones, Jr. | |
| 6,624,694 B2 | 9/2003 | Ma et al. | |
| 6,633,200 B2 | 10/2003 | Kolanek | |
| 6,636,112 B1 | 10/2003 | McCune | |
| 6,637,030 B1 | 10/2003 | Klein | |
| 6,646,505 B2 | 11/2003 | Anderson | |
| 6,647,073 B2 | 11/2003 | Tapio | |
| 6,653,896 B2 | 11/2003 | Sevic et al. | |
| 6,672,167 B2 | 1/2004 | Buell et al. | |
| 6,674,326 B1 | 1/2004 | Hiramoto et al. | |
| 6,678,041 B2 | 1/2004 | Kimura et al. | |
| 6,681,101 B1 | 1/2004 | Eidson et al. | |
| 6,683,918 B2 | 1/2004 | Jackson et al. | |
| 6,690,232 B2 | 2/2004 | Ueno et al. | |
| 6,690,233 B2 | 2/2004 | Sander | |
| 6,697,436 B1 | 2/2004 | Wright et al. | |
| 6,697,603 B1 | 2/2004 | Lovinggood et al. | |
| 6,700,440 B2 | 3/2004 | Hareyama | |
| 6,700,441 B1 | 3/2004 | Zhang et al. | |
| 6,700,453 B2 | 3/2004 | Heiskala et al. | |
| 6,701,419 B2 | 3/2004 | Tomaiuolo et al. | |
| 6,707,338 B2 | 3/2004 | Kenington et al. | |
| 6,714,776 B1 | 3/2004 | Birleson | |
| 6,724,252 B2 | 4/2004 | Ngo et al. | |
| 6,735,424 B1 | 5/2004 | Larson et al. | |
| 6,737,914 B2 | 5/2004 | Gu | |
| 6,737,916 B2 | 5/2004 | Luu | |
| 6,741,840 B2 | 5/2004 | Nagode et al. | |
| 6,741,867 B1 * | 5/2004 | Tetsuya | 455/522 |
| 6,750,707 B2 | 6/2004 | Takei et al. | |
| 6,751,265 B1 | 6/2004 | Schell et al. | |
| 6,765,519 B2 | 7/2004 | Karlquist | |
| 6,781,534 B2 | 8/2004 | Karlquist | |
| 6,784,732 B2 | 8/2004 | Hajimiri et al. | |
| 6,784,837 B2 | 8/2004 | Revankar et al. | |
| 6,785,342 B1 | 8/2004 | Isaksen et al. | |
| 6,791,408 B2 | 9/2004 | Goren et al. | |
| 6,791,410 B2 | 9/2004 | Kim et al. | |
| 6,794,934 B2 | 9/2004 | Betti-Berutto et al. | |
| 6,794,938 B2 | 9/2004 | Weldon | |

| | | |
|---|---|---|
| 6,798,843 B1 | 9/2004 | Wright et al. |
| 6,801,086 B1 | 10/2004 | Chandrasekaran |
| 6,801,567 B1 | 10/2004 | Schmidl et al. |
| 6,806,767 B2 | 10/2004 | Dow |
| 6,806,789 B2 | 10/2004 | Bawell et al. |
| 6,819,171 B2 | 11/2004 | Kenington |
| 6,819,176 B1 | 11/2004 | Lee |
| 6,819,720 B1 | 11/2004 | Willetts |
| 6,825,719 B1 | 11/2004 | Barak et al. |
| 6,829,471 B2 | 12/2004 | White et al. |
| 6,831,491 B2 | 12/2004 | Karlquist |
| 6,834,183 B2 | 12/2004 | Black et al. |
| 6,836,183 B2 | 12/2004 | Wight |
| 6,838,942 B1 | 1/2005 | Somerville et al. |
| 6,842,070 B2 | 1/2005 | Nilsson |
| 6,847,266 B2 | 1/2005 | Laney et al. |
| 6,853,244 B2 | 2/2005 | Robinson et al. |
| 6,853,247 B2 | 2/2005 | Weldon |
| 6,853,248 B2 | 2/2005 | Weldon |
| 6,859,098 B2 | 2/2005 | Husseini |
| 6,864,742 B2 | 3/2005 | Kobayashi |
| 6,867,647 B2 | 3/2005 | Wouters |
| 6,873,211 B1 | 3/2005 | Thompson et al. |
| 6,879,209 B2 | 4/2005 | Grundlingh |
| 6,882,217 B1 | 4/2005 | Mueller |
| 6,882,711 B1 | 4/2005 | Nicol |
| 6,882,829 B2 | 4/2005 | Mostov et al. |
| 6,889,034 B1 | 5/2005 | Dent |
| 6,891,432 B2 | 5/2005 | Nagle et al. |
| 6,900,694 B2 | 5/2005 | Suzuki et al. |
| 6,906,585 B2 | 6/2005 | Weldon |
| 6,914,487 B1 | 7/2005 | Doyle et al. |
| 6,917,244 B2 | 7/2005 | Rosnell et al. |
| 6,917,389 B2 | 7/2005 | Lee |
| 6,924,699 B2 | 8/2005 | Ahmed |
| 6,928,272 B2 | 8/2005 | Doi |
| 6,930,547 B2 | 8/2005 | Chandrasekaran et al. |
| 6,937,096 B2 | 8/2005 | Wight et al. |
| 6,937,102 B2 | 8/2005 | Lopez et al. |
| 6,940,349 B2 | 9/2005 | Hellberg |
| 6,943,624 B2 | 9/2005 | Ohnishi et al. |
| 6,947,713 B2 | 9/2005 | Checoury et al. |
| 6,960,956 B2 | 11/2005 | Pehlke et al. |
| 6,970,040 B1 | 11/2005 | Dening |
| 6,975,177 B2 | 12/2005 | Varis et al. |
| 6,980,780 B2 | 12/2005 | Chen et al. |
| 6,987,954 B2 | 1/2006 | Nielsen |
| 6,990,323 B2 | 1/2006 | Prikhodko et al. |
| 6,993,301 B1 | 1/2006 | Kenington et al. |
| 7,010,276 B2 | 3/2006 | Sander et al. |
| 7,015,752 B2 | 3/2006 | Saed |
| 7,023,272 B2 | 4/2006 | Hung et al. |
| 7,026,871 B2 | 4/2006 | Saèd |
| 7,030,714 B2 | 4/2006 | Korol |
| 7,031,382 B2 * | 4/2006 | Hessel et al. .................. 375/229 |
| 7,034,613 B2 | 4/2006 | Saèd |
| 7,035,607 B2 | 4/2006 | Lim et al. |
| 7,042,283 B2 | 5/2006 | Suzuki et al. |
| 7,042,286 B2 | 5/2006 | Meade et al. |
| 7,043,208 B2 | 5/2006 | Nigra |
| 7,043,213 B2 | 5/2006 | Robinson et al. |
| 7,054,296 B1 | 5/2006 | Sorrells et al. |
| 7,054,597 B2 | 5/2006 | Rosnell |
| 7,057,461 B1 | 6/2006 | Canilao et al. |
| 7,064,607 B2 | 6/2006 | Maclean et al. |
| 7,068,099 B2 | 6/2006 | Versteegen |
| 7,068,101 B2 | 6/2006 | Saèd et al. |
| 7,068,103 B2 | 6/2006 | Lind |
| 7,071,774 B2 | 7/2006 | Hellberg |
| 7,071,777 B2 | 7/2006 | McBeath et al. |
| 7,078,976 B2 | 7/2006 | Blednov |
| 7,081,795 B2 | 7/2006 | Matsuura et al. |
| 7,084,702 B1 | 8/2006 | Ichitsubo et al. |
| 7,088,970 B2 | 8/2006 | Williams |
| 7,091,775 B2 | 8/2006 | Ichitsubo et al. |
| 7,091,777 B2 | 8/2006 | Lynch |
| 7,092,675 B2 | 8/2006 | Lim et al. |
| 7,092,676 B2 | 8/2006 | Abdelgany et al. |
| 7,099,382 B2 | 8/2006 | Aronson et al. |
| 7,103,328 B2 | 9/2006 | Zelley |
| 7,139,535 B2 | 11/2006 | Zschunke |
| 7,145,397 B2 | 12/2006 | Yamamoto et al. |
| 7,177,418 B2 | 2/2007 | Maclean et al. |
| 7,184,723 B2 | 2/2007 | Sorrells et al. |
| 7,193,459 B1 | 3/2007 | Epperson et al. |
| 7,197,284 B2 | 3/2007 | Brandt et al. |
| 7,200,369 B2 | 4/2007 | Kim et al. |
| 7,242,245 B2 | 7/2007 | Burns et al. |
| 7,260,368 B1 | 8/2007 | Blumer |
| 7,260,369 B2 | 8/2007 | Feher |
| 7,292,189 B2 | 11/2007 | Orr et al. |
| 7,327,803 B2 | 2/2008 | Sorrells et al. |
| 7,345,534 B2 | 3/2008 | Grebennikov |
| 7,349,673 B2 | 3/2008 | Moloudi et al. |
| 7,355,470 B2 | 4/2008 | Sorrells et al. |
| 7,378,902 B2 | 5/2008 | Sorrells et al. |
| 7,403,579 B2 | 7/2008 | Jaffe et al. |
| 7,414,469 B2 | 8/2008 | Sorrells et al. |
| 7,421,036 B2 | 9/2008 | Sorrells et al. |
| 7,423,477 B2 | 9/2008 | Sorrells et al. |
| 7,428,230 B2 | 9/2008 | Park |
| 7,440,733 B2 * | 10/2008 | Maslennikov et al. .... 455/114.3 |
| 7,459,893 B2 * | 12/2008 | Jacobs .......................... 323/282 |
| 7,460,612 B2 | 12/2008 | Eliezer et al. |
| 7,466,760 B2 | 12/2008 | Sorrells et al. |
| 7,474,695 B2 | 1/2009 | Liu et al. |
| 7,486,894 B2 | 2/2009 | Aronson et al. |
| 7,502,599 B2 | 3/2009 | Ben-Ayun et al. |
| 7,509,102 B2 | 3/2009 | Rofougaran et al. |
| 7,526,261 B2 | 4/2009 | Sorrells et al. |
| 7,620,129 B2 | 11/2009 | Sorrells et al. |
| 7,639,072 B2 | 12/2009 | Sorrells et al. |
| 7,647,030 B2 | 1/2010 | Sorrells et al. |
| 7,672,648 B1 * | 3/2010 | Groe et al. ................. 455/127.2 |
| 7,672,650 B2 | 3/2010 | Sorrells et al. |
| 7,738,853 B2 | 6/2010 | Eddy et al. |
| 7,750,733 B2 | 7/2010 | Sorrells et al. |
| RE41,582 E * | 8/2010 | Larson et al. ............... 455/250.1 |
| 7,835,709 B2 | 11/2010 | Sorrells et al. |
| 7,844,235 B2 | 11/2010 | Sorrells et al. |
| 7,885,682 B2 | 2/2011 | Sorrells et al. |
| 7,911,272 B2 | 3/2011 | Sorrells et al. |
| 7,929,989 B2 | 4/2011 | Sorrells et al. |
| 7,932,776 B2 | 4/2011 | Sorrells et al. |
| 7,937,106 B2 | 5/2011 | Sorrells et al. |
| 7,945,224 B2 | 5/2011 | Sorrells et al. |
| 7,949,365 B2 | 5/2011 | Sorrells et al. |
| 7,978,390 B2 * | 7/2011 | Kikuchi ........................ 359/238 |
| 8,013,675 B2 | 9/2011 | Sorrells et al. |
| 8,026,764 B2 | 9/2011 | Sorrells et al. |
| 8,031,804 B2 | 10/2011 | Sorrells et al. |
| 8,036,306 B2 | 10/2011 | Sorrells et al. |
| 8,050,353 B2 | 11/2011 | Sorrells et al. |
| 8,059,749 B2 | 11/2011 | Sorrells et al. |
| 8,233,858 B2 | 7/2012 | Sorrells et al. |
| 8,280,321 B2 | 10/2012 | Sorrells et al. |
| 8,315,336 B2 | 11/2012 | Sorrells et al. |
| 2001/0001008 A1 | 5/2001 | Dent |
| 2001/0004373 A1 | 6/2001 | Hirata |
| 2001/0006354 A1 | 7/2001 | Lee |
| 2001/0006359 A1 | 7/2001 | Suzuki et al. |
| 2001/0030581 A1 | 10/2001 | Dent |
| 2001/0052816 A1 | 12/2001 | Ahn |
| 2002/0008577 A1 | 1/2002 | Cova et al. |
| 2002/0027958 A1 | 3/2002 | Kolanek |
| 2002/0042253 A1 | 4/2002 | Dartois |
| 2002/0047745 A1 | 4/2002 | Kolanek |
| 2002/0053973 A1 | 5/2002 | Ward, Jr. |
| 2002/0058486 A1 | 5/2002 | Persson |
| 2002/0071497 A1 | 6/2002 | Bengtsson et al. |
| 2002/0079962 A1 | 6/2002 | Sander |
| 2002/0084845 A1 | 7/2002 | Eisenberg et al. |
| 2002/0094034 A1 | 7/2002 | Moriyama |
| 2002/0101907 A1 | 8/2002 | Dent et al. |
| 2002/0105378 A1 | 8/2002 | Tapio |
| 2002/0105384 A1 | 8/2002 | Dent |
| 2002/0125947 A1 | 9/2002 | Ren |
| 2002/0126769 A1 | 9/2002 | Jett et al. |

| | | | | | |
|---|---|---|---|---|---|
| 2002/0127986 A1 | 9/2002 | White et al. | 2004/0246060 A1 | 12/2004 | Varis et al. |
| 2002/0130716 A1 | 9/2002 | Larson et al. | 2004/0251962 A1 | 12/2004 | Rosnell et al. |
| 2002/0130727 A1 | 9/2002 | Nagasaka | 2004/0263242 A1 | 12/2004 | Hellberg |
| 2002/0130729 A1 | 9/2002 | Larson et al. | 2004/0263245 A1 | 12/2004 | Winter et al. |
| 2002/0136275 A1 | 9/2002 | Wight | 2004/0263246 A1 | 12/2004 | Robinson et al. |
| 2002/0136325 A1 | 9/2002 | Pehlke et al. | 2004/0266059 A1 | 12/2004 | Wight et al. |
| 2002/0146996 A1 | 10/2002 | Bachman, II et al. | 2004/0266365 A1 | 12/2004 | Hasson et al. |
| 2002/0153950 A1 | 10/2002 | Kusunoki et al. | 2004/0266368 A1 | 12/2004 | Rosnell |
| 2002/0159532 A1 | 10/2002 | Wight | 2004/0266374 A1 | 12/2004 | Saed et al. |
| 2002/0164965 A1 | 11/2002 | Chominski et al. | 2005/0001674 A1 | 1/2005 | Saed et al. |
| 2002/0168025 A1 | 11/2002 | Schwent et al. | 2005/0001675 A1 | 1/2005 | Saed |
| 2002/0171478 A1 | 11/2002 | Wouters | 2005/0001676 A1 | 1/2005 | Saed |
| 2002/0171485 A1 | 11/2002 | Cova | 2005/0001677 A1 | 1/2005 | Saed |
| 2002/0180547 A1 | 12/2002 | Staszewski et al. | 2005/0001678 A1 | 1/2005 | Saed |
| 2002/0183021 A1 | 12/2002 | Brandt | 2005/0001679 A1 | 1/2005 | Saed |
| 2002/0186079 A1 | 12/2002 | Kobayashi | 2005/0002470 A1 | 1/2005 | Saed et al. |
| 2002/0191638 A1 | 12/2002 | Wang et al. | 2005/0003770 A1 | 1/2005 | Saed |
| 2002/0196864 A1 | 12/2002 | Booth et al. | 2005/0007194 A1 | 1/2005 | Grundlingh |
| 2003/0006845 A1 | 1/2003 | Lopez et al. | 2005/0012547 A1 | 1/2005 | Kwon et al. |
| 2003/0031268 A1 | 2/2003 | Wight | 2005/0018787 A1 | 1/2005 | Saed |
| 2003/0041667 A1 | 3/2003 | White | 2005/0024262 A1 | 2/2005 | Cantrell et al. |
| 2003/0083026 A1 | 5/2003 | Liu | 2005/0025181 A1 | 2/2005 | Nazari |
| 2003/0087625 A1 | 5/2003 | Conti | 2005/0047038 A1 | 3/2005 | Nakajima et al. |
| 2003/0098753 A1 | 5/2003 | Wagh et al. | 2005/0058059 A1 | 3/2005 | Amer |
| 2003/0102910 A1 | 6/2003 | Sevic et al. | 2005/0058193 A1 | 3/2005 | Saed |
| 2003/0102914 A1 | 6/2003 | Kenington et al. | 2005/0058209 A1 | 3/2005 | Magrath |
| 2003/0107435 A1 | 6/2003 | Gu | 2005/0058227 A1 | 3/2005 | Birkett et al. |
| 2003/0114124 A1 | 6/2003 | Higuchi | 2005/0058228 A1 | 3/2005 | Birkett |
| 2003/0118121 A1 | 6/2003 | Makinen | 2005/0073360 A1 | 4/2005 | Johnson et al. |
| 2003/0119526 A1 | 6/2003 | Edge | 2005/0073374 A1 | 4/2005 | Korol |
| 2003/0123566 A1 | 7/2003 | Hasson | 2005/0088226 A1 | 4/2005 | Robinson et al. |
| 2003/0125065 A1 | 7/2003 | Barak et al. | 2005/0110590 A1 | 5/2005 | Korol |
| 2003/0132800 A1 | 7/2003 | Kenington | 2005/0111574 A1 | 5/2005 | Muller et al. |
| 2003/0179041 A1 | 9/2003 | Weldon | 2005/0118973 A1 | 6/2005 | Khlat |
| 2003/0190895 A1 | 10/2003 | Mostov et al. | 2005/0129140 A1 | 6/2005 | Robinson |
| 2003/0201835 A1 | 10/2003 | Dening et al. | 2005/0129141 A1 | 6/2005 | Lee |
| 2003/0210096 A1 | 11/2003 | Pengelly et al. | 2005/0136864 A1 | 6/2005 | Zipper |
| 2003/0210746 A1 | 11/2003 | Asbeck et al. | 2005/0181746 A1 | 8/2005 | Wight |
| 2003/0219067 A1 | 11/2003 | Birkett et al. | 2005/0191976 A1 | 9/2005 | Shakeshaft et al. |
| 2003/0220086 A1 | 11/2003 | Birkett | 2005/0195031 A1 | 9/2005 | Grundlingh |
| 2003/0228856 A1 | 12/2003 | Orihashi et al. | 2005/0201483 A1 | 9/2005 | Coersmeier |
| 2003/0231057 A1 | 12/2003 | Hiramoto et al. | 2005/0215206 A1 | 9/2005 | Granstrom et al. |
| 2004/0008081 A1 | 1/2004 | Friedel et al. | 2005/0227646 A1 | 10/2005 | Yamazaki et al. |
| 2004/0021517 A1 | 2/2004 | Irvine et al. | 2005/0242879 A1 | 11/2005 | Muller |
| 2004/0025104 A1 | 2/2004 | Amer | 2005/0253745 A1 | 11/2005 | Song et al. |
| 2004/0027198 A1 | 2/2004 | Chandrasekaran et al. | 2005/0260956 A1 | 11/2005 | Loraine et al. |
| 2004/0037363 A1 | 2/2004 | Norsworthy et al. | 2006/0006946 A1 | 1/2006 | Burns et al. |
| 2004/0046524 A1 | 3/2004 | Zschunke | 2006/0017500 A1 | 1/2006 | Hellberg |
| 2004/0056723 A1 | 3/2004 | Gotou | 2006/0035618 A1 | 2/2006 | Pleasant |
| 2004/0062397 A1 | 4/2004 | Amer | 2006/0052124 A1 | 3/2006 | Pottenger et al. |
| 2004/0075492 A1 | 4/2004 | Wight | 2006/0055458 A1 | 3/2006 | Shiikuma et al. |
| 2004/0076238 A1 | 4/2004 | Parker et al. | 2006/0066396 A1 | 3/2006 | Brandt |
| 2004/0085134 A1 | 5/2004 | Griffith et al. | 2006/0088081 A1 | 4/2006 | Withington et al. |
| 2004/0092281 A1 | 5/2004 | Burchfiel | 2006/0160502 A1 | 7/2006 | Kintis |
| 2004/0095192 A1 | 5/2004 | Krvavac | 2006/0220625 A1 | 10/2006 | Chapuis |
| 2004/0101065 A1 | 5/2004 | Hagh et al. | 2006/0238245 A1 | 10/2006 | Carichner et al. |
| 2004/0108896 A1 | 6/2004 | Midtgaard | 2006/0264190 A1 | 11/2006 | Aleiner |
| 2004/0113698 A1 | 6/2004 | Kim et al. | 2006/0291589 A1 | 12/2006 | Eliezer et al. |
| 2004/0119514 A1 | 6/2004 | Karlquist | 2006/0292999 A1 | 12/2006 | Sorrells et al. |
| 2004/0119622 A1 | 6/2004 | Karlquist | 2006/0293000 A1 | 12/2006 | Sorrells et al. |
| 2004/0119624 A1 | 6/2004 | Karlquist | 2007/0021080 A1 | 1/2007 | Kuriyama et al. |
| 2004/0125006 A1 | 7/2004 | Tani et al. | 2007/0030063 A1 | 2/2007 | Izumi et al. |
| 2004/0135630 A1 | 7/2004 | Hellberg | 2007/0071114 A1 | 3/2007 | Sanderford et al. |
| 2004/0142667 A1 | 7/2004 | Lochhead et al. | 2007/0076814 A1 | 4/2007 | Ikeda et al. |
| 2004/0146116 A1 | 7/2004 | Kang et al. | 2007/0082630 A1 | 4/2007 | Aridas et al. |
| 2004/0166813 A1 | 8/2004 | Mann et al. | 2007/0087708 A1 | 4/2007 | Sorrells et al. |
| 2004/0169559 A1 | 9/2004 | Weldon | 2007/0087709 A1 | 4/2007 | Sorrells et al. |
| 2004/0172583 A1 | 9/2004 | Amer | 2007/0090874 A1 | 4/2007 | Sorrells et al. |
| 2004/0174213 A1 | 9/2004 | Thompson | 2007/0096806 A1 | 5/2007 | Sorrells et al. |
| 2004/0181745 A1 | 9/2004 | Amer | 2007/0111686 A1 | 5/2007 | Lee |
| 2004/0184559 A1 | 9/2004 | Ballantyne | 2007/0127563 A1 | 6/2007 | Wu et al. |
| 2004/0185805 A1 | 9/2004 | Kim et al. | 2007/0155344 A1 | 7/2007 | Wiessner et al. |
| 2004/0189380 A1 | 9/2004 | Myer et al. | 2007/0184790 A1 | 8/2007 | Gilberton et al. |
| 2004/0189381 A1 | 9/2004 | Louis | 2007/0190952 A1 | 8/2007 | Waheed et al. |
| 2004/0196899 A1 | 10/2004 | Zhou et al. | 2007/0218852 A1 | 9/2007 | Huynh |
| 2004/0198263 A1 | 10/2004 | Ode et al. | 2007/0247217 A1 | 10/2007 | Sorrells et al. |
| 2004/0222851 A1 | 11/2004 | Weldon | 2007/0247220 A1 | 10/2007 | Sorrells et al. |
| 2004/0227570 A1 | 11/2004 | Jackson et al. | 2007/0247221 A1 | 10/2007 | Sorrells et al. |
| 2004/0233599 A1 | 11/2004 | Busking | 2007/0248156 A1 | 10/2007 | Sorrells et al. |

| | | | |
|---|---|---|---|
| 2007/0248185 A1 | 10/2007 | Sorrells et al. | |
| 2007/0248186 A1 | 10/2007 | Sorrells et al. | |
| 2007/0249299 A1 | 10/2007 | Sorrells et al. | |
| 2007/0249300 A1 | 10/2007 | Sorrells et al. | |
| 2007/0249301 A1 | 10/2007 | Sorrells et al. | |
| 2007/0249302 A1 | 10/2007 | Sorrells et al. | |
| 2007/0249304 A1 | 10/2007 | Snelgrove et al. | |
| 2007/0291668 A1 | 12/2007 | Duan | |
| 2008/0072025 A1 | 3/2008 | Staszewski et al. | |
| 2008/0089252 A1 | 4/2008 | Choi | |
| 2008/0133982 A1 | 6/2008 | Rawlins et al. | |
| 2008/0225929 A1 | 9/2008 | Proctor et al. | |
| 2008/0225935 A1 | 9/2008 | Reddy | |
| 2008/0259846 A1 | 10/2008 | Gonikberg et al. | |
| 2008/0272841 A1 | 11/2008 | Sorrells et al. | |
| 2008/0299913 A1 | 12/2008 | Han et al. | |
| 2008/0311860 A1 | 12/2008 | Tanaka et al. | |
| 2009/0004981 A1 | 1/2009 | Eliezer et al. | |
| 2009/0070568 A1 | 3/2009 | Shi et al. | |
| 2009/0091384 A1 | 4/2009 | Sorrells et al. | |
| 2009/0134947 A1 | 5/2009 | Tarng | |
| 2009/0201084 A1 | 8/2009 | See et al. | |
| 2009/0227214 A1 | 9/2009 | Georgantas et al. | |
| 2009/0238249 A1 | 9/2009 | van Waasen et al. | |
| 2009/0262861 A1 | 10/2009 | Nielsen | |
| 2009/0262877 A1 | 10/2009 | Shi et al. | |

FOREIGN PATENT DOCUMENTS

| | | |
|---|---|---|
| EP | 0 630 104 A2 | 12/1994 |
| EP | 0 708 546 A2 | 4/1996 |
| EP | 0 471 346 B1 | 11/1996 |
| EP | 0 639 307 B1 | 12/1997 |
| EP | 0 821 304 A1 | 1/1998 |
| EP | 0 725 478 B1 | 8/1998 |
| EP | 0 892 529 A2 | 1/1999 |
| EP | 0 897 213 A1 | 2/1999 |
| EP | 0 598 585 B1 | 3/1999 |
| EP | 0 630 104 B1 | 8/2000 |
| EP | 0 821 304 B1 | 2/2002 |
| EP | 1 068 666 B1 | 5/2003 |
| EP | 1 381 154 A1 | 1/2004 |
| EP | 0 897 213 B1 | 3/2004 |
| EP | 1 487 100 A1 | 12/2004 |
| EP | 1 332 550 B1 | 3/2005 |
| EP | 1 142 250 B1 | 4/2005 |
| EP | 1 521 359 A1 | 4/2005 |
| EP | 1 583 228 A2 | 10/2005 |
| GB | 2159374 A | 11/1985 |
| GB | 2 267 402 | 12/1993 |
| JP | 54-022749 A | 2/1979 |
| JP | 60-63517 A | 4/1985 |
| JP | 1-284106 A | 11/1989 |
| JP | 2-87708 A | 3/1990 |
| JP | 3-232307 A | 10/1991 |
| JP | 4-095409 A | 3/1992 |
| JP | 4-104604 A | 4/1992 |
| JP | 5-22046 A | 1/1993 |
| JP | 5-037263 A | 2/1993 |
| JP | 6-338728 A | 12/1994 |
| JP | 9-018536 A | 1/1997 |
| JP | 9-074320 A | 3/1997 |
| JP | 10-70451 A | 3/1998 |
| JP | 2000-209291 A | 7/2000 |
| JP | 2000-244261 A | 9/2000 |
| JP | 2001-136057 A | 5/2001 |
| JP | 2001-217659 A | 8/2001 |
| JP | 2001-308650 A | 11/2001 |
| JP | 2002-543729 A | 12/2002 |
| JP | 2003-298357 A | 10/2003 |
| JP | 2004-260707 A | 9/2004 |
| JP | 2005-101940 A | 4/2005 |
| JP | 2005-151543 A | 6/2005 |
| RO | 102824 | 11/1991 |
| RO | 100466 | 8/1992 |
| SU | 1322183 A1 | 7/1987 |
| WO | WO 94/21035 | 9/1994 |
| WO | WO 96/10310 | 4/1996 |
| WO | WO 96/19063 | 6/1996 |
| WO | WO 97/41642 | 11/1997 |
| WO | WO 97/48219 | 12/1997 |
| WO | WO 99/23755 | 5/1999 |
| WO | WO 99/52206 | 10/1999 |
| WO | WO 00/41371 | 7/2000 |
| WO | WO 00/67370 | 11/2000 |
| WO | WO 01/03292 | 1/2001 |
| WO | WO 01/45205 | 6/2001 |
| WO | WO 01/91282 | 11/2001 |
| WO | WO 02/39577 | 5/2002 |
| WO | WO 02/082633 | 10/2002 |
| WO | WO 03/047093 | 6/2003 |
| WO | WO 03/061115 | 7/2003 |
| WO | WO 2004/023647 | 3/2004 |
| WO | WO 2004/036736 | 4/2004 |
| WO | WO 2004/057755 | 7/2004 |
| WO | WO 2005/031966 | 4/2005 |
| WO | WO 2005/036732 | 4/2005 |
| WO | WO 2005/055413 | 6/2005 |

OTHER PUBLICATIONS

"Designing an SSB Outphaser," *Electronics World*, pp. 306-310 (Apr. 1996).

"New 50 KW Ampliphase AM Transmitter," *RCA in Broadcast News*, No. 111, pp. 36-39 (Jun. 1961).

*The Ampliphase Page*: *Ampliphase—A quick description* . . . , Reproduction of text from http://rossrevenge.co.uk/tx/ampli.htm, 13 pages (visited Jan. 18, 2006).

Ajluni, C., "Chip Set Withstands WLAN's Future Blows," at http://www.wsdmag.com/Articles/Print.cfm?ArticleID=6792, 5 pages (Oct. 2003).

Ampen-Darko, S. And Al-Raweshidy, H.S., "Gain/phase imbalance cancellation technique in LINC transmitters," *Electronic Letters*, vol. 34, No. 22, pp. 2093-2094 (Oct. 29, 1988).

Ampen-Darko, S.O. and Al-Raweshidy, H.S., "A Novel Technique for Gain/Phase Cancellation in LINC Transmitters," *IEEE VTS—50th Vehicular Technology Conference*, Amsterdam, pp. 2034-2038 (Sep. 19-22, 1999).

Andreani, P., *Linear PA architectures* (Chapter 13), available at http://server.oersted.dtu.dk/personal/pa/31636/pdf/paLin.pdf, 10 pages, date unknown.

Ariyavisitakul, S. and Lie, T.P., "Characterizing the Effects of Nonlinear Amplifiers on Linear Modulation for Digital Portable Radio Communications," *IEEE Transactions on Vehicular Technology*, vol. 39, No. 4, pp. 383-389 (Nov. 1990).

*ARMMS—The RF and Microwave Society—Last Meeting*, at http://www.armms.org/last.html, 4 pages (printed Apr. 14, 2005).

Asbeck, P.M. et al., "Power Amplifier Approaches for High Efficiency and Linearity," in Itoh, T. et al. (eds.), *RF Technologies for Low Power Wireless Communications*, ISBN No. 0-471-38267-1, pp. 189-227 (2001).

Asbeck, P.M. et al., "Synergistic Design of DSP and Power Amplifiers for Wireless Communications," *IEEE Transactions on Microwave Theory and Techniques*, vol. 49, No. 11, pp. 2163-2169 (Nov. 2001).

Banelli, P., "Error Sensitivity In Adaptive Predistorrion Systems," *Global Communications Conference—Globecom '99*, pp. 883-888 (1999).

Bateman, A., et al, "The Application of Digital Signal Processing to Transmitter Linearisation," *EUROCON 88: 8th European Conference on Electrotechnics*, pp. 64-67 (Jun. 13-17, 1988).

Bespalov, V.B. and Aslamazyan, A.S., "Broadband Strip-Line SHF Ampliphasemeter," *Measurement Techniques (Translated from Russian)*, vol. 25, No. 8, pp. 712-715 (Aug. 1982).

Birafane, A. and Kouki, A., "An Analytical Approach to LINC Power Combining Efficiency Estimation and Optimization," *33rd European Microwave Conference—Munich*, pp. 1227-1229 (2003).

Birafane, A. and Kouki, A., "Distortion Free LINC Amplifier with Chireix-Outphasing Combiner Using Phase-Only Predistortion," *34th European Microwave Conference—Amsterdam*, pp. 1069-1072 (2004).

Birafane, A. and Kouki, A., "On the Linearity and Efficiency of Outphasing Microwave Amplifiers," *IEEE Transactions on Microwave Theory and Techniques*, vol. 52, No. 7, pp. 1702-1708 (Jul. 2004).

Birafane, A. and Kouki, A., "Sources of Linearity Degradation in LINC Transmitters for Hybrid and Outphasing Combiners," *Canadian Conference on Electrical and Computer Engineering—Niagara Falls*, pp. 547-550 (May 2004).

Birafane, A. and Kouki, A.B., "Phase-Only Predistortion for LINC Amplifiers With Chireix-Outphasing Combiners," *IEEE Transactions on Microwave Theory and Techniques*, vol. 53, No. 6, pp. 2240-2250 (Jun. 2005).

Breed, G., "Intermodulation Distortion Performance and Measurement Issues," *High Frequency Electronics*, p. 56(2) (May 2003).

Bruckmann, H., "Modulation Arrangements and Operating Costs of Broadcasting and Radio-Telephony Transmitters," *Telegraphen-Fernsprech-Funk-und Fernsehtechnik*, vol. 24, pp. 83-91 (Apr. 1935).

Burnill, J., "Transmitting AM," *Electronics World + Wireless World*, pp. 58-60 (Jan. 1995).

Casadevall, F. and Olmos, J.J., "On the Behavior of the LINC Transmitter," *40th IEEE Vehicular Technology Conference*, pp. 29-34 (May 6-9, 1990).

Casedevall, F.J. and Valdovinos, A., "Performance Analysis of QAM Modulations Applied to the LINC Transmitter," *IEEE Transactions on Vehicular Technology*, vol. 42, No. 4, pp. 399-406 (Nov. 1993).

Casedevall, F.J., "The LINC Transmitter", *RF Design*, pp. 41-48 (Feb. 1990).

Cha, J. et al., "Highly Efficient Power Amplifier for CDMA Base Stations Using Doherty Configuration," *IEEE MIT-S International Microwave Symposium Digest*, pp. 533-536 (2004).

Chan, K.Y. et al., "Analysis and Realisation of the LINC Transmitter using the Combined Analogue Locked Loop Universal Modulator (CALLUM),"*IEEE 44th Vehicular Technology Conference*, vol. 1, pp. 484-488 (Jun. 8-10, 1994).

Chen, J.-T. et al., "The Optimal RLS Parameter Tracking Algorithm for a Power Amplifier Feedforward Linearizer," *IEEE Transactions on Circuits and Systems—II: Analog and Digital Signal Processing*, vol. 46, No. 4, pp. 464-468 (Apr. 1999).

Chireix, H., "High Power Outphasing Modulation" *Proceedings of the Institute of Redio Engineers*, vol. 23, No. 11, pp. 1370-1392 (Nov. 1935).

Choi, L.U., *Multi-user MISO and MIMO Transmit Signal Processing for Wireless Communication*, PhD Thesis submitted to the Hong Kong University of Science and Technology, 191 pages, Mar. 2003.

Clark, G., "A Comparison of AM Techniques," *ABU Technical Review*, No. 44, p. 33-42, (May 1976).

Clark, G., "A Comparison of Current Broadcast Amplitude Modulation Techniques", *IEEE Transactions on Broadcasting*, vol. BC-21, No. 2, pp. 25-31 (Jun. 1975).

Clifton, J.C. et al., "Novel Multimode J-pHEMT Front-End Architecture With Power-Control Scheme for Maximum Efficiency," *IEEE Transactions On Microwave Theory And Techniques*, vol. 53, No. 6, pp. 2251-2258 (Jun. 2005).

Colantonio, P., "High Linearity and Efficiency Microwave PAs," *12th GAAS Symposium—Amsterdam*, pp. 183-186 (2004).

*Computational Science Research Center Colloquium—Time Reversal Bases Communications in Complex Environments*, Friday, Apr. 9, 2004, 2 pages, printed Jul. 14, 2006 from http://www.sdsunivers.info/info_content_event.asp?id=15044.

Conradi, C.P. et al., "Evaluation of a Lossless Combiner in a LINC Transmitter," *Proceedings of the 1999 IEEE Canadian Conference on Electrical Computer Engineering*, pp. 105-110 (May 9-12, 1999).

Couch, L. and Walker, J.L., "A VHF LINC Amplifier," *Proceedings of IEEE Southeastcon*, pp. 122-125 (1982).

*Course #08: Advanced RF Power Amplifier Techniques for Modern Wireless and Microwave Systems*, from http://www.cei.se/008.htm, 6 pages (printed Apr. 14, 2005).

*Course #114: Advanced RF Power Amplifier Techniques*, from http://www.bessercourse.com/outlinesOnly.asp?CTID=114, 3 pages (printed Jun. 22, 2005).

Cox, "Component Signal Separation and Recombination for Linear Amplification with Nonlinear Components," *IEEE Transactions on Communications*, vol. COM-23, No. 11, pp. 1281-1287 (Nov. 1975).

Cox, D.C. and Leck, R.P., "A VHF Implementation of a LINC Amplifier," *IEEE Transactions on Communications*, pp. 1018-1022 (Sep. 1976).

Cox, D.C., "Linear Amplification with Nonlinear Components," *IEEE Transactions on Communications*, vol. COM-22, pp. 1942-1945 (Dec. 1974).

Cripps, S.C., *Advanced Techniques in RF Power Amplifier Design*, Section 2—"Doherty and Chireix," pp. 33-72, Artech House (2002).

Cripps, Steve C., *PA Linearisation in RFICs . . . ignoring the obvious?*, available at http://www.cei.se/pa_milan.ppt, Hywave Associates, 24 pages (Created Aug. 2, 2001).

Cripps, Steve C., *RF Power Amplifiers for Wireless Communications*, Artech House, ISBN No. 0890069891, pp. 240-250 (Apr. 1999).

Deltimple, N. et al., "A Reconfigurable RF Power Amplifier Biasing Scheme", *Proceedings of the 2nd Annual IEEE Northeast Workshop on Circuits and Systems (NEWCAS2004)*, pp. 365-368, (Jun. 20-23, 2004).

Dennis, A., "A Novel Digital Transmitter Architecture for Multimode/Multiband Applications: DTX, A Technology of MACOM," Tyco Electronics, 32 pages (date unknown).

Dinis, R. et al., "Performance Trade-Offs with Quasi-Linearly Amplified OFDM Through a Two-Branch Combining Technique," *IEEE 46th Vehicular Technology Conference*, pp. 899-903 (Apr. 28-May 1, 1996).

Ellinger, F. et al., "Calibratable Adaptive Antenna Combiner at 5.2 GHz with High Yield for Laptop Interface Card," *IEEE Transactions on Microwave Theory and Techniques*, vol. 48, No. 12, pp. 2714-2720 (Dec. 2000).

Faust, H.H. et al., "A Spectrally Clean Transmitting System for Solid-State Phased-Array Radars," *Proceedings of the 2004 IEEE Radar Conference*, pp. 140-144 (Apr. 26-Apr. 29, 2004).

Fisher, S.T., "A New Method of Amplifying with High Efficiency a Carrier Wave Modulated in Amplitude by a Voice Wave," *Proceedings of the Institute of Radio Engineers*, vol. 34, pp. 3-13P (Jan. 1946).

Garcia, P. et al., "An Adaptive Digital Method of Imbalances Cancellation in LINC Transmitters," *IEEE Transactions on Vehicular Technology*, vol. 54, No. 3, pp. 879-888 (May 2005).

Gaudernack, L.F., "A Phase-Opposition System of Amplitude Modulation," *IRE Proceedings*, vol. 26, No. 8, pp. 983-1008 (Aug. 1938).

Gentzler, C.G. and Leong, S.K., "Broadband VHF/UHF Amplifier Design Using Coaxial Transformers," *High Frequency Electronics*, pp. 42, 44, 46, 48, 50, and 51 (May 2003).

Gerhard, W. and Knöchel, R., "Digital Component Separator for future W-CDMA-LINC Transmitters implemented on an FPGA," *Advances in Radio Science*, 3, pp. 239-246 (2005).

Gründlingh, J. et al., "A High Efficiency Chireix Out-phasing Power Amplifier for 5GHz WLAN Applications," *IEEE MIT-S International Microwave Symposium Digest*, vol. 3, pp. 1535-1538 (2004).

Hakala, I. et al., "A 2.14-GHz Chireix Outphasing Transmitter," *IEEE Transactions on Microwave Theory and Techniques*, vol. 53, No. 6, pp. 2129-2138 (Jun. 2005).

Hakala, I. et al., "Chireix Power Combining with Saturated Class-B Power Amplifiers," *Conference Proceedings, 34th European Microwave Conference*, pp. 379-382 (2004).

Hamedi-Hagh, S. and Salama, A.T., "CMOS Wireless Phase-Shifted Transmitter," *IEEE Journal of Solid-State Circuits*, vol. 39, No. 8, pp. 1241-1252 (Aug. 2004).

Hammond, R. and Henry, J., "High Power Vector Summation Switching Power Amplifier Development," *IEEE Power Electronics Specialists Conference (PESC)*, pp. 267-272 (Jun. 29-Jul. 3, 1981).

Heiden, D., "Principle of a phase constant and low distortion amplitude modulation system for transistor transmitters," *Nachrichtentechnische Zeitschrift*, vol. 23, No. 12, pp. 608-612 (Dec. 1970).

Hetzel, S.A. et al., "LINC Transmitter," *Electronics Letters*, vol. 27, No. 10, pp. 844-846 (May 9, 1991).

Internet Postings at "*Class E-AM Forum*":: *View topic—What exactly is class D?*, at http://classe.monkeypupper.com/viewtopic.php?t=220, 6 pages (Dec. 14-17, 2003).

Iwamoto, M. et al., "An Extended Doherty Amplifier with High Efficiency Over a Wide Power Range," *IEEE Transactions on Microwave Theory and Techniques*, vol. 49, No. 12, pp. 2472-2479 (Dec. 2001).

Jeong, Y.-C., *Linearizing Principles on High Power Amplifier*, Chonbuk National University School of Electronics & Information Engineering, 41 pages (Oct. 26, 2004).

Karn, P., *Re: [amsat-bb] AO-40 Satellite RF Architecture Question*, at http://www.uk/amsat.org/ListArchives/amsat-bb/2002/msg01409.html, 2 pages (Feb. 25, 2002).

Katz, A., *Linearization: Reducing Distortion in Power Amplifiers*, The College of New Jersey, 52 pages (Apr. 16, 2004).

Kaunisto, R., "A Vector-Locked Loop for Power Amplifier Linearization," *IEEE MTT-S International Microwave Symposium Digest*, 4 pages (Jun. 6-11, 2004).

Kelly, W.M. et al., "Vector Modulator, Output Amplifier, and Multiplier Chain Assemblies for a Vector Signal Generator," *Hewlett-Packard Journal*, vol. 38, No. 11, pp. 48-52 (Dec. 1987).

Kenington, P.B. et al., "Broadband Linearisation of High-Efficiency Power Amplifiers," *Proceedings of the Third International Mobile Satellite Conference*, pp. 59-64 (1993).

Kim, I. et al., "The linearity and efficiency enhancement using 3-way Doherty amplifier with uneven power drive," *International Technical Conference on Circuits/Systems, Computers and Communications*, Jeju, Korea, pp. 369-370 (Jul. 2005).

Kim, J. et al., "Optimum Operation of Asymmetrical-Cells-Based Linear Doherty Power Amplifiers—Uneven Power Drive and Power Matching," *IEEE Transactions on Microwave Theory and Techniques*, vol. 53, No. 5, pp. 1802-1809 (May 2005).

Kosugi, H. et al., "A High-Efficiency Linear Power Amplifier Using an Envelope Feedback Method," *Electronics and Communications in Japan*, Part 2, vol. 77, No. 3, pp. 50-57 (1994).

Kurzrok, R., "Simple Lab-Built Test Accessories for RF, IF, Baseband and Audio," *High Frequency Electronics*, pp. 60 and 62-64 (May 2003).

Langridge, R. et al., "A Power Re-Use Technique for Improved Efficiency of Outphasing Microwave Power Amplifiers," *IEEE Transactions on Microwave Theory and Techniques*, vol. 47, No. 8, pp. 1467-1470 (Aug. 1999).

Li, C. et al., "Optimal IDM-MISO Transmit Strategy with Partial CSI at Transmitter," 6 pages, downloaded Jun. 2006 from http://www288.pair.com/ciss/ciss/numbered/36.pdf.

Love, D.J. et al., "Grassmannian Beamforming for Multiple-Input Multiple-Output Wireless Systems," pp. 1-29, downloaded Jun. 2006 from http://www.math.ucdavis.edu/~strohmer/papers/2003/grassbeam.ps.ez, Jun. 3, 2003.

Lyles, J.T.M., *[Amps] Amplifuzz [TSPA]*, at http://lists.contesting.com/pipermail/amps/2005-January/042303.html, 2 pages (Jan. 28, 2005).

*Manuals and Schematics*, at http://www.lks.net/~radio/Pages/manuals.htm, 8 pages (last update Aug. 23, 2005).

Masse, D., "Advanced Techniques in RF Power Amplifier Design," *Microwave Journal (International Edition)*, vol. 45, Issue 9, p. 216 (Sep. 2002).

Masse, D., "Design of Linear RF Outphasing Power Amplifiers," *Microwave Journal (International Edition)*, vol. 47, Issue 7, p. 152 (Jul. 2004).

McCune, E., "High-Efficiency, Multi-Mode Multi-Band Terminal Power Amplifiers," *IEEE Microwave Magazine*, vol. 6, No. 1, pp. 44-55 (Mar. 2005).

McPherson, D.S. et al., "A 28 GHz HBT Vector Modulator and Its Application to an LMCS Feedforward Power Amplifier," *28th European Microwave Conference—Amsterdam*, vol. 1, pp. 523-528 (1998).

*Mead Education: Information Registration: RF Transceivers and Power Amplifiers*, at http://www.mead.ch/htm/ch/bios_texte/RF-PA_05_text.html, 3 pages (printed Sep. 1, 2005).

Morais, D.H. and Feher, K., "NLA-QAM: A Method for Generating High-Power QAM Signals Through Nonlinear Amplification," *IEEE Transactions on Communications*, vol. COM-30, No. 3, pp. 517-522 (Mar. 1982).

Moustakas, A.L. and Simon, S.H., "Optimizing multiple-input single-output (MISO) communication system with general Gaussian channels; nontrivial covariance and nonzero mean," *IEEE Trans. on Information Theory*, vol. 49, Issue 10, pp. 2770-2780, Oct. 2003.

Musson, D.R., "Ampliphase . . . for Economical Super-Power AM Transmitters", *Broadcast News*, vol. No. 119, pp. 24-29 (Feb. 1964).

Norris, G.B. et al., "A Fully Monolithic 4-18 GHZ Digital Vector Modulator," *IEEE MTT-S International Microwave Symposium Diges*, pp. 789-792 (1990).

Olson, S.A. and Stengel, R.E., "LINC Imbalance Correction using Baseband Preconditioning," *Proceedings IEEE Radio Wireless Conference*, pp. 179-182 (Aug. 1-4, 1999).

Pereyra, L. A., "Modulation techniques for radiodiffusion transmitters," *Revista Telegrafica Electronica*, vol. 67, No. 801, pp. 1132-1138 and 1148 (Oct. 1979).

Pigeon, M., "A CBC Engineering Report: Montreal Antenna Replacement Project," *Broadcast Technology*, vol. 15, No. 4, pp. 25-27 (Jan. 1990).

Poitau, G. et al., "Experimental Characterization of LINC Outphasing Combiners' Efficiency and Linearity," *Proceedings IEEE Radio and Wireless Conference*, pp. 87-90 (2004).

Price, T.H., "The Circuit Development of the Ampliphase Broadcasting Transmitter," *The Proceedings of the Institution of Electrical Engineers*, vol. 101, pp. 391-399 (1954).

Qiu, R.C. et al., "Time Reversal with MISO for Ultra-Wideband Communications: Experimental Results (*invited paper*)," 4 pages, downloaded Jun. 2006 from http://iweb.tntech.edu/rgiu/paper/conference/RWS06Qiu_TH2B1.pdf.

Raab, F.H. et al., "Power Amplifiers and Transmitters for RF and Microwave," *IEEE Transactions on Microwave Theory and Techniques*, vol. 50, No. 3, pp. 814-826 (Mar. 2002).

Raab, F.H. et al., "RF and Microwave Power Amplifier and Transmitter Technologies—Part 1," *High Frequency Electronics*, pp. 22, 24, 26, 28, 29, 30, 32, 34, and 36 (May 2003).

Raab, F.H. et al., "RF and Microwave Power Amplifier and Transmitter Technologies—Part 3," *High Frequency Electronics*, pp. 34, 36, 38, 40, 42-44, 46, and 48 (2003).

Raab, F.H. et al., "RF and Microwave Power Amplifier and Transmitter Technologies—Part 5," , *High Frequency Electronics*, pp. 46, 48-50, 52, and 54 (2004).

Raab, F.H., "Efficiency of Doherty RF-Power Amplifier Systems," *IEEE Transactions on Broadcasting*, vol. BC-33, No. 3, pp. 77-83 (Sep. 1987).

Rabb, F.H., "Efficiency of Outphasing RF Power-Amplifier Systems," *IEEE Transactions on Communications*, vol. COM-33, No. 10, pp. 1094-1099 (Oct. 1985).

Rabjohn, G. and Wight, J., "Improving Efficiency, Output Power with 802.11a Out-Phasing PAs," at http://www.us.design-reuse.com/articles/article6937.html, 8 pages (Jan. 9, 2004).

Rustako, A.J. and Yeh, Y.S., "A Wide-Band Phase-Feedback Inverse-Sine Phase Modulator with Application Toward a LINC Amplifier," *IEEE Transactions on Communications*, vol. COM-24, No. 10, pp. 1139-1143 (Oct. 1976).

Saleh, A.A.M. and Cox, D.C., "Improving the Power-Added Efficiency if FET Amplifiers Operating with Varying-Envelope Signals," *IEEE Transactions on Microwave Theory and Techniques*, vol. 31, No. 1, pp. 51-56 (Jan. 1983).

Saraga, W., "A new version of the out-phasing (quadrature-modulation) method for frequency translation (SSB generation and detection)," *Transmission Aspects of Communications Networks*, pp. 131-134 (1964).

Shi, B. and Sundström, L., "A 200-MHz IF BiCMOS Signal Component Separator for Linear LINC Transmitters," *IEEE Journal of Solid-State Circuits*, vol. 35, No. 7, pp. 987-993 (Jul. 2000).

Shi, B. and Sundström, L., "A Voltage-Translinear Based CMOS Signal Component Separator Chip for Linear LINC Transmitters," *Analog Integrated Circuits and Signal Processing*, 30, pp. 31-39 (2002).

Shi, B. and Sundström, L., "Investigation of a Highly Efficient LINC Amplifier Topology," *Proceedings IEEE 45th Vehicular Technology Conference*, vol. 2, pp. 1215-1219 (Oct. 7-11, 2001).

Shin, B. et al., "Linear Power Amplifier based on 3-Way Doherty Amplifier with Predistorter," *IEEE MTT-S International Microwave Symposium Digest*, pp. 2027-2030 (2004).

Simon, M. and Weigel, R., "A Low Noise Vector Modulator with integrated Basebandfilter in 120 nm CMOS Technology," *2003 IEEE Radio Frequency Integrated Circuits Symposium*, pp. 409-412 (2003).

Skarbek, I. "New High-Efficiency 5-KW AM Transmitter 'Unique Class C Amplifier Operates with 90% Efficiency'," *RCE Broadcast News # 107*, pp. 8-13 (Mar. 1960).

Sokal, N. O., "RF Power Amplifiers, Classes A though S—How they Operate, and When to Use Each," *Electronics Industries Forum of New England, Professional Program Proceedings*, Boston, MA, pp. 179-252 (1997).

Staudinger, J. et al., "High Efficiency CDMA RF Power Amplifier Using Dynamic Envelope Tracking Technique," *IEEE MIT-S International Microwave Symposium Digest*, vol. 2, pp. 873-876 (Jun. 11-16, 2000).

Stengel, B. and Eisenstadtm W.R., "LINC Power Amplifier Combiner Method Efficiency Optimization," *IEEE Transactions on Vehicular Technology*, vol. 49, No. 1, pp. 229-234 (Jan. 2000).

Sundström, L. "Spectral Sensitivity of LINC Transmitters to Quadrature Modulator Misalignments," *IEEE Transactions on Vehicular Technology*, vol. 49, No. 4, pp. 1474-1487 (Jul. 2000).

Sundström, L., "Automatic adjustment of gain and phase imbalances in LINC transmitters," *Electronics Letters*, vol. 31, No. 3, pp. 155-156 (Feb. 2, 1995).

Sundström, L., "Effects of modulation scheme on LINC transmitter power efficiency," *Electronics Letters*, vol. 30, No. 20, pp. 1643-1645 (Sep. 29, 1994).

Sundström, L., "Effects of reconstruction filters and sampling rate for a digital signal component separator on LINC transmitter performance," *Electronics Letters*, vol. 31, No. 14, pp. 1124-1125 (Jul. 6, 1995).

Sundström, L., "*The Effect of Quantization in a Digital Signal Component Separator for LINC Transmitters,*" *IEEE Transactions on Vehicular Technology*, vol. 45, No. 2, pp. 346-352 (May 1996).

Sundström, L., *Digital RF Power Amplifier Linearisers Analysis and Design*, Department of Applied Electronics, Lund University, pp. i-x and 1-64 (1995).

Tan, J. S. and Gardner, P., "A LINC Demonstrator Based On Switchable Phase Shifters," *Microwave and Optical Technology Letters*, vol. 35, No. 4, pp. 262-264 (Nov. 20, 2002).

Tchamov, N. T., *Power Amplifiers*, Tampere University of Technology, Institute of Communications Engineering, RF-ASIC Laboratory, 26 pages (May 17, 2004).

*TDP: RCA BHF-100A*, at http://www.transmitter.be/rca-bhf100a.html, 8 pages (printed Jun. 15, 2005).

*The Ampliphase Ancestry*, at http://www.rossrevenge.co.uk/tx/ancest.htm, 8 pages, (latest update Aug. 2002).

Tomisato, S. et al., "Phase Error Free LINC Modulator," *Electronics Letters*, vol. 25, No. 9, pp. 576-577 (Apr. 27, 1989).

Ullah, I., "Exciter Modulator For An Ampliphase Type Broadcast Transmitter," *ABU Technical Review*, No. 62, pp. 21-27 (May 1979).

Ullah, I., "Output Circuit Of An Ampliphase Broadcast Transmitter," *ABU Technical Review*, No. 63, pp. 17-24 (Jul. 1979).

Vasyukov, V.V. et al., "The Effect of Channel Phase Asymmetry on Nonlinear Distortions in Modulation by Dephasing," *Radioelectronics and Communications Systems*, vol. 28, No. 4, pp. 86-87 (1985).

Venkataramani, M., *Efficiency Improvement of WCDMA Base Station Transmitters using Class-F power amplifiers*, Thesis, Virginia Polytechnic Institute, Blacksburg, Virginia, pp. i-xi and 1-55 (Feb. 13, 2004).

Virmani, B.D., "Phase-to-amplitude modulation," *Wireless World*, vol. 61, No. 4, pp. 183-187 (Apr. 1955).

Wang, F. et al., "Envelope Tracking Power Amplifier with Pre-Distortion Linearization for WLAN 802.11g," *2004 IEEE MTT-S International Microwave Symposium Digest*, vol. 3, pp. 1543-1546 (Jun. 6-11, 2004).

Whitaker, Jerry C., *Power Vacuum Tubes Handbook (Electronics Hanbook Series)*, CRC Publishing, ISBN No. 0849313457, pp. 236-238 (May 1999).

Wight, J., "Computational microwave circuits arrive," at http://www/eetimes.com/showArticle.jhtml?articleID=18900752, EE Times, 3 pages (Apr. 12, 2004).

Wilds, R.B., "An S-Band Two-Phase Demodulator," pp. 48-53 (date unknown).

Woo, Y.Y. et al., "SDR Transmitter Based on LINC Amplifiers with Bias Control," *IEEE MTT-S International Microwave Symposium Digest*, pp. 1703-1706 (2003).

Ya, S. et al., "A C-Band Monolithic Vector Modulator," *Research & Progress of SSE*, vol. 14, No. 4, pp. 302-306 (Nov. 1994).

Yang, Y. et al., "A Fully Matched *N*-Way Doherty Amplifier With Optimized Linearity," *IEEE Transactions on Microwave Theory and Techniques*, vol. 51, No. 3. pp. 986-993 (Mar. 2003).

Yang, Y. et al., "A Microwave Doherty Amplifier Employing Envelope Tracking Technique for High Efficiency and Linearity," *IEEE Microwave and Wireless Components Letters*, vol. 13, No. 9, pp. 370-372 (Sep. 2003).

Yang, Y. et al., "Experimental Investigation on Efficiency and Linearity of Microwave Doherty Amplifier," IEEE, 4 pages (2001).

Yang, Y. et al., "Optimum Design for Linearity and Efficiency of a Microwave Doherty Amplifier Using a New Load Matching Technique," *Microwave Journal*, 8 pages (Dec. 1, 2001).

Yankin, V. A., "Effect of quantization, amplifier noise and the parameters of the calibration elements on the accuracy of measurement using a six-port microwave ampliphasemeter," *Radioelectronics and Communication Systems*, vol. 32, No. 8, pp. 110-112 (1989).

Yao, J. and Long, S.I., "High Efficiency Switching-Mode Amplifier for Mobile and Base Station Applications," Final Report Mar. 2002 for MICRO Project 02-044, 4 pages (2002-2003).

Yao, J. et al., "High Efficiency Switch Mode Amplifiers for Mobile and Base Station Applications," Final Report 2000-2001 for MICRO Project 00-061, 4 pages (2000-2001).

Yi, J. et al., "Effect of efficiency optimization on linearity of LINC amplifiers with CDMA signal," *IEEE MTT-S International Microwave Symposium Digest*, vol. 2, pp. 1359-1362 (May 2001).

Zhang, X., *An Improved Outphasing Power Amplifier System for Wireless Communications*, Dissertation, University of California, San Diego, pp. i-xvii and 1-201 (2001).

Zhang, X. and Larson, L.E., "Gain and Phase Error-Free LINC Transmitter," *IEEE Transactions on Vehicular Technology*, vol. 49. No. 5, pp. 1986-1994 (Sep. 2000).

Zhang, X. et al. "Gain/Phase Imbalance-Minimization Techniques for LINC Transmitters," *IEEE Transactions on Microwave Theory and Techniques*, vol. 49, No. 12, pp. 2507-2516 (Dec. 2001).

Zhang, X. et al., "A Gain/Phase Imbalance Minimization Technique for LINC Transmitter," *IEEE MIT-S International Microwave Symposium Digest*, pp. 801-804 (2001).

Zhang, X. et al., "Analysis of Power Recycling Techniques for RF and Microwave Outphasing Power Amplifiers," *IEEE Transactions on Circuits and Systems II: Analog and Digital Signal Processing*, vol. 49, No. 5, p. 312-320 (May 2002).

Zhang, X. et al., "Calibration scheme for LINC transmitter," *Electronics Letters*, vol. 37, No. 5, pp. 317-318 (Mar. 1, 2001).

Zhang, X. et al., *Design of Linear RF Outphasing Power Amplifiers*, entire book, Artech House, ISBN No. 1-58053-374-4 (2003).

Zhong, S.S. and Cui, J.H., "A New Dual Polarized Aperture-Coupled Printer Array for SAR Applications," *Journal of Shanghai University (English Edition)*, vol. 5, No. 4, pp. 295-298 (Dec. 2001).

English Abstract for European Patent Publication No. EP 0 639 307 B1, published Feb. 22, 1995, downloaded from http://v3.espacenet.com, 1 page.

English Abstract for European Patent Publication No. EP 0 708 546 A2, published Apr. 24, 1996, downloaded from http://v3.espacenet.com, 1 page.

English Abstract for European Patent Publication No. EP 0 892 529 A2, published Jan. 20, 1999, downloaded from http://v3.espacenet.com, 1 page.

English Abstract for Japanese Patent Publication No. JP 60-63517 A, published Apr. 11, 1985, downloaded from http://v3.espacenet.com, 1 page.

English Abstract for Japanese Patent Publication No. JP 2-87708 A, published Feb. 28, 1990, downloaded from http://v3.espacenet.com, 1 page.

English Abstract for Japanese Patent Publication No. JP 3-232307 A, published Oct. 16, 1991, downloaded from http://v3.espacenet.com, 1 page.

English Abstract for Japanese Patent Publication No. JP 5-22046 A, published Jan. 29, 1993, downloaded from http://v3.espacenet.com, 1 page.
English Abstract for Japanese Patent Publication No. JP 6-338728 A, published Dec. 6, 1994, downloaded from http://v3.espacenet.com, 1 page.
English Abstract for Japanese Patent Publication No. JP 10-70451 A, published Mar. 19, 1998, downloaded from http://v3.espacenet.com, 1 page.
English Abstract for Japanese Patent Publication No. JP 2001-136057 A, published May 18, 2001, downloaded from http://v3.espacenet.com, 1 page.
English Abstract for Japanese Patent Publication No. JP 2004-260707 A, published Sep, 16, 2004, downloaded from http://v3.espacenet.com, 1 page.
English Abstract for Romanian Patent Publication No. RO 100466, published Aug. 20, 1992, obtained from Transperfect Translations, 4 pages.
English Abstract for Romanian Patent Publication No. RO 102824, published Nov. 19, 2001, downloaded from http://v3.espacenet.com, 1 page.
English Translation for Russian Patent Publication No. SU 1322183 A1, published Jul. 7, 1987, obtained from Transperfect Translations, 2 pages.
Notification of Transmittal of the International Search Report and Written Opinion, dated Mar. 4, 2008, for PCT Application No. PCT/US07/06197, 8 pages.
Notification of Transmittal of the International Search Report and Written Opinion, dated Aug. 15, 2008, for PCT Application No. PCT/US08/06360, 6 pages.
Notification of Transmittal of the International Search Report and Written Opinion, dated Sep. 3, 2008, for PCT Application No. PCT/US2008/008118, 6 pages.
Notification of Transmittal of the International Search Report and Written Opinion, dated Sep. 8, 2008, for PCT Application No. PCT/US2008/007623, 6 pages.
Silverman, L. And Del Plato, C., "Vector Modulator Enhances Feedforward Cancellation," *Microwaves & RF*, pp. 1-4 (Mar. 1998).
Notification of Transmittal of the International Search Report and Written Opinion, dated Jul. 7, 2009, for PCT Application No. PCT/US09/03212, 6 pages.
Jang, M. et al., "Linearity Improvement of Power Amplifier Using Modulation of Low Frequency IMD Signals," *Asia-Pacific Microwave Conference Proceedings*, vol. 2, pp. 1156-1159, Dec. 4-7, 2005.
Woo, W. et al., "A Hybrid Digital/RF Envelope Predistortion Linearization System for Power Amplifiers," *IEEE Transactions on Microwave Theory and Techniques*, vol. 53, No. 1, pp. 229-237, Jan. 2005.
Notification of Transmittal of the International Search Report and Written Opinion, dated Apr. 27, 2010, for PCT Application No. PCT/US2009/057306, 11 pages.
English Abstract for Japanese Patent Publication No. JP 2005-151543 A, published Jun. 9, 2005, downloaded from http://v3.espacenet.com, 1 page.
English Abstract for Japanese Patent Publication No. JP 1-284106 A, published Nov. 15, 1989, downloaded from http://v3.espacenet.com, 1 page.
English Abstract for Japanese Patent Publication No. JP 4-095409 A, published Mar. 27, 1992, downloaded from http://v3.espacenet.com, 1 page.
English Abstract for Japanese Patent Publication No. JP 4-104604 A, published Apr. 7, 1992, downloaded from http://v3.espacenet.com, 1 page.
English Abstract for Japanese Patent Publication No. JP 9-018536 A, published Jan. 17, 1997, downloaded from http://v3.espacenet.com.
English Abstract for Japanese Patent Publication No. JP 9-074320 A, published Mar. 18, 1997, downloaded from http://v3.espacenet.com, 1 page.
English Abstract for Japanese Patent Publication No. JP 2000-209291 A, published Jul. 28, 2000, downloaded from http://v3.espacenet.com, 1 page.
English Abstract for Japanese Patent Publication No. JP 2003-298357 A, published Oct. 17, 2003, downloaded from http://v3.espacenet.com, 1 page.
English Abstract for Japanese Patent Publication No. JP 2000-244261 A, published Sep. 8, 2000, downloaded from http://worldwide.espacenet.com, 1 page.
English Abstract for Japanese Patent Publication No. JP 2001-217659 A, published Aug. 10, 2001, downloaded from http://worldwide.espacenet.com, 1 page.
English Abstract for Japanese Patent Publication No. JP 2001-308650 A, published Nov. 2, 2001, downloaded from http://worldwide.espacenet.com, 1 page.
English Abstract for Japanese Patent Publication No. JP 2002-543729 A, published Dec. 17, 2002, downloaded from http://worldwide.espacenet.com, 1 page.
*Complaint*, filed Dec. 28, 2011, in the United States District Court, District of New Jersey, *Maxtak Capital Advisors LLC et al.*, v. *ParkerVision, Inc. et al.*, Case No. 2:11-cv-07549-CCC-JAD, 63 pages.
Notification of Transmittal of the International Search Report and Written Opinion, dated Aug. 14, 2012, for PCT Appl. No. PCT/US2012/032791, 7 pages.
Harlan, G. et al, "Dynamically-Configurable Multimode Transmitter Systems for Wireless Handsets, Cognitive Radio and SDR Applications," *IEEE International Conference on Microwaves, Communications, Antennas and Electronics Systems*, Nov. 9, 2009, pp. 1-5.
Rawlins, G. and Sorrells, D., "A Thermodynamic Theory of RF Power Transmitters with an Example," *IEEE 10th Annual Wireless and Microwave Technology Conference*, Apr. 20, 2009, pp. 1-5.
Rawlins, G. et al., "Using an IQ Data to RF Power Transmitter to Realize a Highly-Efficient Transmit Chain for Current and Next-Generation Mobile Handsets," *Proceedings of the 38th European Microwave Conference*, Oct. 27, 2008, pp. 579-582.
English Abstract for Japanese Patent Publication No. JP 5-037263 A, published Feb. 12, 1993, downloaded from http://worldwide.espacenet.com, 1 page.
English Abstract for Japanese Patent Publication No. JP 2005-101940 A, published Apr. 14, 2005, downloaded from http://worldwide.espacenet.com, 1 page.

* cited by examiner

SYSTEMS AND METHODS OF RF POWER TRANSMISSION, MODULATION, AND AMPLIFICATION, INCLUDING BLENDED CONTROL EMBODIMENTS

CROSS-REFERENCE TO RELATED APPLICATIONS

The present application is a continuation of U.S. patent application Ser. No. 12/236,079, filed Sep. 23, 2008, which is a continuation-in-part of U.S. patent application Ser. No. 12/142,521, filed Jun. 19, 2008, which claims the benefit of U.S. Provisional Patent Application No. 60/929,239, filed Jun. 19, 2007, and U.S. Provisional Patent Application No. 60/929,584, filed Jul. 3, 2007, all of which are incorporated herein by reference in their entireties.

The present application is related to U.S. patent application Ser. No. 11/256,172, filed Oct. 24, 2005, now U.S. Pat. No. 7,184,723 and U.S. patent application Ser. No. 11/508,989, filed Aug. 24, 2006, now U.S. Pat. No. 7,355,470, both of which are incorporated herein by reference in their entireties.

BACKGROUND OF THE INVENTION

1. Field of the Invention

The present invention relates generally to RF (radio frequency) power transmission, modulation, and amplification.

2. Background Art

Today's RF power amplifiers are required to generate complex RF signals with stringent output power and linearity requirements. For example, in order to comply with the requirements of a WCDMA waveform, a power amplifier needs to support approximately 30-40 dB of instantaneous output power dynamic range at a given power output level This is mainly due to the ACPR (Adjacent Channel Power Ratio) and the ACLR (Adjacent Channel Leakage Ratio) requirements of the WCDMA waveform, which require very deep nulls as the output power waveform crosses zero.

Generally, the ACLR and ACPR that a power amplifier can achieve are related to the linearity of the power amplifier over the output power range of the desired waveform. Modern RF waveforms (e.g., OFDM, CDMA, WCDMA, etc.) are characterized by their associated PAP (Peak-to-Average Power) ratios. As such, in order to generate such waveforms, the power amplifier needs to be able to operate in a largely linear manner over a wide output power range that encompasses the output power range of the desired waveforms.

Outphasing amplification or LINC (Linear Amplification with Nonlinear Components) provides an amplification technique with the desirable linearity to amplify RF waveforms with large PAP ratios. Outphasing works by separating a signal into equal and constant envelope constituents, linearly amplifying the constituents, and combining the amplified constituents to generate the desired output signal. To preserve linearity when combining the amplified constituents, existing outphasing techniques use an isolating and/or a combining element, which provides the needed isolation between the branches of the outphasing amplifier to reduce non-linear distortion.

In several respects, however, existing outphasing techniques are not suitable for implementation in modern portable devices. For example, the isolating and/or combining element that they use causes a degradation in output signal power (due to insertion loss and limited bandwidth) and, correspondingly, low power amplifier efficiency. Further, the typically large size of isolating/combining elements precludes having them in monolithic amplifier designs.

There is a need therefore for outphasing amplification systems and methods that eliminate the isolating/combining element used in existing outphasing techniques, while providing substantially linear amplification over a wide output power dynamic range to support modern RF waveforms.

BRIEF SUMMARY OF THE INVENTION

The present invention relates generally to RF power transmission, modulation, and amplification.

Embodiments of the present invention enable a blended control approach to generate a desired output waveform in an outphasing-based system.

Embodiments of blended control according to the present invention combine pure (or substantially pure) outphasing with bias and/or amplitude control to yield an accurate, practical, and/or producible system with substantially comparable performance to that of an ideal outphasing system, but without the isolation and accuracy requirements of outphasing alone.

Embodiments of blended control according to embodiments of the present invention provide a high degree of control over the constituent phasors (both in terms of amplitude and/or phase) of a desired phasor in order to generate the desired phasor with high accuracy and repeatability. This allows for a reduction in both branch isolation requirements and phase/amplitude accuracy requirements (as related to the constituent phasors) as compared to a pure outphasing or ideal outphasing system.

Embodiments of blended control according to the present invention allow for any desired phasor to be generated with high accuracy while limiting the differential phase between the constituent phasors of the desired phasor to a range over which error is negligible. As a result, accuracy requirements in terms of the phase/amplitude of the constituent phasors can be significantly reduced, which accommodates the branch isolation levels that can be practically expected in a combinerless outphasing system. Further, embodiments of blended control according to the present invention allow for any desired phasor to be generated using any one of an infinite number of constituent phasor configurations as opposed to a single configuration in a pure outphasing system.

According to embodiments of the present invention, the shaping of the constituent phasors in phase and/or amplitude using blended control is performed instantaneously (or substantially instantaneously) in accordance with the desired waveform output power trajectory. In an embodiment, this is performed using a weighted combination of phase, bias, and amplitude controls, with the control combination (or blend) dynamically changing according to the desired waveform output power trajectory.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 4:
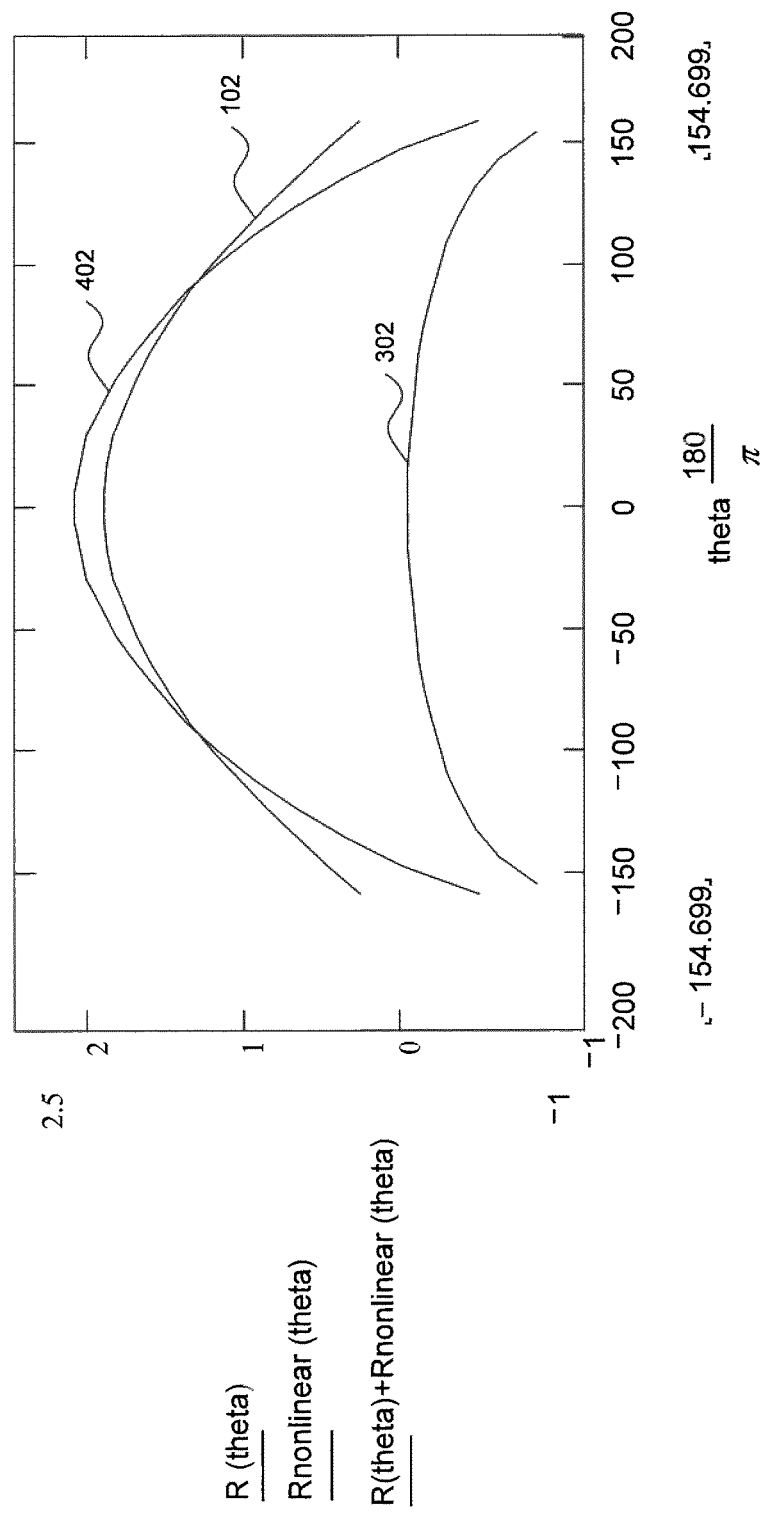

FIG. 4 compares the theoretical error-free normalized amplitude of a phasor and the theoretical amplitude of the phasor when the constituents are combined with 20 of dB isolation, as a function of the differential phase between the constituents of the phasor.

Figure 5:
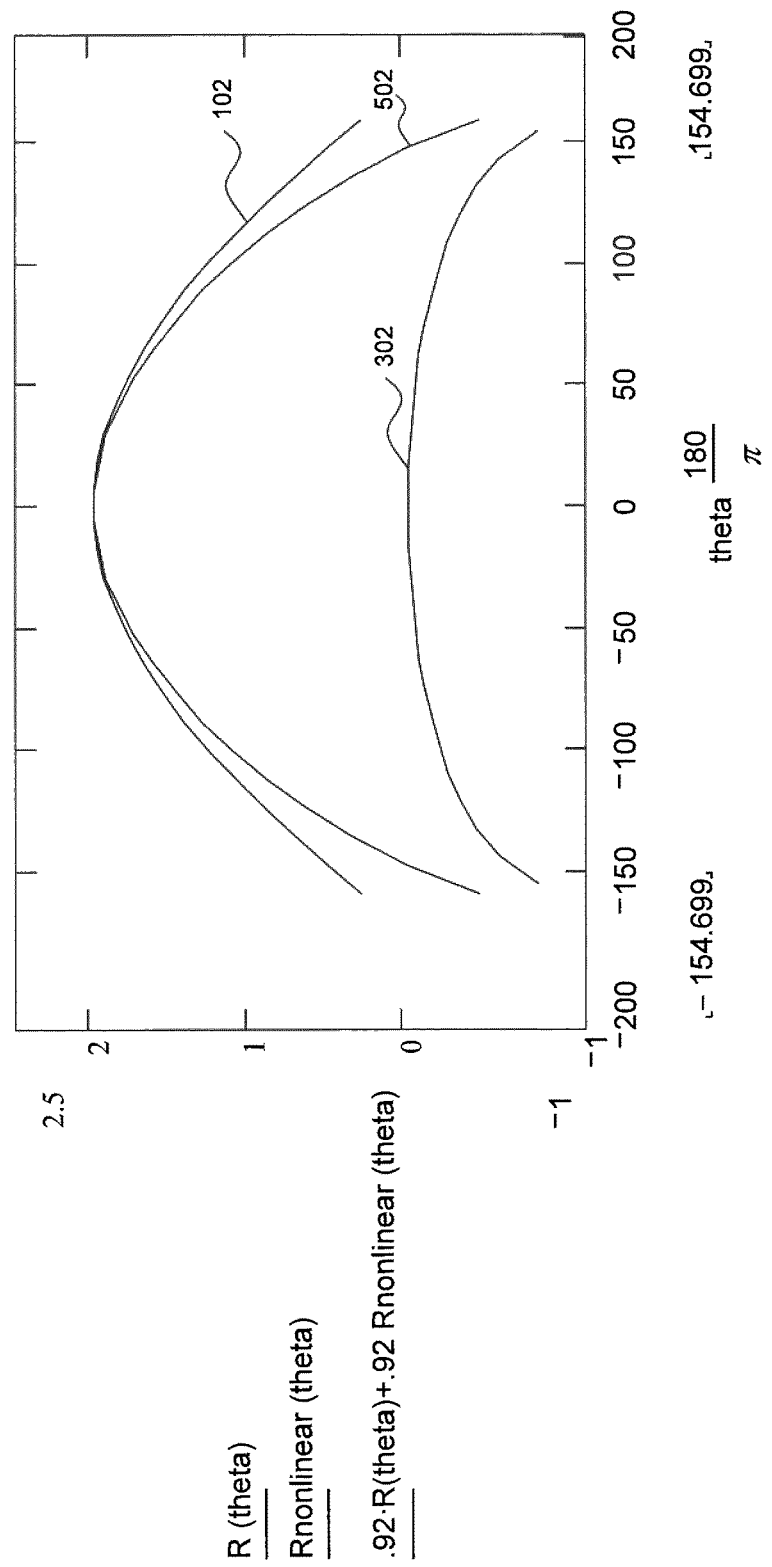

FIG. 5 compares the theoretical error-free normalized amplitude of a phasor and the theoretical normalized amplitude of the phasor when the constituents are combined with 20 dB of isolation, as a function of the differential phase between the constituents of the phasor.

Figure 6:
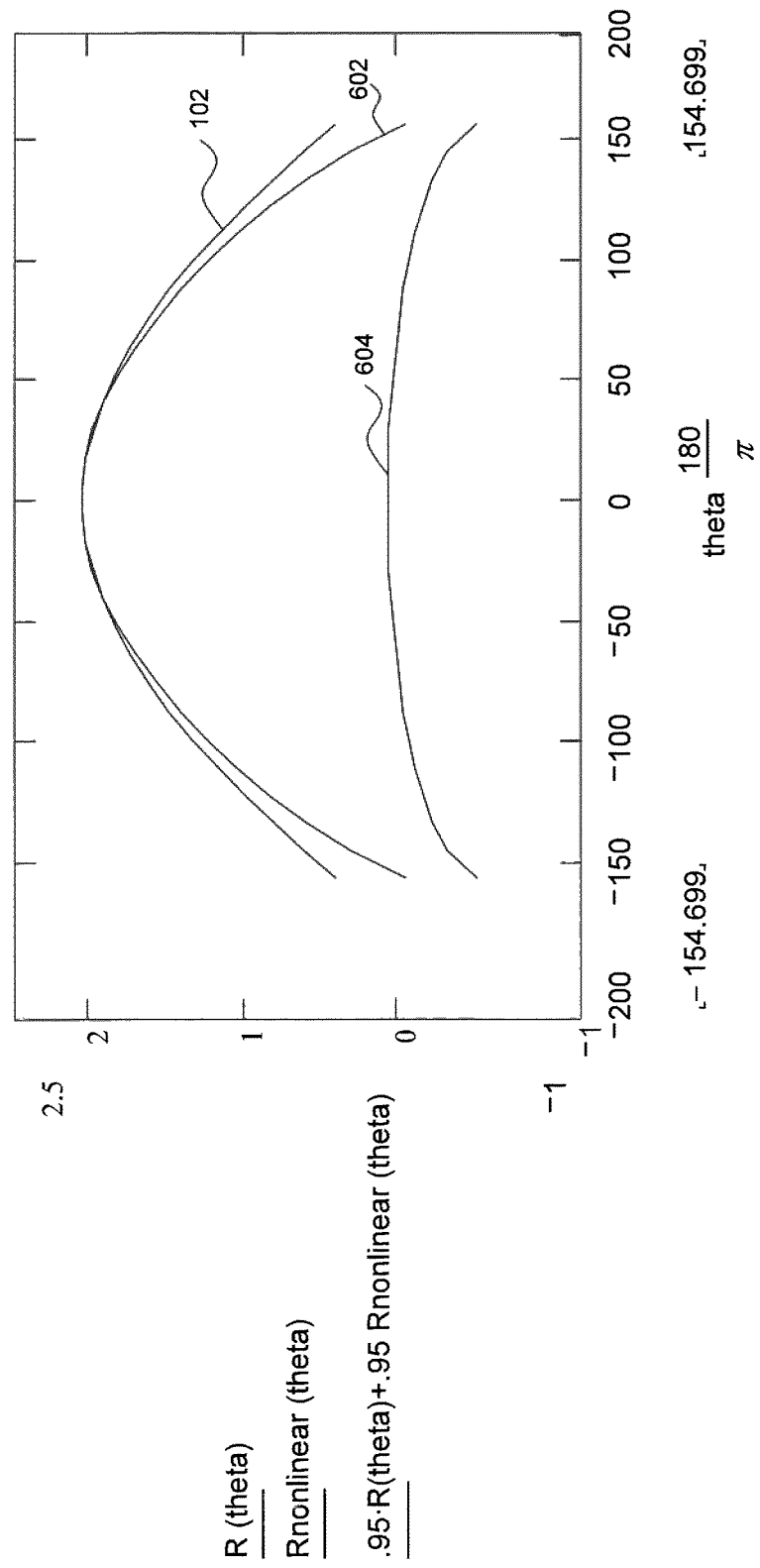

FIG. 6 compares the theoretical error-free normalized amplitude of a phasor and the theoretical normalized amplitude of the phasor when the constituents are combined with 25 dB of isolation, as a function of the differential phase between the constituents of the phasor.

Figure 7:
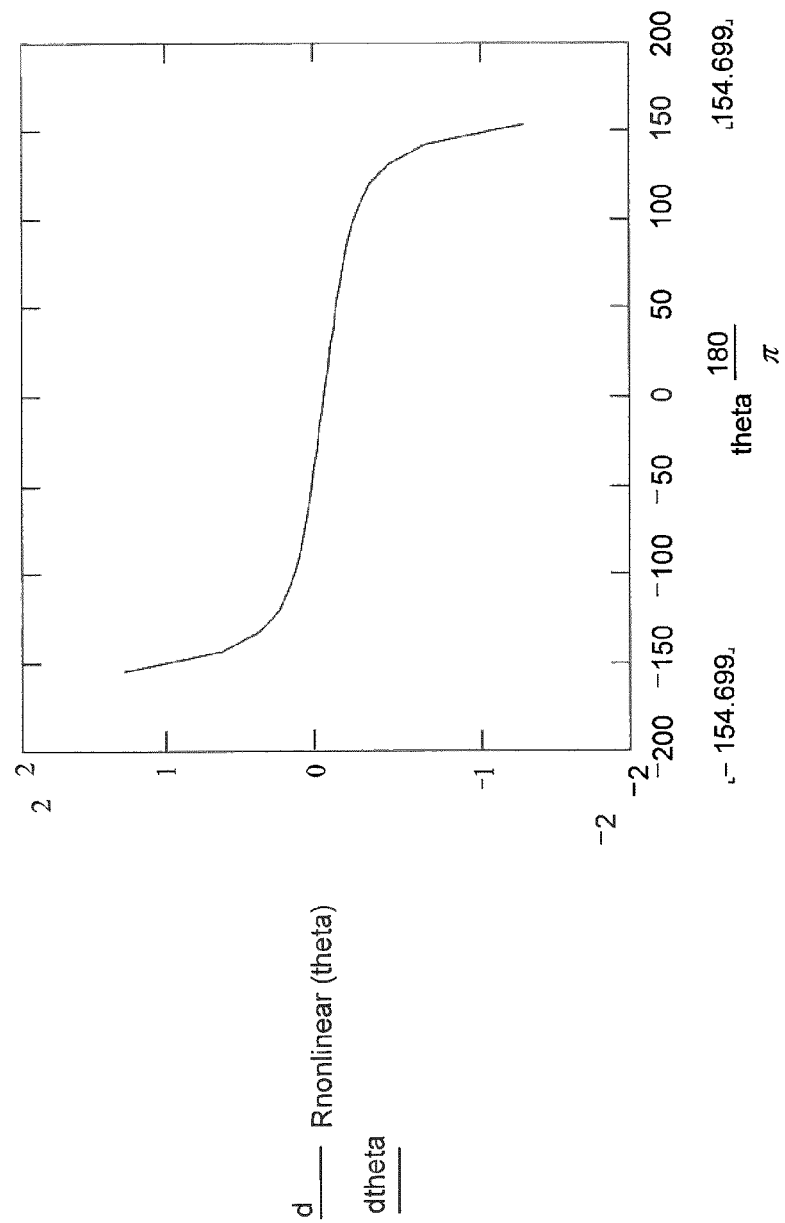

FIG. 7 illustrates the derivative of the theoretical error in the amplitude of a phasor as a function of the differential phase between the constituents of the phasor, when the constituents are combined with 25 dB of isolation.

Figure 8:
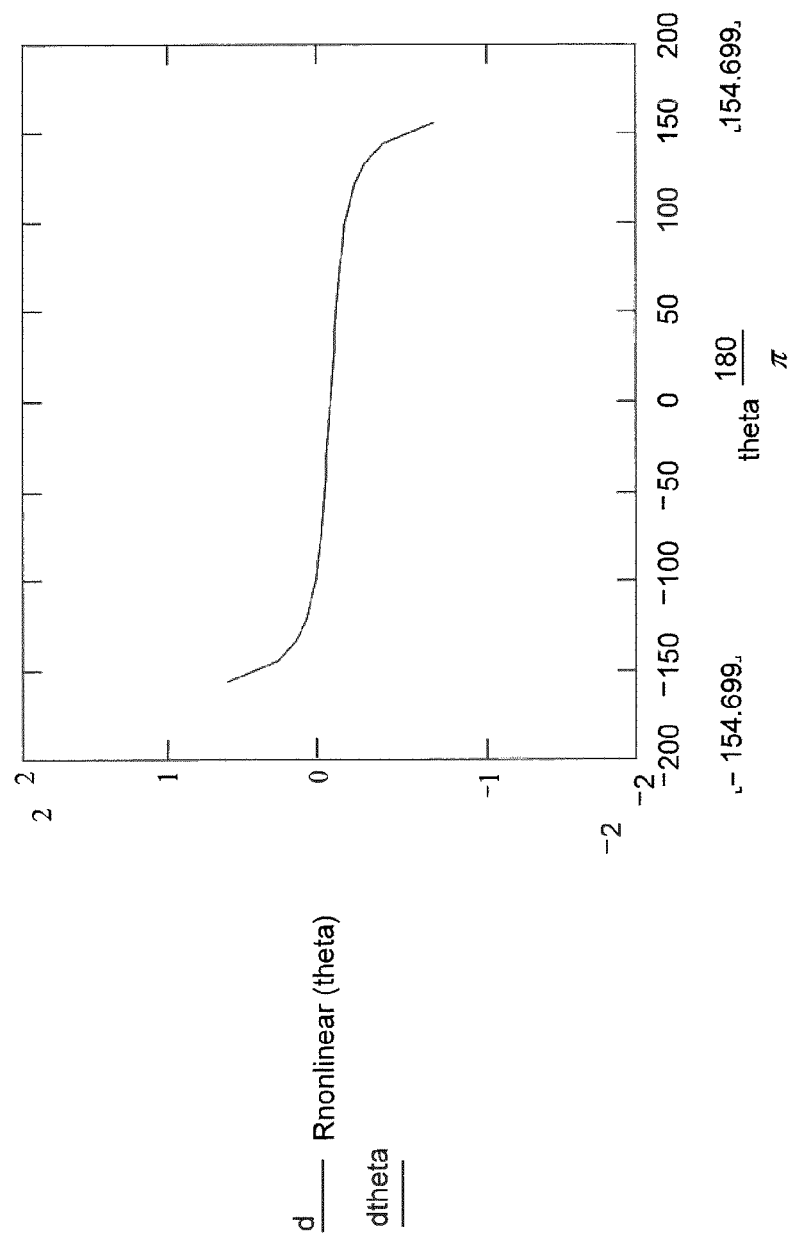

FIG. 8 illustrates the derivative of the theoretical phasor error in the amplitude of a phasor as a function of the differential phase between the constituents of the phasor, when the constituents are combined with 30 dB of isolation.

Figure 9:
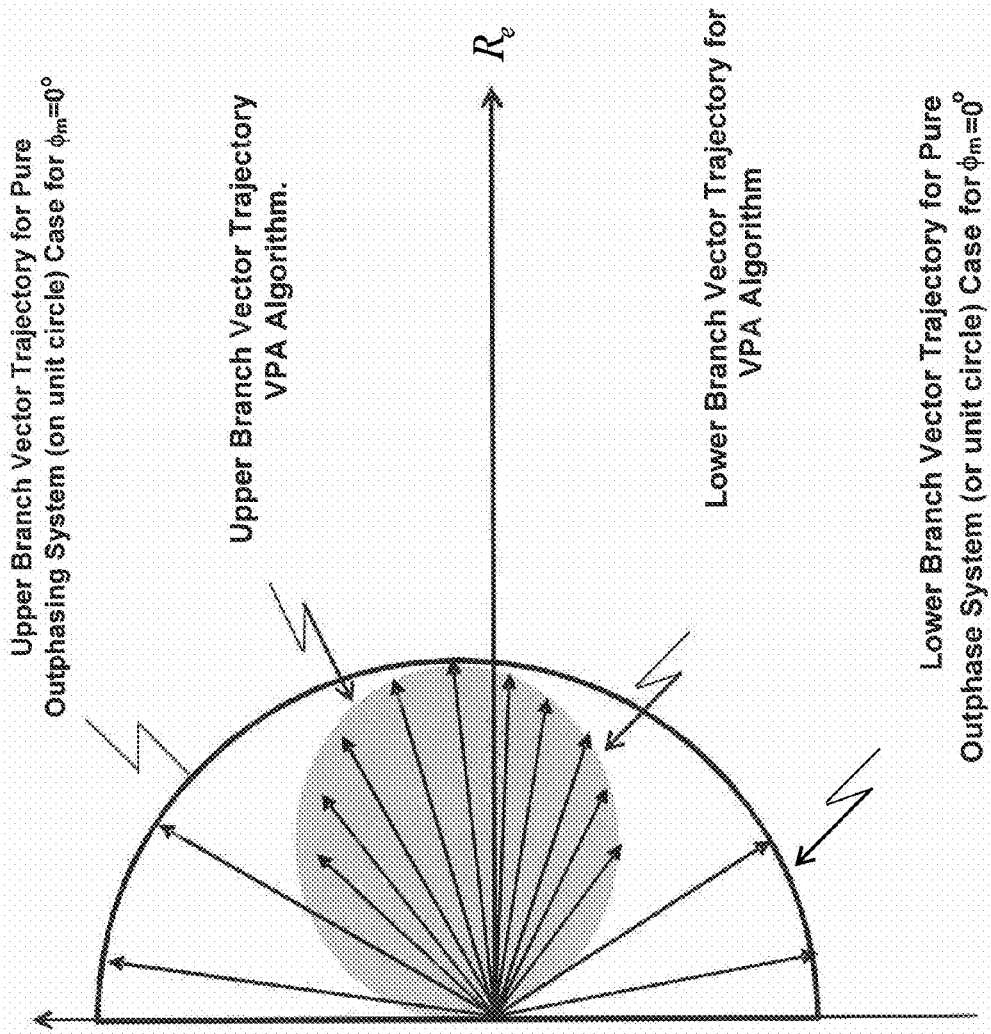

FIG. 9 compares blended control amplification according to an embodiment of the present invention and outphasing amplification, with respect to the level of control over the constituents of a desired phasor.

Figure 10:
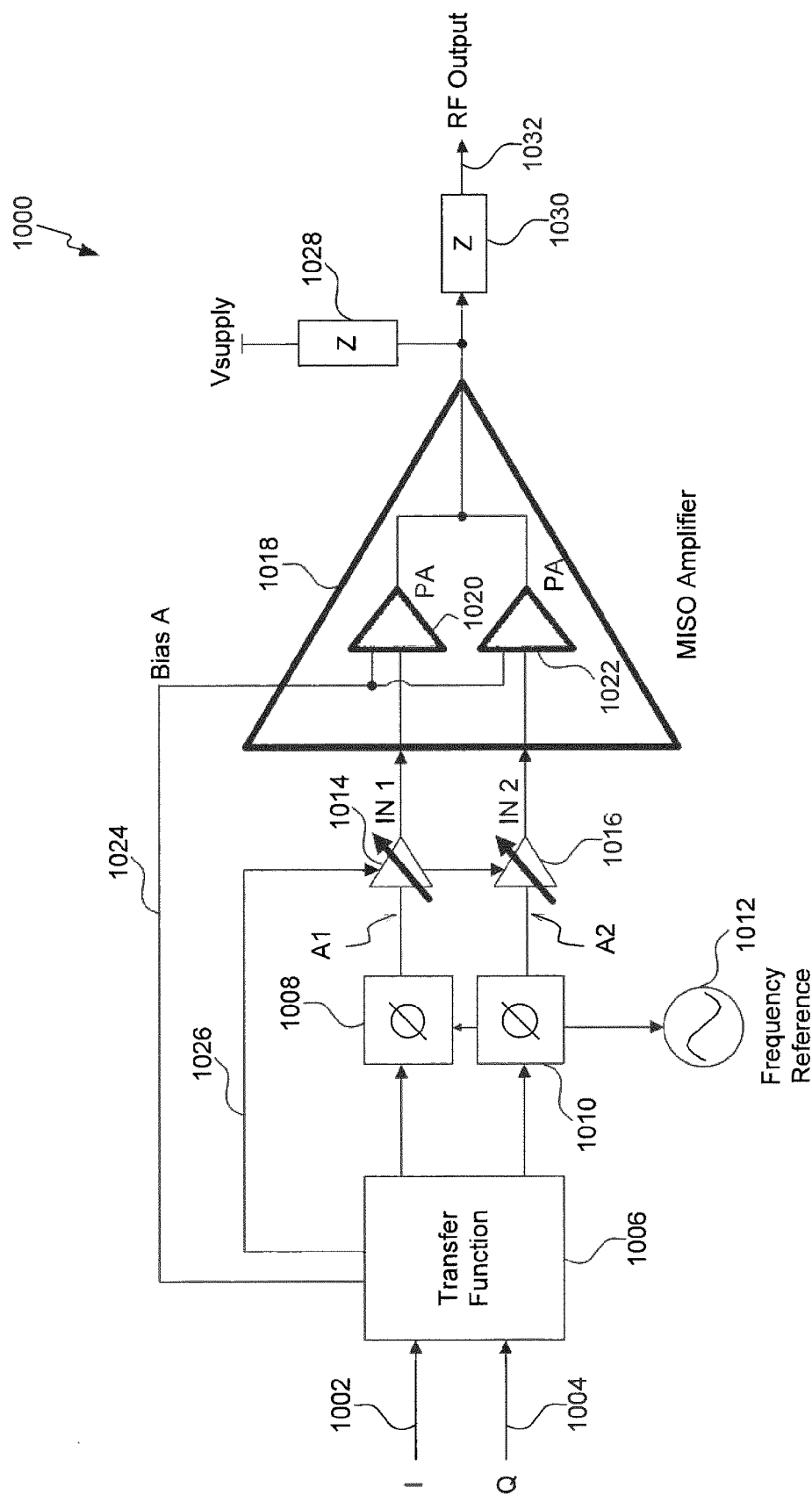

FIG. 10 illustrates an example blended control amplification system according to an embodiment of the present invention.

Figure 11:
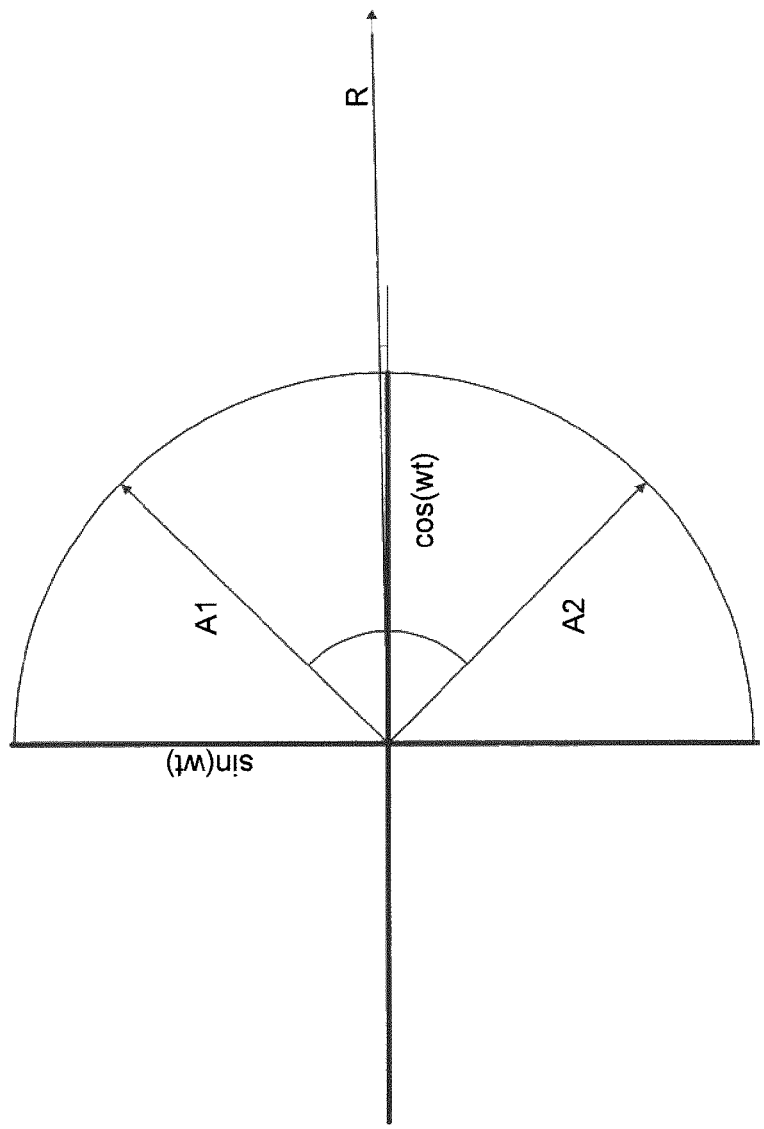

FIG. 11 illustrates the relationship between the error (in amplitude and phase) in a phasor and the imbalance (in amplitude and phase) between the constituents of the phasor.

Figure 12:
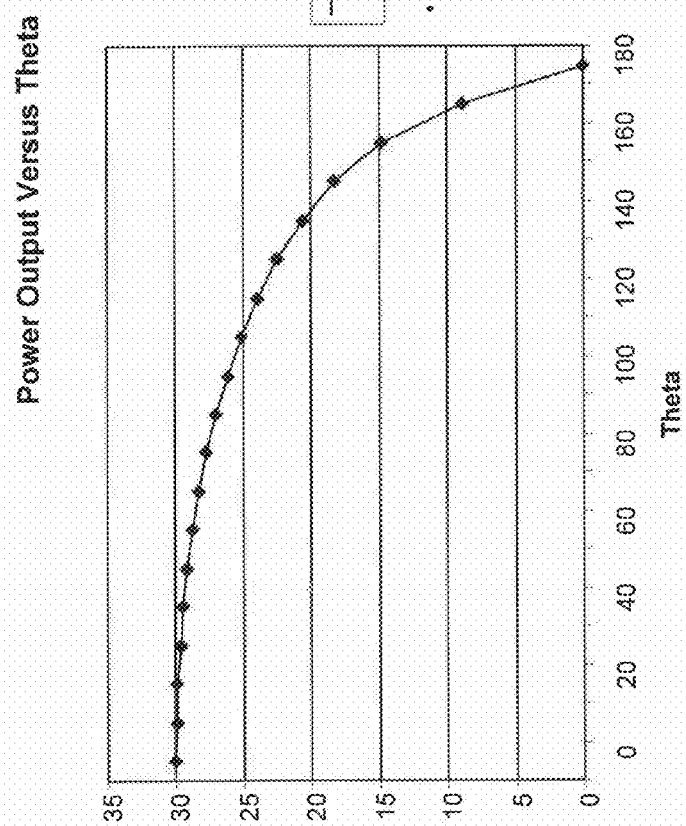

FIG. 12 illustrates the power output associated with a phasor as a function of the differential phase between the constituents of the phasor, when no imbalance in amplitude and phase exists between the constituents of the phasor.

Figure 13:
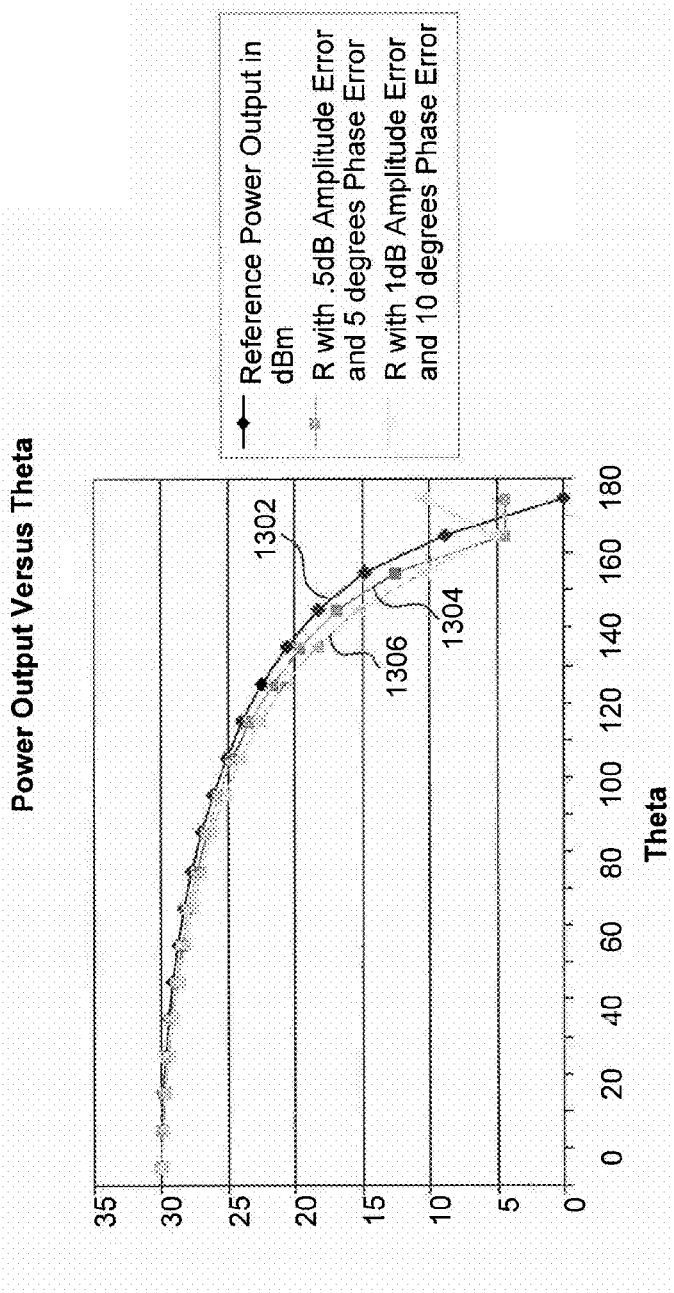

FIG. 13 compares the power output associated with a phasor as a function of the differential phase between the constituents of the phasor, for different scenarios of amplitude and phase imbalance between the constituents of the phasor.

Figure 14:
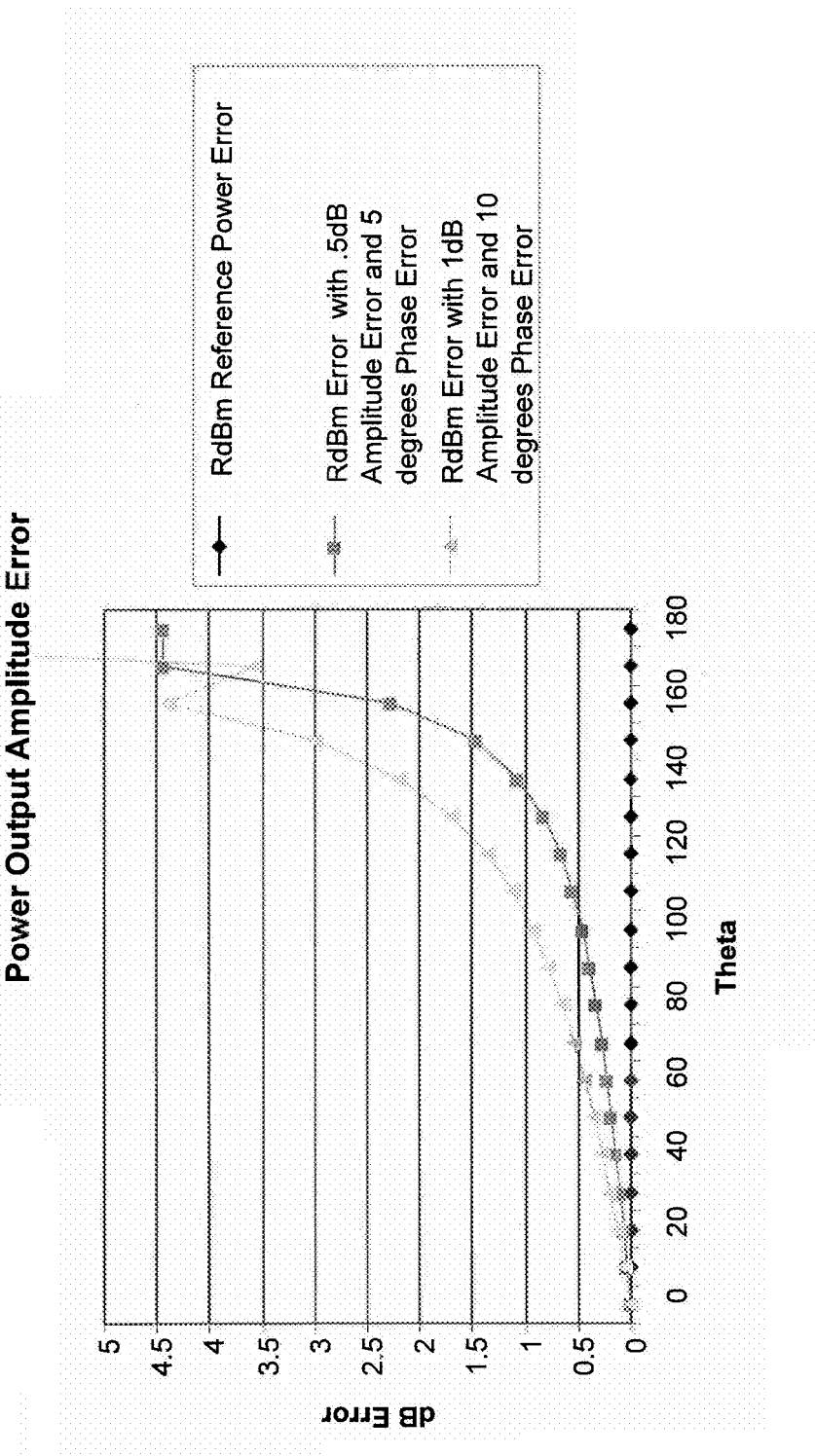

FIG. 14 compares the amplitude error in the power output associated with a phasor as a function of the differential phase between the constituents of the phasor, for different scenarios of amplitude and phase imbalance between the constituents of the phasor.

Figure 15:
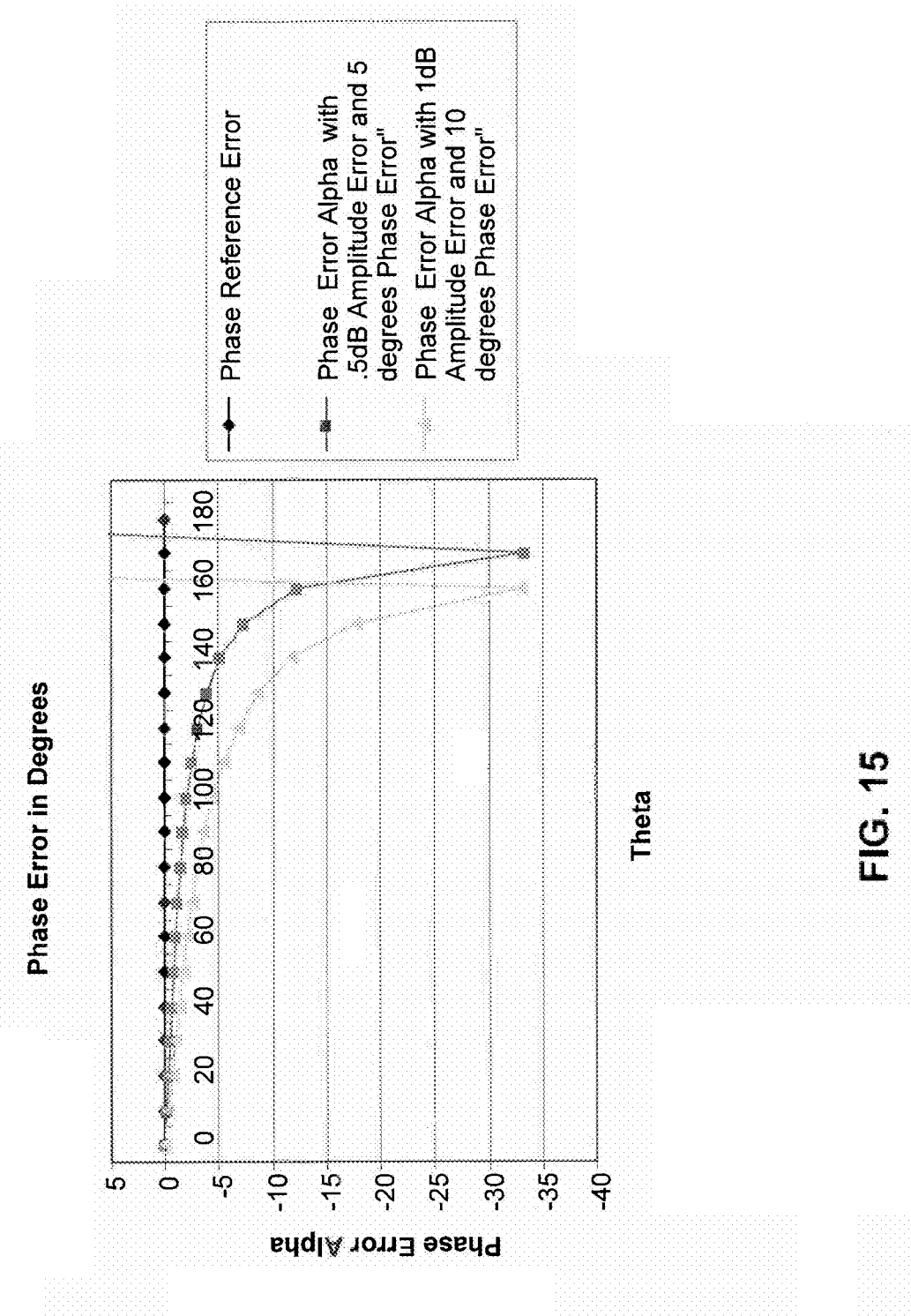

FIG. 15 compares the phase error in the power output associated with a phasor as a function of the differential phase between the constituents of the phasor, for different scenarios of amplitude and phase imbalance between the constituents of the phasor.

Figure 16:
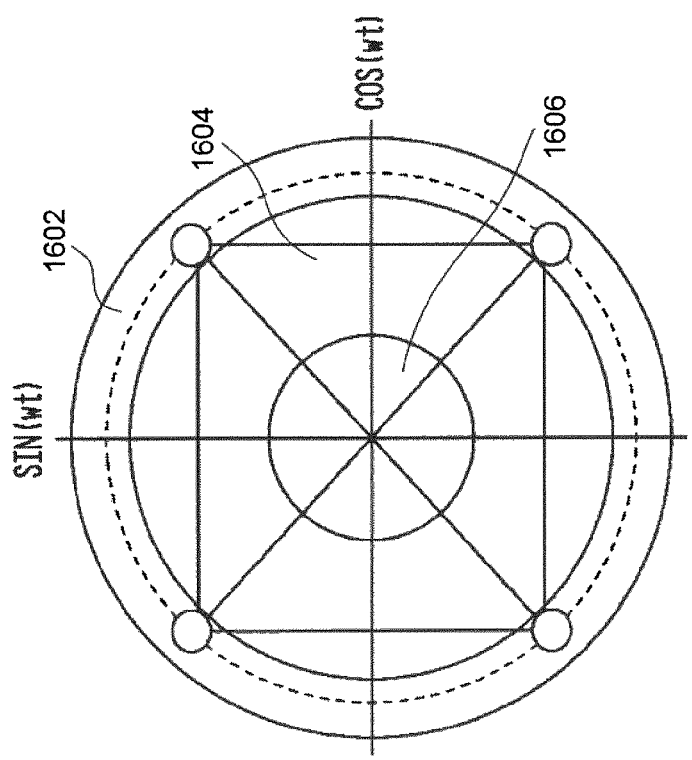

FIG. 16 illustrates an example blended control amplification function according to an embodiment of the present invention.

Figure 17:
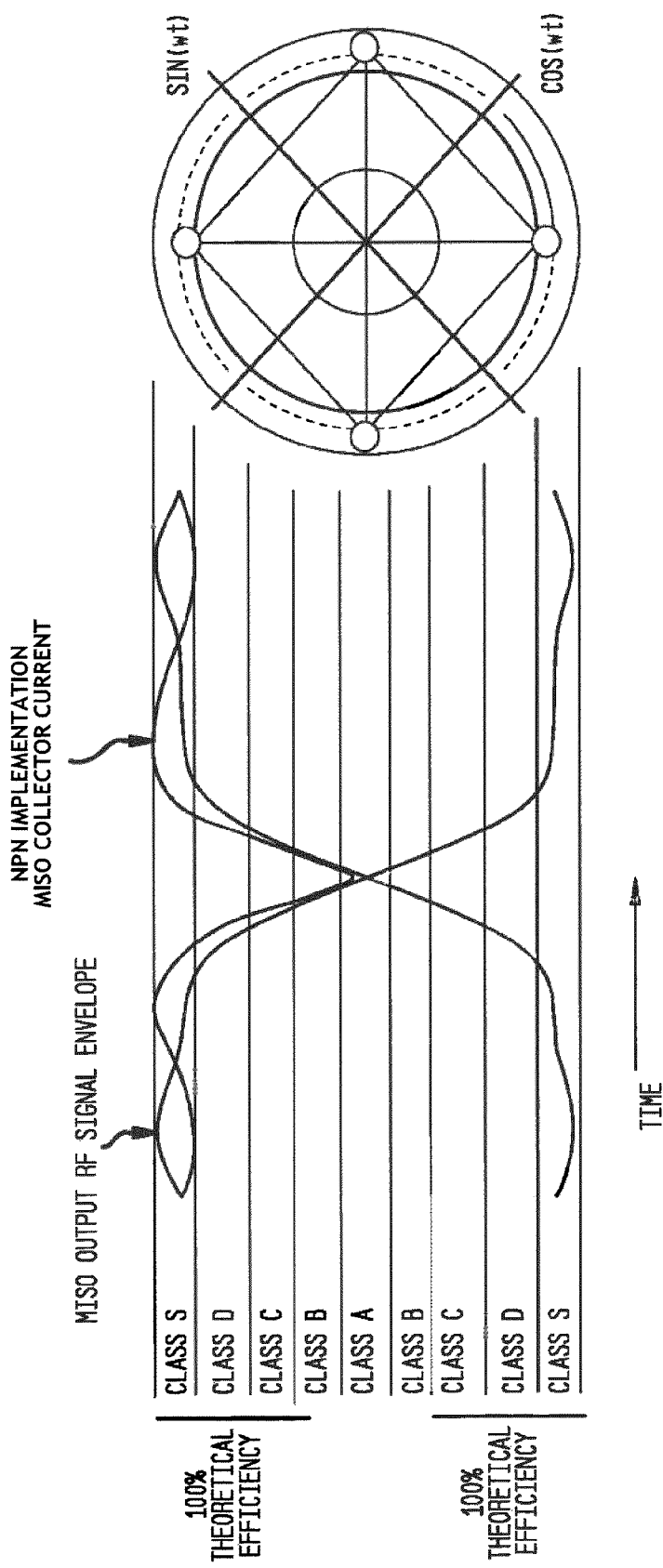

FIG. 17 illustrates real-time blended control amplification for an example output power waveform according to an embodiment of the present invention.

Figure 18:
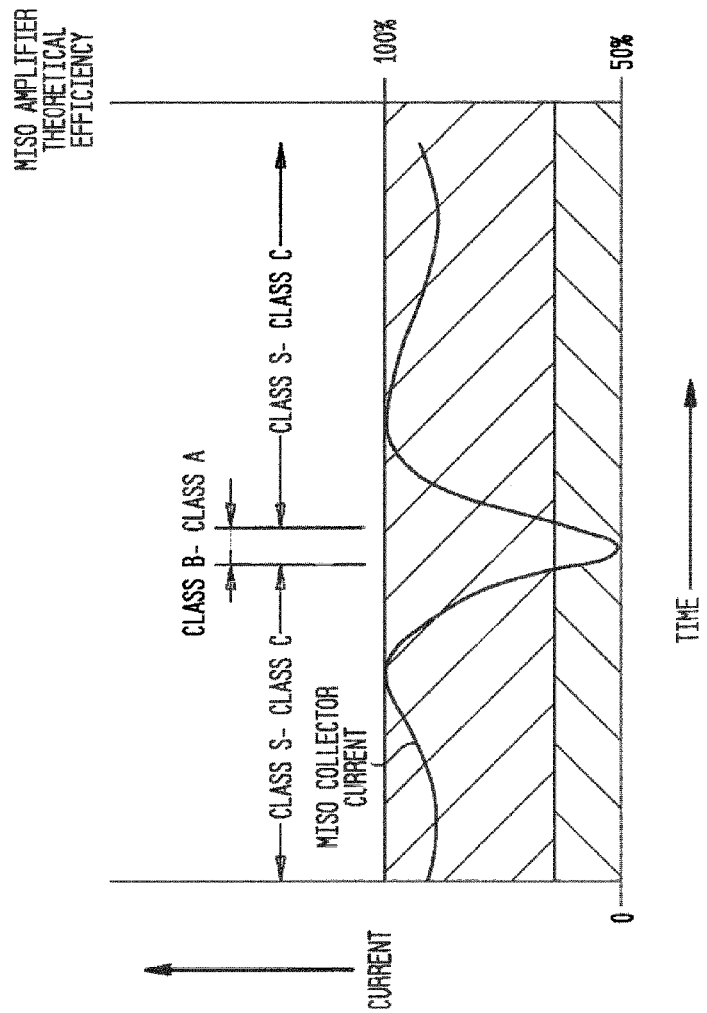

FIG. 18 is an example that illustrates the output stage theoretical efficiency of a blended control amplification system according to an embodiment of the present invention, as function of the output stage current.

Figure 19:
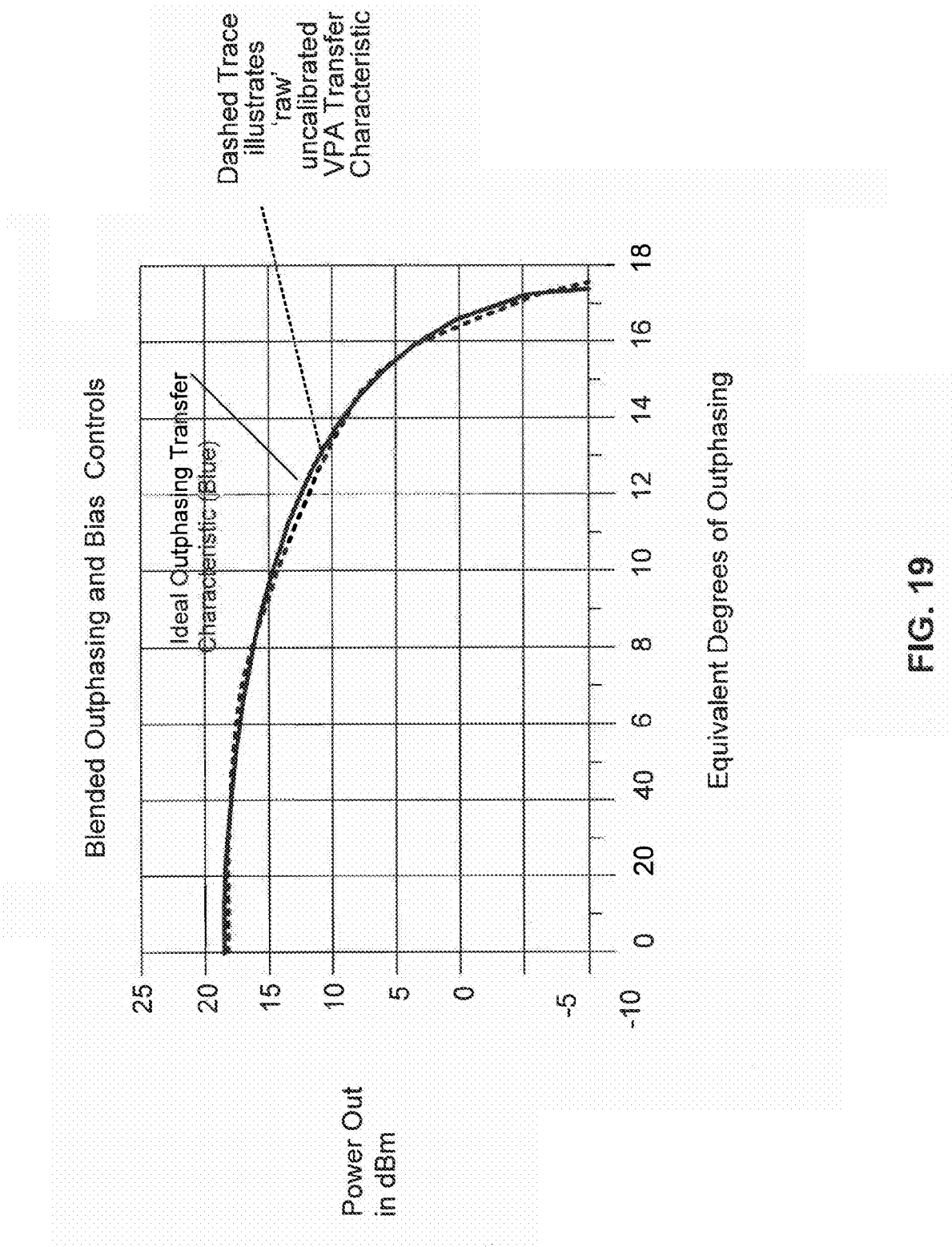

FIG. 19 compares the output power transfer characteristic of a blended control amplification system according to an embodiment of the present invention and the output power transfer characteristic of an ideal outphasing amplification system.

FIGS. 20-23 illustrate using a blended control amplification function according to an embodiment of the present invention to generate an example modulated ramp output.

Figure 24:
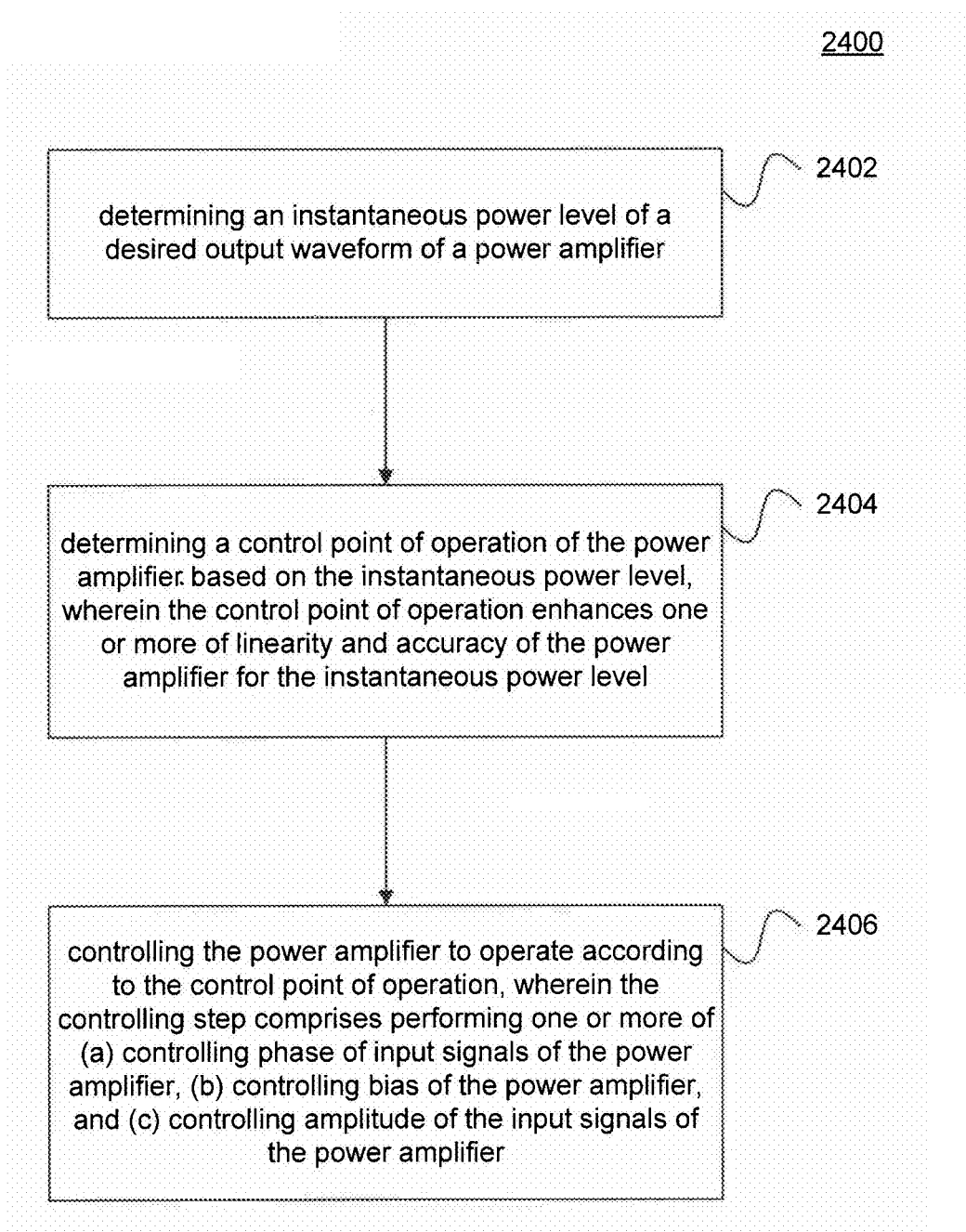
Figure 25:
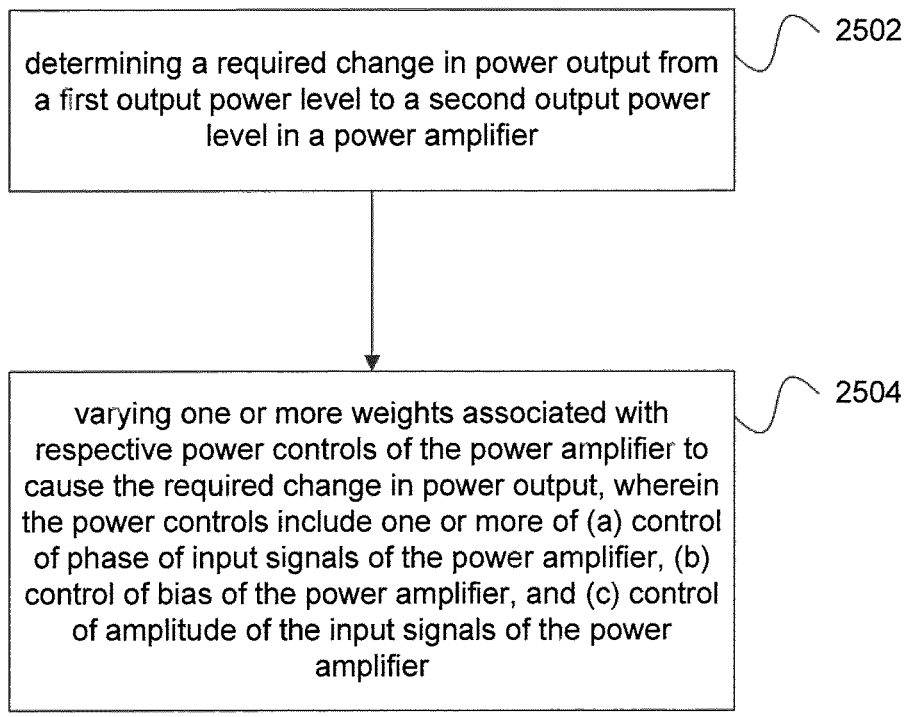
Figure 26:
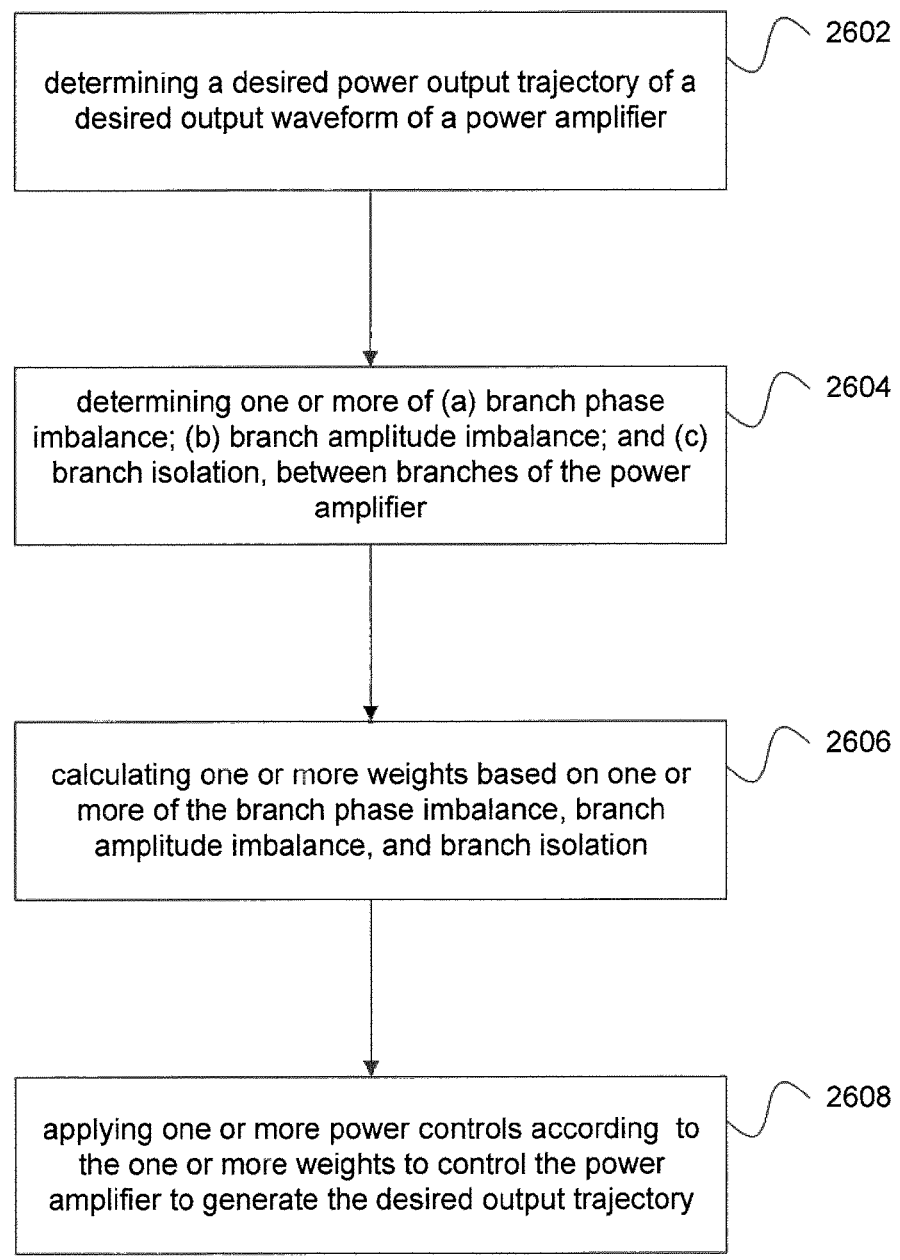

FIGS. 24-26 illustrate example blended control methods according to embodiments of the present invention.

The present invention will be described with reference to the accompanying drawings. Generally, the drawing in which an element first appears is typically indicated by the leftmost digit(s) in the corresponding reference number.

DETAILED DESCRIPTION OF EMBODIMENT(S)

In commonly owned U.S. patent(s) and application(s), cross-referenced above, VPA (Vector Power Amplification) and MISO (Multiple-Input-Single-Output) amplification embodiments were introduced. VPA and MISO provide combiner-less RF power amplification, which results in high power amplifier efficiency. At the same time, despite minimal or zero branch isolation, VPA and MISO amplification include innovative amplifier bias functions that effectively result in highly linear amplification over the entire output power range of desired waveforms.

In the following sections, embodiments of a blended control function for operating a MISO amplifier embodiment are provided. The blended control function allows for the mixing of various output power control functions enabled by VPA and MISO, to generate a desired waveform with high accuracy. In Section 2, the relationship between branch isolation (i.e., isolation between the branches of an outphasing amplifier) and output power error is described. This serves as an introduction to the practical limitations of a pure outphasing system, which are described in Section 3. In Section 4, blended control amplification is introduced. In Section 5, design considerations related to blended control amplification are described. Section 6 describes an example blended control function and associated performance results. Finally, Section 7 presents example blended control methods according to embodiments of the present invention.

1. Relationship Between Branch Isolation and Output Power Error

Equation (1) below describes the sum of two sine waves (or phasors) of equal amplitude, A, and frequency, $\omega_c$, but having a differential phase $\theta$:

$$R \sin(\omega_c t+\delta)=A \sin \omega_c t+A \sin(\omega_c t+\theta). \quad (1)$$

The resulting phasor has amplitude R and phase $\delta$. Equation (1) further indicates that any desired phasor of given amplitude and phase can be obtained from the sum of two equal amplitude phasors with appropriate differential phase between the two. The equal amplitude phasors are commonly referred to as the constituents of the desired phasor.

From equation (1), it can be further noted that the amplitude of the resulting phasor is a function of the differential phase, θ, between its constituents, as follows:

$$R(\theta) = A \frac{\sin(\omega_c t) + \sin(\omega_c t + \theta)}{\sin(\omega_c t + \delta(\theta))}. \quad (2)$$

Similarly, the phase, δ(θ), of the resulting phasor is a function of the differential phase, θ, between its constituents.

Figure 1:
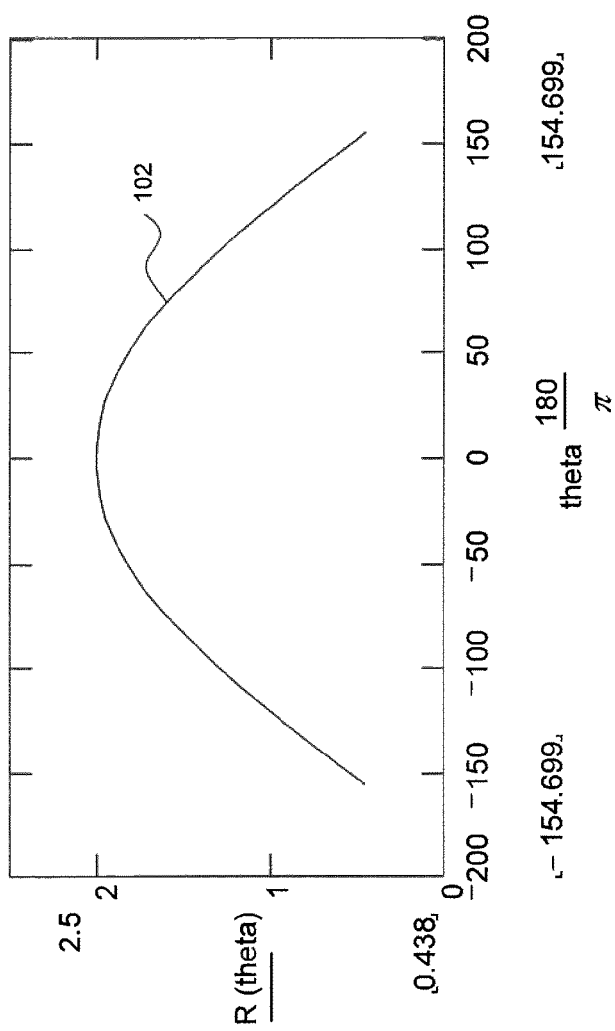
FIG. 1 illustrates the theoretical error-free normalized amplitude of a phasor as a function of the differential phase between the constituents of the phasor.

FIG. 1 illustrates the theoretical error-free normalized amplitude of a phasor as a function of the differential phase between its constituents. As shown, the differential phase is swept from 0 degrees to approximately 150 degrees. At zero degrees, the constituents are phase-aligned with each other and result in a maximum normalized phasor amplitude of 2. At approximately 150 degrees, the constituents are separated in phase by approximately 150 degrees and result in a normalized phasor amplitude of approximately 0.5.

In the context of power amplification, phasor amplitude curve 102 shown in FIG. 1 may represent the output power amplitude of an outphasing power amplifier as a function of the differential phase between the constituents of the output waveform. Thus, the output power dynamic range spanned by the amplitude curve 102 would be approximately 12 dB (20 log(0.5/2)). More particularly, phasor amplitude curve 102 would represent the output power amplitude generated by an ideal outphasing power amplifier. In other words, phasor amplitude curve 102 would result when infinite isolation and infinite vector accuracy exists between the branches of the outphasing amplifier. As described above, however, this is impractical to design due to the power, cost, and size inefficiencies introduced by isolating/combining elements, which are typically used in conventional outphasing systems. Alternatively, if no isolating/combining element is used, the branches of the outphasing amplifier would have to be located on distinct substrates, which necessarily precludes a monolithic, compact design suitable for today's portable devices.

Therefore, for practical outphasing amplifier designs, a finite isolation between the branches of an outphasing amplifier is to be assumed. This finite isolation results in crosstalk between the branches of the amplifier (i.e., the signal in one branch causes an undesired effect on the signal in the other branch), effectively causing an error signal to appear at the output of the power amplifier.

In the worst case scenario, the crosstalk between the branches of the amplifier is entirely non-linear. The resulting error signal at the output of the power amplifier can therefore be written as:

$$R_{nonlinear} \sin(\omega_c t + \delta) = A_a \sin(\omega_c t) \cdot (A_b \sin(\omega_c t + \theta)) + A_a \sin(\omega_c t + \theta) \cdot A_b \sin(\omega_c t) \quad (3)$$

where $A_a$ represents the desired phase amplitude and $A_b$ represents the amplitude of the crosstalk between the branches of the amplifier.

$A_a$ and $A_b$ are related to each other according to $A_b = 1 - A_a$ (where the sum of $A_a$ and $A_b$ is normalized to 1). The relative isolation in dB between the branches of the amplifier can be calculated as $-20 \log(A_b)$. For example, for $A_a = 0.5$, $A_b = 0.5$ and the relative isolation is $-20 \log(0.5) = 6$ dB.

From equation (3) above, the amplitude of the error signal at the output of the amplifier is a function of the differential phase, θ, and can be described as:

$$R_{nonlinear}(\theta) = 2A_a \sin(\omega_c t) \cdot A_b \frac{\sin(\omega_c t + \theta)}{\sin(\omega_c t + \delta(\theta))}. \quad (4)$$

Figure 2:
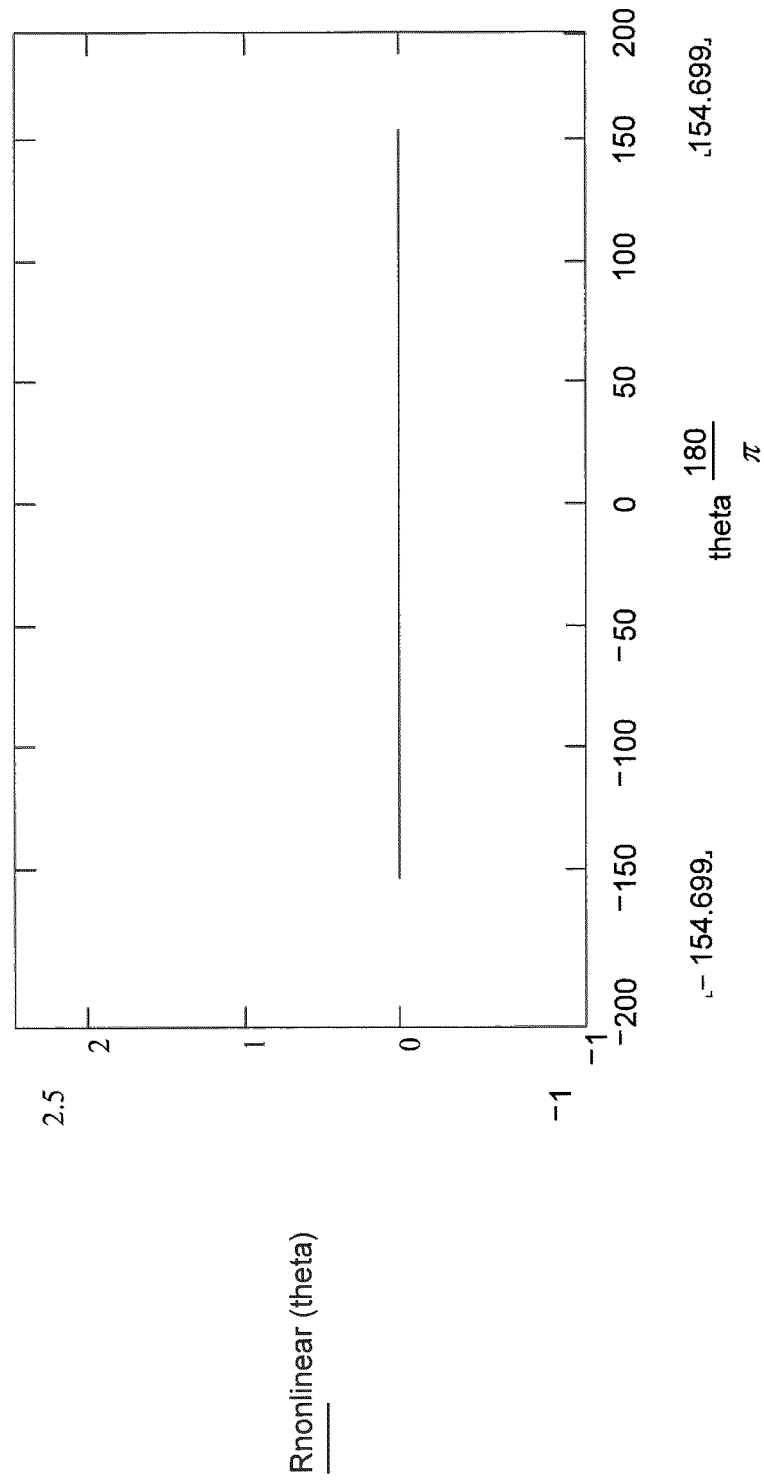
FIG. 2 illustrates the theoretical error in the amplitude of a phasor as a function of the differential phase between the constituents of the phasor, when the constituents are combined with infinite isolation.

In equation (4), $A_a = 1$ or equivalently $A_b = 0$ corresponds to infinite isolation between the branches of the amplifier. The error amplitude would thus be zero as illustrated in FIG. 2, which shows the error amplitude as a function of the differential phase, θ, between the constituents of the desired phasor.

Figure 3:
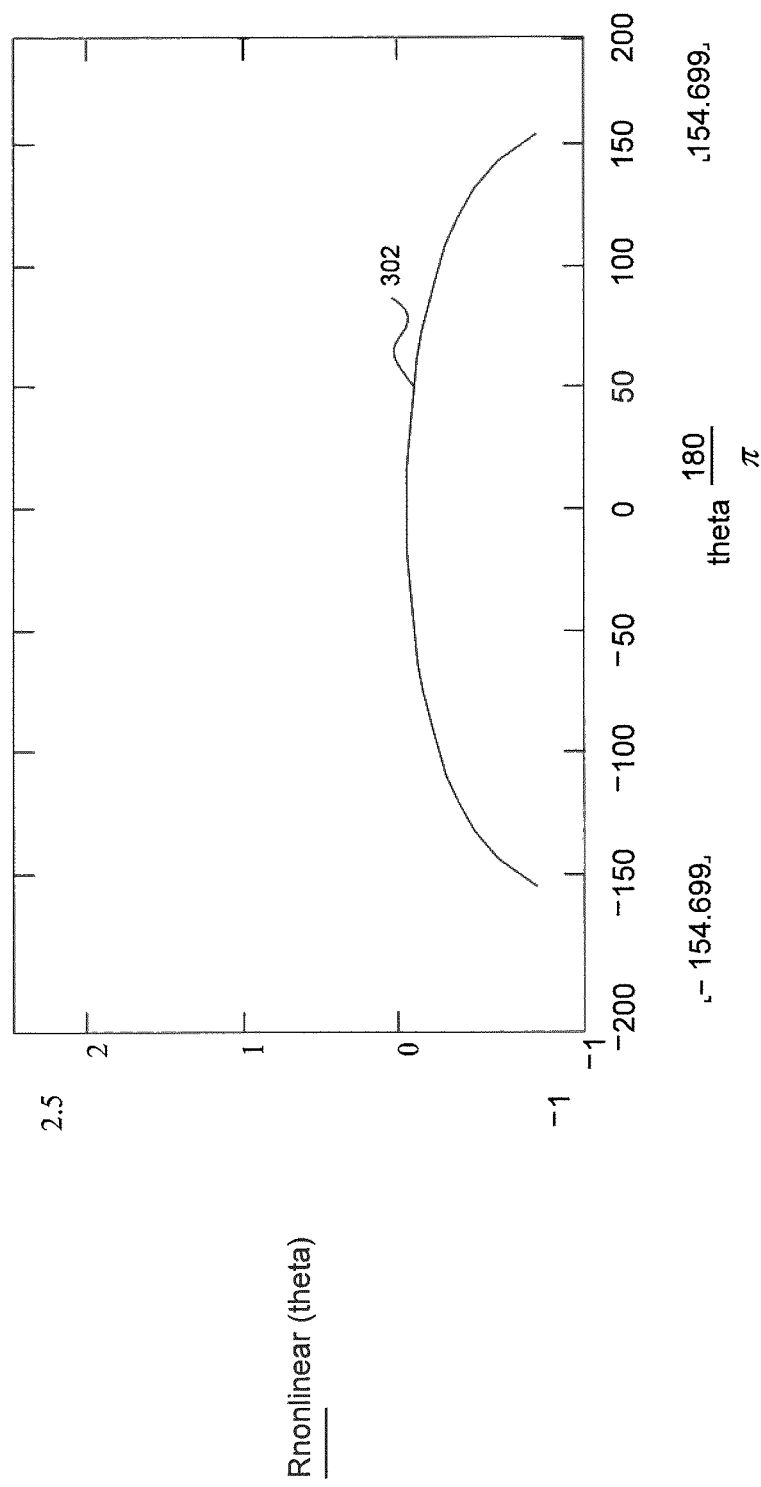
FIG. 3 illustrates the theoretical error in the amplitude of a phasor as a function of the differential phase between the constituents of the phasor, when the constituents are combined with 20 of dB isolation.

For $A_a = 0.9$ or equivalently $A_b = 0.1$, the branch isolation is 20 dB ($-20 \log(0.1)$) and the error amplitude as a function of θ is as described by error amplitude curve 302 in FIG. 3. As shown in FIG. 3, the error amplitude is near zero for small values of θ but begins to deviate from zero as θ moves away from zero. This is because as θ increases, the amplitude of the desired phasor decreases and the effect of crosstalk between the branches becomes greater.

2. Practical Limitations of Pure Outphasing

From the resulting error amplitude curve 302 of FIG. 3, the amplitude of the phasor when the constituents are combined with 20 dB of isolation can be determined. This is illustrated in FIG. 4, which compares the theoretical error-free normalized amplitude of a phasor (curve 102) and the theoretical amplitude of the phasor when the constituents are combined with 20 of dB isolation (curve 402), as a function of the differential phase between the constituents of the phasor. Amplitude curve 402 is obtained by summing error amplitude curve 302 and error-free normalized amplitude curve 102.

As shown in FIG. 4, curve 402 deviates from curve 102 over most of the differential phase range, illustrating the effect of the non linear crosstalk error on the amplitude of the desired phasor. Note, however, that curve 402 is not normalized as curve 102.

In FIG. 5, curve 402 is normalized such that the maximum amplitude corresponds to the value of 2, resulting in normalized amplitude curve 502. As shown in FIG. 5, curve 502 and curve 102 align with one another over a portion of the differential phase range (approximately 50 degrees in each direction moving away from 0 degrees). This indicates that in the worst case scenario (i.e., error entirely nonlinear), even with only 20 dB of branch isolation, a pure outphasing system (i.e., system that relies exclusively on modulating the phases of the constituent phasors with no additional calibration) matches the performance of an ideal outphasing system with infinite isolation (i.e., provide comparable linear amplification) over a portion of the differential phase range. From an output power range perspective, the pure outphasing system matches the waveform performance of an ideal outphasing system over a portion of the output power dynamic range of the desired waveform. In FIG. 5, this is approximately 2.5 dB of output power control range ($-20 \log(1.5/2)$).

Increasing the branch isolation to 25 dB would further increase the output power control range that can be achieved using only a pure outphasing system. This is shown in FIG. 6, which compares the desired phasor normalized amplitude with 25 dB of branch isolation (curve 602) and the theoretical error-free normalized amplitude (curve 102). Curve 604 is the error amplitude as function of the differential phase with 25 dB of branch isolation. As shown in FIG. 6, curves 102 and 602 are aligned with each other over an even larger portion of the differential phase range. From an output power range perspective, this is approximately 6 dB of output power control range, over which the pure outphasing system (with 25 dB of branch isolation) and an ideal outphasing system (infinite isolation) would achieve identical amplification performance.

The differential phase range over which a pure outphasing system can be used exclusively (while matching the performance of an ideal outphasing system) can be further determined by examining the derivative of the error amplitude as a function of the differential phase. This is illustrated for 25 dB and 30 dB of branch isolation respectively in FIGS. 7 and 8. As shown in FIG. 7, the error amplitude derivative curve is relatively flat between −120 degrees and +120 degrees, which indicates an insignificant variation in error amplitude over that phase range. Similarly, with 30 dB of branch isolation, the error amplitude derivative curve is flat over an even larger range of the differential phase, as shown in FIG. 8.

It should be noted that the analysis above represents a worst case scenario because it assumes that the crosstalk error is entirely nonlinear. In practice, a portion of the crosstalk error will be linear, which further increases the differential phase range over which pure outphasing can be used with no additional calibration or, alternatively, allows for lower branch isolation to be used. What can be further noted is that a pure outphasing system can be used to generate a portion of the output power range of a desired waveform with comparable performance to an ideal outphasing system. For waveforms with small output power dynamic range, pure outphasing may be used exclusively to generate such waveforms. However, for waveforms with larger output power dynamic range, practical limitations (i.e., finite branch isolation, crosstalk, etc.) may preclude the use of a pure outphasing solution when highly accurate, distortion-free amplification is desired.

3. Blended Control Amplification

In this section, a blended control amplification approach according to an embodiment of the present invention will be presented. The blended approach combines pure outphasing with bias and/or amplitude control to yield an accurate, practical, and producible system with substantially comparable performance to that of an ideal outphasing system, but without the extreme isolation and accuracy requirements of outphasing alone. The blended approach provides a high degree of control over the constituent phasors (whether in terms of amplitude and/or phase) in order to generate the desired phasor. This allows for a reduction in both the branch isolation requirements and the phase/amplitude accuracy requirements (as related to the constituent phasors) as compared to a pure outphasing or ideal outphasing system.

A comparison between the blended approach of the present invention and pure outphasing with respect to the level of control over constituent phasors is provided in FIG. 9.

As shown in FIG. 9, using pure outphasing, the constituent phasors are restricted in amplitude in that they must fall on the unit circle. In other words, the only controllable parameter in generating a desired phasor is the differential phase between the constituent phasors. As a result, in order to accurately generate a desired waveform, high accuracy in terms of the differential phase is needed. However, as described above, when the objective is to reduce branch isolation and generate complex waveforms with large PAP ratios, accuracy requirements become very stringent as to become almost impractical. This is especially the case when generating a waveform with a deep null (e.g., 30-40 dB null), which requires the constituents to be exactly phase differenced by 180 degrees (i.e., differential phase is 180 degrees) and at which point the error amplitude is greatest, as can be noted from FIGS. 5-8, for example.

On the other hand, using the blended approach of the present invention, the constituent phasors can be varied both in terms of phase and amplitude to generate the desired waveform. As a result, not only can any desired phasor be generated without having the differential phase exceed a given amount (e.g., limiting the differential phase to the range over which the error is negligible), but also the amplitude of the constituent phasors can be reduced at given output levels, which increases the operational output power range and repeatability of the overall system.

In FIG. 9, an example control range of the constituent phasors according to an embodiment of the present invention is provided by the shaded circle area contained within the unit semi-circle. As shown, when the desired phasor amplitude is large (i.e., high output power), the amplitude of the constituent phasors approaches the radius size of the unit circle. In other words, for large output power levels, the amplitude of the constituent phasors under the blended control approach is comparable to its corresponding amplitude under a pure outphasing approach. However, as the desired phasor amplitude decreases, the amplitude of the constituent phasors recedes from the unit circle and begins to deviate from its corresponding amplitude under a pure outphasing approach.

As a result of the blended approach of the present invention, the accuracy requirements in terms of phase/amplitude of the constituent phasors can be significantly reduced, which accommodates the branch isolations, vector accuracy, and phase accuracy that can be practically expected. For example, in an embodiment of the blended approach of the present invention, when the desired output power tends to zero, the constituent phasors are also driven to zero amplitude, which essentially eliminates any accuracy requirements regarding the differential amplitude and phase between the constituent phasors or, in other words, entirely reduces the system's sensitivity to branch phase imbalance, for that particular output power range.

Another advantage of the blended approach of the present invention can also be gleaned from FIG. 9. This relates to the ability of the blended approach of the present invention to generate any desired phasor amplitude (except for the maximum amplitude) using any one of an infinite number of constituent phasor configurations. This is very significant when compared to an ideal outphasing system, in which there exists a single configuration of the constituent phasors for any desired phasor amplitude (i.e., the constituent phasors must fall on the unit circle and are symmetrically opposed to each other relative to the cosine axis).

According to an embodiment of the present invention, the shaping of the constituent phasors in phase and/or amplitude, as described above, is performed substantially instantaneously or in real time in accordance with the desired waveform output power trajectory. In an embodiment, this is performed using a combination of phase, bias, and amplitude controls, with the control combination (or blend) dynamically changing according to the desired waveform output power trajectory. An example amplification system according to an embodiment of the present invention, which may be used to implement a blended control approach as described above, is now presented with reference to FIG. 10.

Referring to FIG. 1, example amplification system 1000 uses a MISO amplifier. Amplification system 1000 includes a transfer function 1006, vector modulators 1008 and 1010, driver amplifiers 1014 and 1016, and a MISO amplifier 1018. Further detail regarding embodiments of these components as well as the operation of system 1000 (according to various embodiments) can be found in commonly owned related patents and applications, indicated above in the cross-reference section of this patent application, and incorporated herein by reference in their entireties. In addition, the MISO amplifier could be replaced with a traditional Outphasing or LINC output amplifier arrangement which includes two power amplifiers and a power combiner.

According to an embodiment, which shall now be described, system 1000 includes a blended control implementation, which is implemented as a combination of phase, bias, and amplitude controls. For example, phase control (i.e., control of the phases of the constituent phasors) in system 1000 can be performed using one or more of transfer function module 1006 and vector modulators 1008 and 1010. Bias control, which includes biasing power amplifiers 1620 and 1622 within MISO amplifier 1018 to affect the amplitude of the desired phasor, is done via bias control signal 1024 generated by transfer function module 1006. Note also that bias control can be affected at drivers 1014 and 1016 via driver bias control signal 1026. Amplitude control, which includes controlling the input signals into MISO amplifier 1018 in order to affect the amplitude of the constituent phasors, can be performed using one or more of transfer function module 1006 and drivers 1014 and 1016, for example.

According to embodiments of the present invention, system 1000 may use one or more of phase, bias, and amplitude control with varying degrees of weight given to each type of control according to the desired waveform. Example blended control functions according to the present invention are described below in Section 6.

FIG. 19 compares the output power transfer characteristic of system 1000 and that of an ideal outphasing amplification system. As shown, the output power performance of system 1000 is almost identical to that of an ideal outphasing system. Yet, as described above, system 1000 requires only 20-25 dB of branch isolation, and other embodiments may require less.

4. Practical Design Considerations

As would be understood by a person skilled in the art based on the teachings herein, the optimum combination of controls as well as the degrees of weight given to each type of control within an amplification system according to the present invention will depend on both the characteristics of the system itself (e.g., branch isolation, phase/amplitude branch imbalance, etc.) and design consideration such as the desired waveform output power. Therefore, it is important in order to design a system with such optimum combination and use of controls to understand the practical effects of system characteristics on the output performance (i.e., accuracy of the output waveform) of the system.

In the following, the effects of phase and amplitude branch imbalance on the output performance of an example amplification system according to the present invention are examined. For ease of analysis and illustration, it is assumed that the constituent phasors (A1 and A2) are constrained to the first and fourth quadrants of the unit circle, and that they are designed to be of equal amplitude and symmetrical to each other with respect to the cosine axis, as illustrated in FIG. 11. Note that in practice the constituent phasors may occur within any quadrant of the unit circle and are not required to be equal and/or symmetrical to each other with respect to the cosine axis. It is further assumed that the output power is normalized to a maximum of 30 dB.

Note from the assumptions above that if phasors A1 and A2 are indeed equal in amplitude and symmetrical to each other with respect to the cosine axis (i.e., no amplitude/phase imbalance between the branches of the amplifier), the resulting phasor will be perfectly aligned with the cosine axis (i.e., zero phase error in the output waveform). The power output associated with such resulting phasor will be as illustrated in FIG. 12, which shows the power output as a function of the differential phase between the constituent phasors in an ideal outphasing system.

In practice, however, phase/amplitude branch imbalance cannot be entirely reduced to zero for a variety of reasons, including finite branch isolation for example, and will affect the choice of combination of controls. In the analysis below, phase/amplitude branch imbalance is introduced into an example amplification system according to the present invention, and the output performance of the system is examined. The example amplification system uses phase control only.

In FIG. 13, the power output associated with a phasor as a function of the differential phase between the constituents of the phasor is examined for various scenarios of phase/amplitude branch imbalance. Power output curve 1302 illustrates the power output with 0 dB of amplitude imbalance and 0 degrees of phase imbalance between the branches of the amplification system. In other words, curve 1302 illustrates the power output of an ideal outphasing system. Power output curve 1304 illustrates the power output for 0.5 dB of amplitude branch imbalance and 5 degrees of phase branch imbalance. Power output curve 1306 illustrates the power output for 1 dB of amplitude branch imbalance and 10 degrees of phase branch imbalance.

As can be seen from FIG. 13, power output curves 1304 and 1306 begin to diverge from power output curve 1302 at differential phase values of approximately 80 to 100 degrees.

FIGS. 14 and 15 illustrate the power output amplitude error and the power output phase error, respectively, as a function of the differential phase between the constituents of the phasor, for the same phase/amplitude branch imbalance scenarios as in FIG. 13.

The results from FIGS. 13-15 can be used, based on system design criteria, to determine an operating range (in terms of differential phase) over which phase control only can be used. For example, system design criteria may require a maximum allowable power output error of 0.5 dB and a maximum allowable power output phase error of 5 degrees. Accordingly, for a system with 0.5 dB of amplitude branch imbalance and 5 degrees of phase branch imbalance, the phase control only range would be approximately 0 to 110 degrees (lower of 110 and 140 degrees). Phase control only would thus be able to vary the output power by 4.8 dB with a high degree of accuracy. Similarly, for a system with 1 dB of amplitude branch imbalance and 10 degrees of phase branch imbalance, the phase control only range would be approximately 0 to 70 degrees (lower of 70 and 100 degrees). Phase control only would thus be able to vary the output power by 1.7 dB with a high degree of accuracy.

Nonetheless, phase control only would not be able on its own to achieve output power control ranges of 30-40 dB, as desired for complex waveforms, without degrading the accuracy of the desired waveform at low output powers. Therefore, one or more additional types of control (e.g., bias control, amplitude control) may be needed as used in embodiments of the present invention to enable a practical, accurate amplifier design for complex waveforms.

5. Example Blended Control Function and Performance Results

An example blended control function according to an embodiment of the present invention will now be presented. The example blended control function is designed to optimize the output performance (i.e., power output accuracy) of an amplification system according to an embodiment of the present invention for a QPSK waveform output. The example blended control function is illustrated in FIG. 16, wherein it is imposed on top of a QPSK constellation in the complex space defined by cos(wt) and sin(wt). The blended control function partitions the QPSK constellation space into three control regions 1602, 1604, and 1606, as shown in FIG. 16.

In an embodiment, the blended control function determines the type of control or controls used depending on the instantaneous power of the desired output waveform. For example, as would be understood by a person skilled in the art, a QPSK signal moves from one constellation point to another to encode information. However, although all four constellation points correspond to equal power, the signal does not move instantaneously from one constellation point to another and thus will have to traverse the trajectory connecting the constellation points, as shown in FIG. 16. Accordingly, the signal will traverse at least two control regions of the blended control function as it moves from any constellation point to any other. As it does, the types of controls applied within the amplification system to generate the output power will also vary.

In an embodiment, the example blended control function of FIG. 16 is such that control region 1602 is a phase control-biased region (i.e., higher weight is given to phase control compared to bias control and amplitude control). In another embodiment, control region 1602 is a phase control only region. Control region 1604 is a phase control, bias control, and amplitude control region. All three types of controls may be combined with equal or different weights in control region 1604. In an embodiment, higher weight is given to bias control than phase control and amplitude control in control region 1604. Control region 1606 is a bias control and amplitude control region. Bias control and amplitude control may be combined with equal or different weights in control region 1606. In an embodiment, control region 1606 is amplitude control-biased, i.e., amplitude control is given higher weight than bias control in control region 1606.

In an embodiment, the example blended control function of FIG. 16 enables a variable weighted combination of controls, whereby weights given to each type of control vary according to the desired waveform output power. In an embodiment, the variable weighted combination of controls varies from a phase control-biased combination to a bias/amplitude control-biased combination as the desired waveform output power varies from high to low power levels.

As would be understood by persons skilled in the art, control regions 1602, 1604, and 1606 in FIG. 16 are provided for purposes of illustration only and are not limiting. Other control regions can be defined according to embodiments of the present invention. Typically, but not exclusively, the boundaries of the control regions are based on the Complementary Cumulative Density Function (CCDF) of the desired output waveform and the sideband performance criteria. Accordingly, the control regions' boundaries as well as the type of controls used within each control region can vary according to the desired output waveform, according to embodiments of the present invention.

FIG. 17 illustrates an example output power waveform and a corresponding output stage current generated by a MISO amplifier operating according to the example blended control function described above. The blended control function is also shown in FIG. 17 to illustrate, by direct mapping, the control region used to generate any given value of the output power waveform or the output stage current. For example, when the output power waveform goes through a zero crossing, the blended control function is operating in control region 1606.

As shown in FIG. 17, the output stage current closely follows the output power waveform. In particular, it is noted that the output stage current goes completely to zero when the output power waveform undergoes a zero crossing. In an embodiment, this corresponds to the MISO amplifier being operated in amplitude control-biased control region 1606. In other words, the MISO amplifier current is driven to zero by mainly controlling the amplitudes of the input signals of the MISO amplifier.

FIG. 17 further illustrates the MISO amplifier classes of operation as a function of the output power waveform and the blended control function. As shown, the MISO amplifier transitions between various classes of operation (e.g., class S through class A) as the combination of controls used within the MISO amplifier is varied. For example, the MISO amplifier operates as a class A or B amplifier when the blended control function operates in control region 1606. On the other hand, the MISO amplifier operates in switching mode (class S) when the blended control function operates in control region 1602. This allows for optimizing the efficiency of the MISO amplifier as a function of the instantaneous output power of the desired waveform.

FIG. 18 is an example that illustrates the output stage theoretical power efficiency as a function of the output stage current for a MISO amplifier operating according to the example blended control function described above. As shown, the MISO amplifier operates at 100% theoretical efficiency at all times that it operates as a class S-class C amplifier. The MISO amplifier operates at 50% theoretical efficiency when it operates as a class A or B amplifier. However, as shown in FIG. 18, the MISO amplifier spends very short time operating as class A or class B amplifier. Accordingly, in an embodiment, the MISO amplifier operates at 100% theoretical efficiency for 98% (or greater) of the time while generating typical cell phone waveforms.

FIGS. 20-23 illustrate using a blended control function to generate an example modulated ramp output according to an embodiment of the present invention. For example, the blended control function may be used within amplification system 1000 described above.

Figure 20:
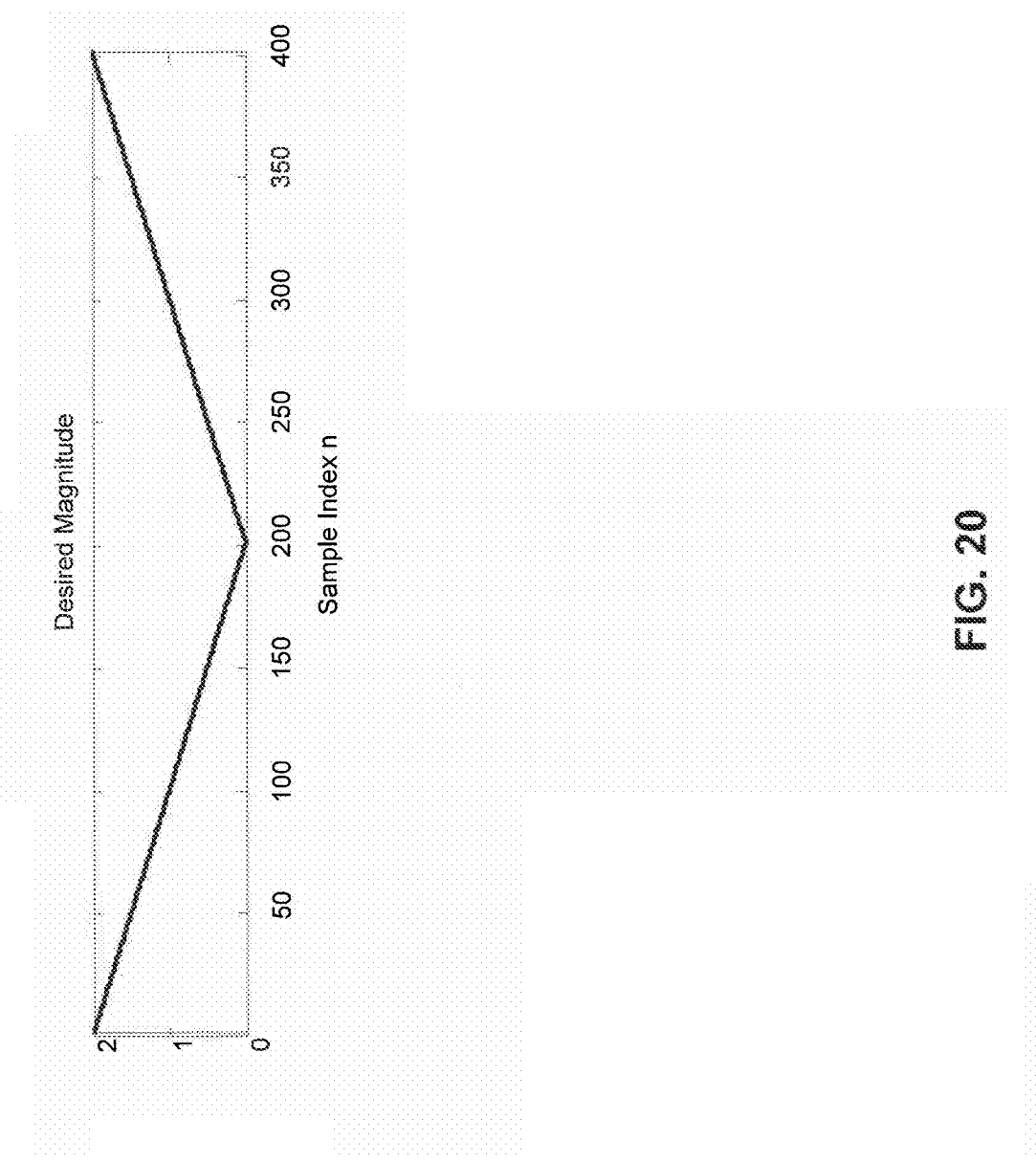

FIG. 20 illustrates an exemplary desired output amplitude response As shown, the desired output amplitude transitions linearly from a maximum value of 2 to a minimum of zero, before returning linearly to the maximum of 2.

Figure 21:
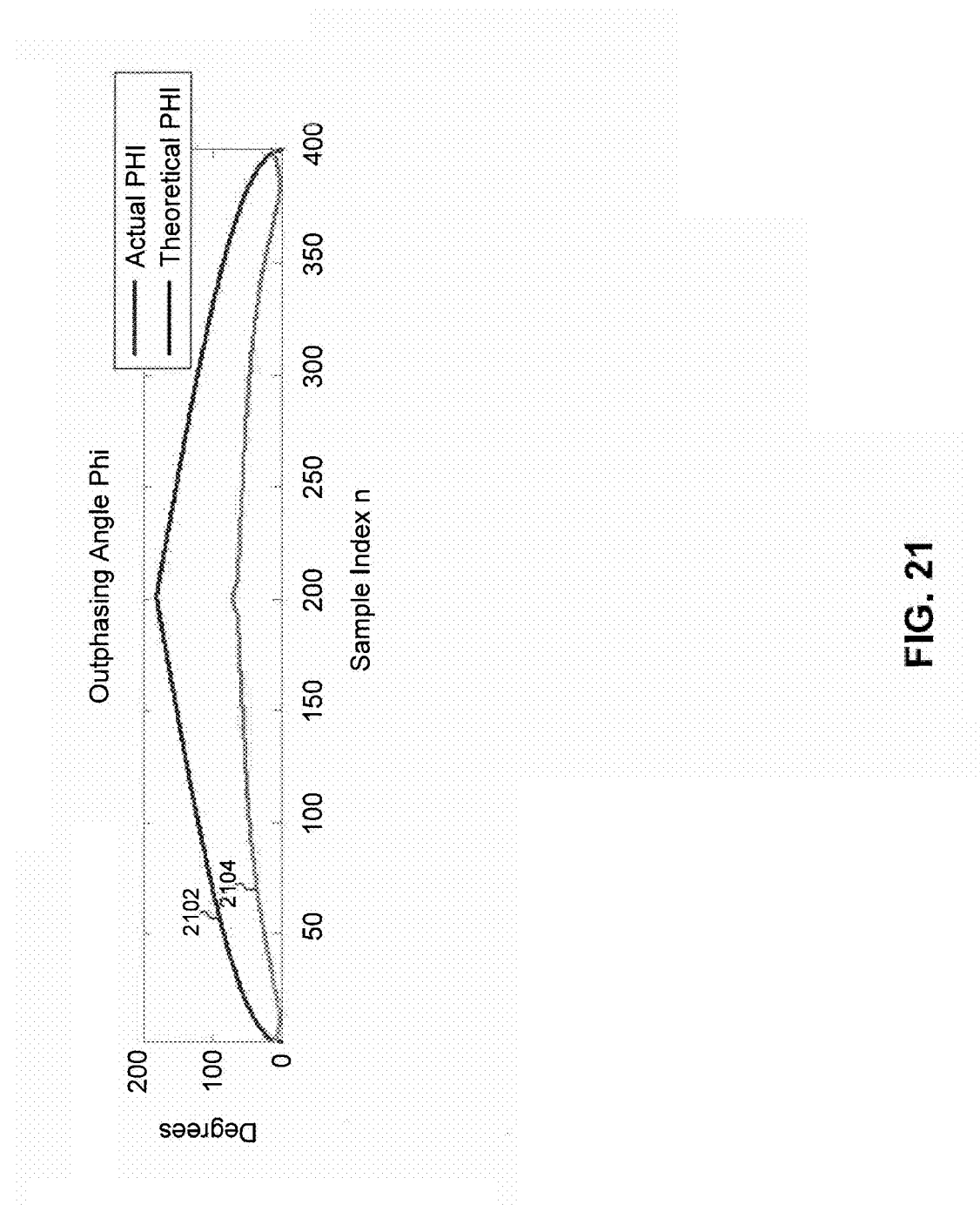
Figure 22:
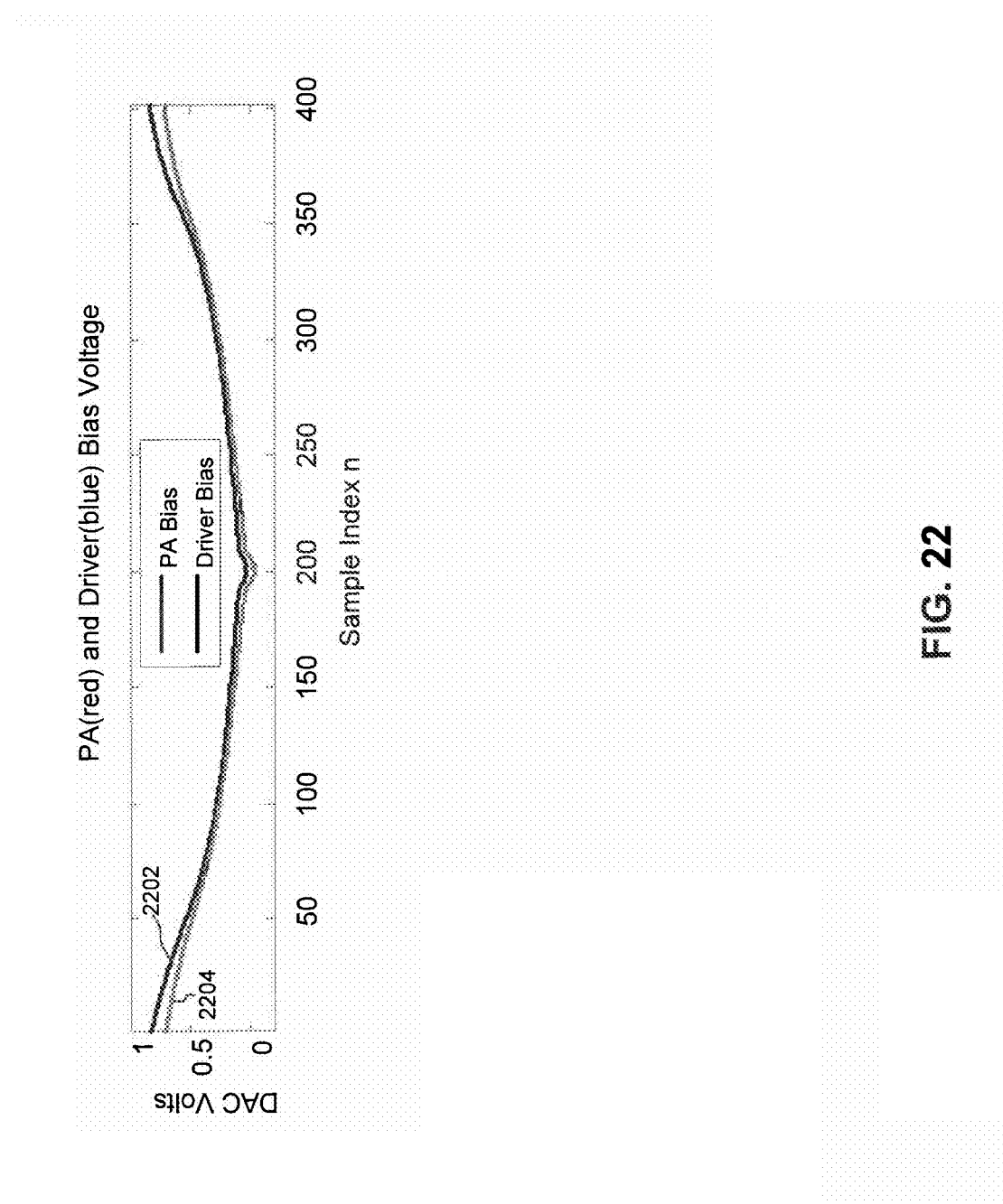
Figure 23:
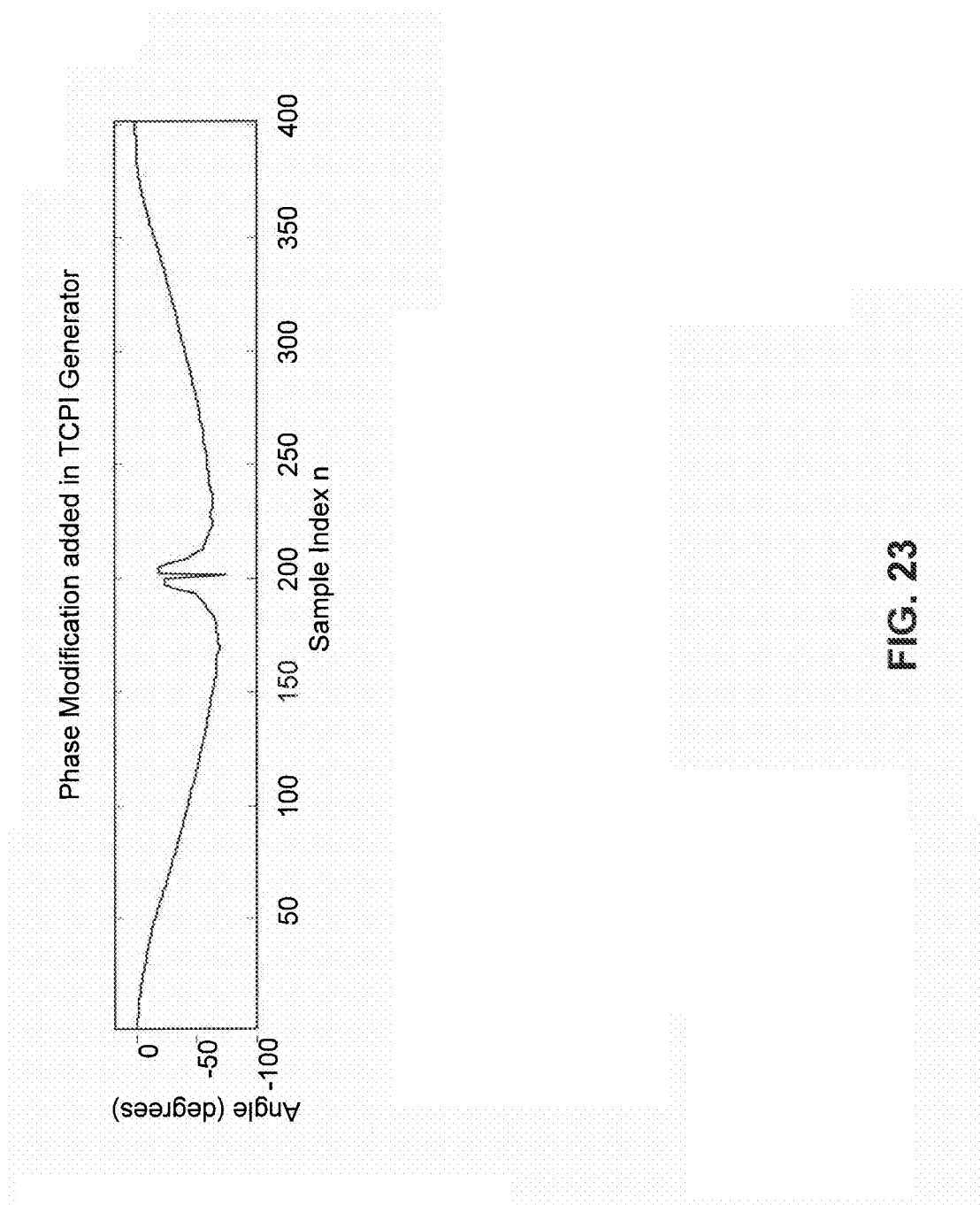

FIG. 21 compares the blended control function and pure outphasing with respect to the differential phase between the constituent phasors, to generate the desired output amplitude of FIG. 20. Pure outphasing is represented by curve 2102, and the blended control function is represented by curve 2104. As shown, for pure outphasing, the differential phase spans the entire 180 degrees range, varying from 0 degrees to generate the maximum amplitude of 2 to 180 degrees to generate the minimum amplitude of zero. On the other hand, for the blended control function, the differential phase is restricted to a much smaller range (0 to approximately 70 degrees), while other type of controls are also used to generate the desired output. In an embodiment, bias control is used to complement phase control to generate the desired output. Accordingly, the MISO amplifier and/or driver amplifiers that precede the MISO amplifier are bias controlled. FIG. 22 illustrates example bias control signals (represented as voltages 2202 and 2204) provided to bias the MISO amplifier and the driver amplifiers to implement bias control. For example, voltages 2202 and 2204 may be provided through bias control signals 1024 and 1026 in amplification system 1000 described above.

Note from FIGS. 21 and 22 that bias control is used at the same time as phase control within the phase control range (0 to 70 degrees), though phase control may be used with much higher weight than bias control within that range. This can be noted from voltages 2202 and 2204, which are modified within the phase control range. Voltages 2202 and 2204 continue to vary outside the phase control range and tend to zero as the desired output amplitude tends to the minimum value of zero. It is noted that the weights shown in the figures and discussed herein are provided solely for illustrative purpose and are not limiting. Other weight values can be used depending on the situation and the desired outcome.

In an embodiment, when bias control is applied, variations occur in the S (reverse isolation) parameters of the amplifiers of the system, resulting in an associated phase error at the output. Fortunately, this can be easily compensated for by applying a rotational transform at the vector modulators of the system. FIG. 22 illustrates the phase modification applied to compensate for the phase error resulting from bias control. As shown, minimal correction is needed for the first 30 or 40 degrees of the differential phase range. This is because bias control is used with much lower weight than phase control. However, as the desired output amplitude approaches zero, bias control is used more heavily and the associated phase error correction becomes greater. Note that the phase error correction inverts 180 degrees at the zero amplitude crossing, since the desired output is a single sideband suppressed carrier waveform.

6. Example Blended Control Methods

FIGS. 24-26 illustrate example blended control methods according to embodiments of the present invention.

FIG. 24 illustrates a process flowchart 2400 of a method for control in a power amplifier. Process 2400 begins in step 2402, which includes determining an instantaneous power level of a desired output waveform of the power amplifier. In an embodiment, referring to FIG. 10, step 2402 can be performed by transfer function module 1006 based on received I and Q data reflecting the desired output waveform.

Subsequently, in step 2404, process 2400 includes determining a control point of operation of the power amplifier based on the determined instantaneous power level. In an embodiment, the control point of operation enhances one or more of linearity and accuracy of the power amplifier for the determined instantaneous power level. In an embodiment, referring to FIG. 10, step 2404 can be performed by transfer function module 1006 based on the determined instantaneous power level.

Subsequently, in step 2406, process 2400 includes controlling the power amplifier to operate according to the determined control point of operation. In an embodiment, step 2406 includes performing one or more of (a) controlling the phase of input signals of the power amplifier; (b) controlling the bias of the power amplifier; and (c) controlling the amplitude of the input signals of the power amplifier. In an embodiment, referring to FIG. 10, step 2406 is performed by transfer function module 1006, which accomplishes step 2406 by controlling signals for performing (a), (b), and (c). For example, to control the phase of the input signals of the power amplifier, transfer function 1006 may control the signals it inputs into vector modulators 1008 and 1010. Similarly, to control the bias of the power amplifier, transfer function 1006 may vary bias signals 1024 and 1026 that it provides to driver amplifiers 1014 and 1016 and MISO amplifier 1018.

According to an embodiment, the control point of operation can be within a first, second, or third control regions, depending on the determined instantaneous power level. For example, in an embodiment, the control point of operation is within a first control region when the instantaneous power level is greater than a first threshold; within a second control region when the instantaneous power level is greater than a second threshold but lower than the first threshold; and within a third control region when the instantaneous power level is lower than the second threshold. According to an embodiment, boundaries of the first, second, and third control regions are based on the Complementary Cumulative Density Function (CCDF) of the desired output waveform.

According to an embodiment of the present invention, when the control point of operation is within the first control region, the controlling step 2406 of process 2400 includes performing (a) only, or performing (a), (b), and (c). In the later case, in an embodiment, step 2406 includes performing (a) more often than (b) or (c). When the control point of operation is within the second control region, the controlling step 2406 includes performing (a), (b), (c). Further, controlling step 2406 may include performing (b) more often than (a) or (c). When the control point of operation is within the third control region, the controlling step 2406 includes performing (b) and (c) only. In an embodiment, controlling step 2406 further includes performing (c) more often than (b).

According to an embodiment, controlling step 2406 includes performing one or more of (a), (b), and (c) according to respective weights given to (a), (b), and (c). In an embodiment, the respective weights are determined according to one or more of error/system characteristics within the power amplifier (e.g., branch phase imbalance, branch amplitude imbalance, branch isolation) and the instantaneous power level.

FIG. 25 illustrates another process flowchart 2500 of a method for control in a power amplifier. Process 2500 begins in step 2502, which includes determining a required change in power output from a first output power level to a second output power level in the power amplifier. In an embodiment, referring to FIG. 10, step 2402 is performed by transfer function module 1006 based on received I and Q data reflecting a desired output waveform.

Subsequently, in step 2504, process 2500 includes varying one or more weights associated with respective power controls of the power amplifier to cause the required change in power output, wherein the power controls include one or more of (a) control of phase of input signals of the power amplifier, (b) control of bias of the power amplifier, and (c) control of amplitude of the input signals of the power amplifier. In an embodiment, referring to FIG. 10, step 2504 is performed by transfer function module 1006, which accomplishes step 2504 by varying control signals for performing (a), (b), and (c). For example, to control the phase of the input signals of the power amplifier, transfer function 1006 may control the signals it inputs into vector modulators 1008 and 1010. Similarly, to control the bias of the power amplifier, transfer function 1006 may vary bias signals 1024 and 1026 that it provides to driver amplifiers 1014 and 1016 and MISO amplifier 1018.

According to an embodiment, the weights associated with the respective power controls of the power amplifier are determined according to one or more of branch phase imbalance, branch amplitude imbalance, and branch isolation within the power amplifier.

According to an embodiment, varying the weights causes the power amplifier to transition between various classes of operation. For example, in an embodiment, varying the weights causes the power amplifier to transition between class S and class A. In another embodiment, varying the weights causes the power amplifier to transition from linear operation to non-linear operation, and vice versa.

FIG. 26 illustrates another process flowchart 2600 of a method for control in a power amplifier. Process 2600 begins in step 2602, which includes determining a desired power output trajectory of a desired output waveform of the power amplifier. In an embodiment, referring to FIG. 10, step 2602 can be performed by transfer function module 1006 based on received I and Q data reflecting the desired output waveform.

Subsequently, step 2604 includes determining one or more of (a) branch phase imbalance; (b) branch amplitude imbalance; and (c) branch isolation, between branches of the power amplifier. In an embodiment, step 2604 is performed by various error/system measurement modules of the power amplifier, which report measurements to transfer function module 1006.

In step 2606, process 2600 includes calculating one or more weights based on one or more of the determined branch phase imbalance, branch amplitude imbalance, and branch isolation. In an embodiment, referring to FIG. 10, step 2606 is performed by transfer function module 1006.

Finally, in step 2608, process 2600 includes applying one or more power controls according to the one or more weights to control the power amplifier to generate the desired power output trajectory. In an embodiment, the power controls include one or more of (a) control of phase of input signals of the power amplifier, (b) control of bias of the power amplifier, and (c) control of amplitude of the input signals of the power amplifier. As noted above, in an embodiment, step 2608 is performed by transfer function module 1006, which controls different power control mechanisms of the power amplifier to apply (a), (b), and (c). For example, to control the phase of the input signals of the power amplifier, transfer function 1006 may control the signals it inputs into vector modulators 1008 and 1010. Similarly, to control the bias of the power amplifier, transfer function 1006 may vary bias signals 1024 and 1026 that it provides to driver amplifiers 1014 and 1016 and MISO amplifier 1018.

7. Conclusion

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method for control in a power amplifier, comprising:
    partitioning a waveform constellation space into a plurality of regions, each region associated with one or more control functions of the power amplifier;
    determining a region of operation of the power amplifier from the plurality of regions, based on an instantaneous output power level of a desired output waveform of the power amplifier; and
    applying the one or more control functions associated with the region of operation of the power amplifier to enhance output power accuracy of the power amplifier for the instantaneous output power level.

2. The method of claim 1, wherein said partitioning step comprises:
    partitioning said waveform constellation space based on known output power characteristics of the desired output waveform.

3. The method of claim 1, wherein said partitioning step comprises:
    partitioning said waveform constellation space based on a complementary cumulative density fanction (CCDF) of the desired output waveform.

4. The method of claim 1, wherein the one or more control functions includes one or more of (a) bias control of the power amplifier; (b) phase control of input signals of the power amplifier; and (c) amplitude control of the input signals of the power amplifier.

5. The method of claim 1, wherein said applying step comprises:
    applying the one or more control functions associated with the region of operation of the power amplifier according to a weighted combination, said weighted combination associating respective weights with the one or more control functions.

6. The method of claim 5, wherein said respective weights are determined according to one or more of error characteristics within said power amplifier.

7. The method of claim 5, wherein said respective weights are determined according to one or more of phase imbalance and amplitude imbalance within said power amplifier.

8. The method of claim 7, wherein said respective weights restrict a range of one of said one or more control functions according to one or more of said phase imbalance and amplitude imbalance.

9. The method of claim 1, wherein the region of operation of the power amplifier corresponds to a first region of the waveform constellation space when said instantaneous output power level is greater than a first threshold.

10. The method of claim 9, wherein, in the first region, said applying step comprises:
    controlling a phase of input signals of the power amplifier.

11. The method of claim 9, wherein in the first region said applying step comprises:
    controlling one or more of a bias of the power amplifier, phase of input signals of the power amplifier, and amplitude of the input signals of the power amplifier.

12. The method of claim 11, wherein, in the first region, said applying step further comprises:

controlling the phase of the input signals of the power amplifier more often than the bias of the power amplifier or the amplitude of the input signals of the power amplifier.

13. The method of claim 9, wherein a second region of operation of the power amplifier corresponds to a second region of the waveform constellation space when said instantaneous output power level is greater than a second threshold but lower than said first threshold.

14. The method of claim 13, wherein, in the second region of waveform constellation space, said applying step comprises:

controlling one or more of a bias of the power amplifier, phase of input signals of the power amplifier, and amplitude of the input signals of the power amplifier.

15. The method of claim 14, wherein, in the second region of the waveform constellation space, said applying step further comprises:

controlling the bias of the power amplifier more often than the phase or the amplitude of the input signals of the power amplifier.

16. The method of claim 13, wherein a third region of operation of the power amplifier corresponds to a third region of the waveform constellation space when said instantaneous output power level is lower than said second threshold.

17. The method of claim 16, wherein, in the third region of the waveform constellation space, said applying step comprises:

controlling one or more of a bias of the power amplifier and amplitude of input signals of the power amplifier.

18. The method of claim 17, wherein, in the third region of the waveform constellation space, said applying step further comprises:

controlling the amplitude of the input signals of the power amplifier more than often than the bias of the power amplifier.

* * * * *

UNITED STATES PATENT AND TRADEMARK OFFICE
CERTIFICATE OF CORRECTION

| | | |
|---|---|---|
| PATENT NO. | : 8,410,849 B2 | Page 1 of 1 |
| APPLICATION NO. | : 13/069155 | |
| DATED | : April 2, 2013 | |
| INVENTOR(S) | : Sorrells et al. | |

It is certified that error appears in the above-identified patent and that said Letters Patent is hereby corrected as shown below:

In the Claims

Column 16, Line 32, Claim 3, please replace "fanction" with --function--.

Column 16, Line 63, Claim 11, please replace "wherein in the first region" with --wherein, in the first region,--.

Column 18, Line 17, Claim 18, please replace "more than often" with --more often--.

Signed and Sealed this
Twenty-fifth Day of March, 2014

Michelle K. Lee
*Deputy Director of the United States Patent and Trademark Office*